(12) United States Patent
Ohkubo et al.

(10) Patent No.: US 6,516,515 B2
(45) Date of Patent: Feb. 11, 2003

(54) SEMICONDUCTOR INTEGRATED CIRCUIT

(75) Inventors: Tatsuyuki Ohkubo, Yamanashi (JP);
Keisuke Nadamoto, Yamanashi (JP);
Yoshifumi Katayama, Yamanashi (JP)

(73) Assignees: Hitachi, Ltd., Tokyo (JP); Hitachi Tokyo Electronics Co., Ltd., Tokyo (JP)

( * ) Notice: Subject to any disclaimer, the term of this patent is extended or adjusted under 35 U.S.C. 154(b) by 0 days.

(21) Appl. No.: 09/875,165

(22) Filed: Jun. 7, 2001

(65) Prior Publication Data

US 2001/0027606 A1 Oct. 11, 2001

Related U.S. Application Data

(63) Continuation of application No. 09/003,516, filed on Jan. 6, 1998, now Pat. No. 6,279,226.

(30) Foreign Application Priority Data

Jan. 7, 1997 (JP) ............................................... 9-12066
Jan. 14, 1997 (JP) ............................................... 9-17395
Sep. 19, 1997 (JP) ............................................. 9-273939

(51) Int. Cl.[7] ................................................ H05K 3/34
(52) U.S. Cl. ............................. 29/840; 29/720; 29/721; 29/740; 29/835; 29/843; 29/844; 228/4.5; 228/5.1; 228/180.5; 356/237.1; 901/47
(58) Field of Search ........................ 29/827, 832, 834, 29/835, 836, 840, 842–843, 844, 720, 721; 901/41; 356/237.1; 228/103, 105, 8, 9, 10, 182.1, 4.5, 186.5, 5.1

(56) References Cited

U.S. PATENT DOCUMENTS

| 5,040,293 | A | * | 8/1991 | Yamazaki et al. ............. 29/843 |
| 5,059,559 | A | | 10/1991 | Takahashi et al. ........... 437/220 |
| 5,223,063 | A | | 6/1993 | Yamazaki et al. .......... 156/73.2 |
| 5,398,863 | A | * | 3/1995 | Grube et al. ........... 228/180.21 |
| 5,513,792 | A | | 5/1996 | Onitsuka ................ 228/180.22 |
| 5,516,023 | A | * | 5/1996 | Kono .......................... 228/4.5 |

FOREIGN PATENT DOCUMENTS

| JP | 4-186644 | 7/1992 |
| JP | 6-13428 | 1/1994 |

OTHER PUBLICATIONS

Semiconductor World, May 1995, pp. 112–113.

* cited by examiner

*Primary Examiner*—Peter Vo
*Assistant Examiner*—Donghai Nguyen
(74) *Attorney, Agent, or Firm*—Mattingly, Stanger & Malur, P.C.

(57) ABSTRACT

A method for stabilizing the form of a letter S of an inner lead after bonding in a method of manufacturing μBGA·IC in which a chip is fixed via an insulating film on a tape carrier on one main surface of which plural inner leads are laid and each electrode pad of the chip is bonded to each inner lead is disclosed. The inner lead is bonded to the electrode pad when the chip is supplied in a fixed position for a bonding tool. Next, the respective positions of the inner lead and the electrode pad are recognized using a feature lead and an electrode pad. The center line of the inner lead is recognized, the inner lead is pushed to the chip in the direction of the base and bent in the form of a letter S, the end of the inner lead is bonded to the electrode pad by thermocompression by the bonding tool.

4 Claims, 34 Drawing Sheets

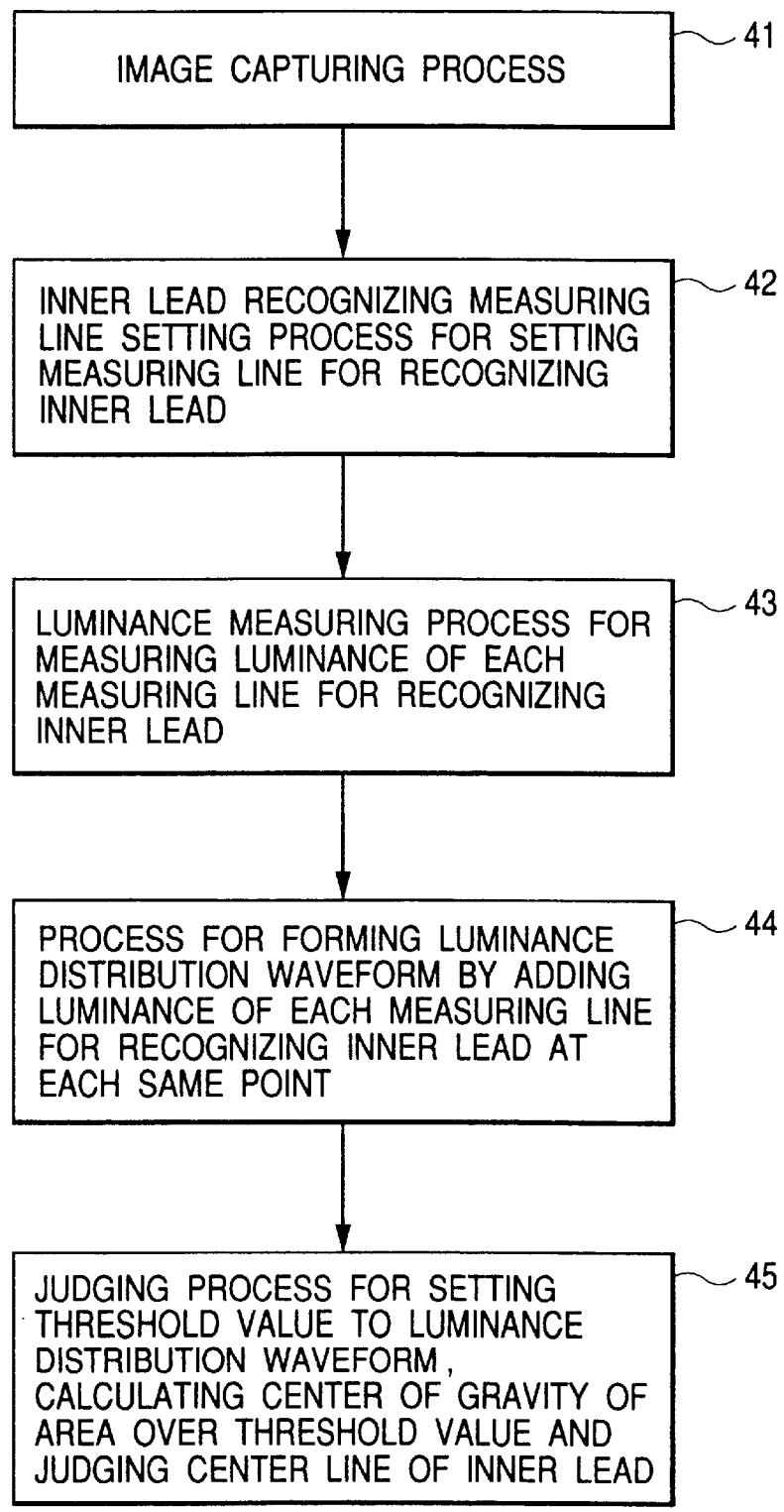

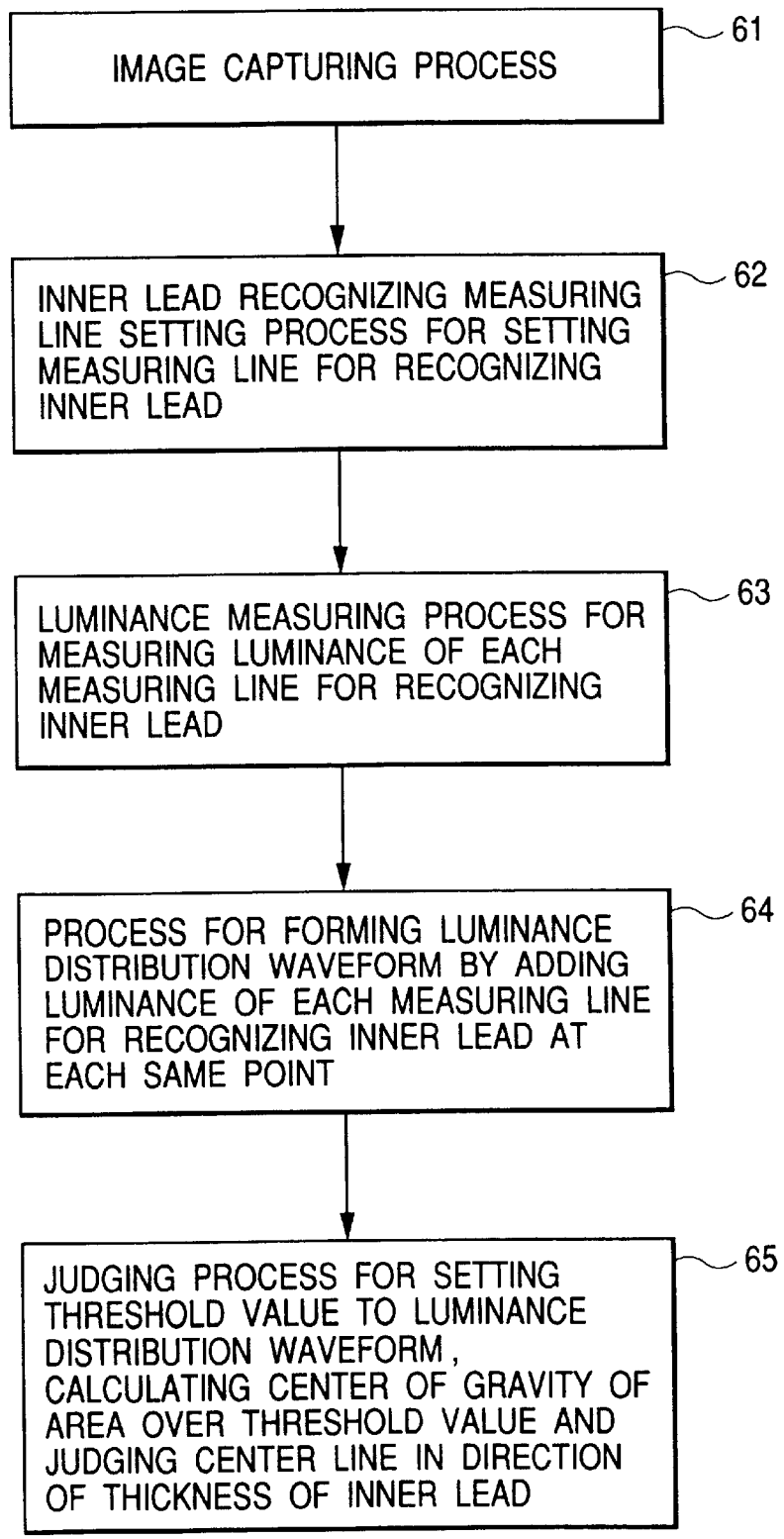

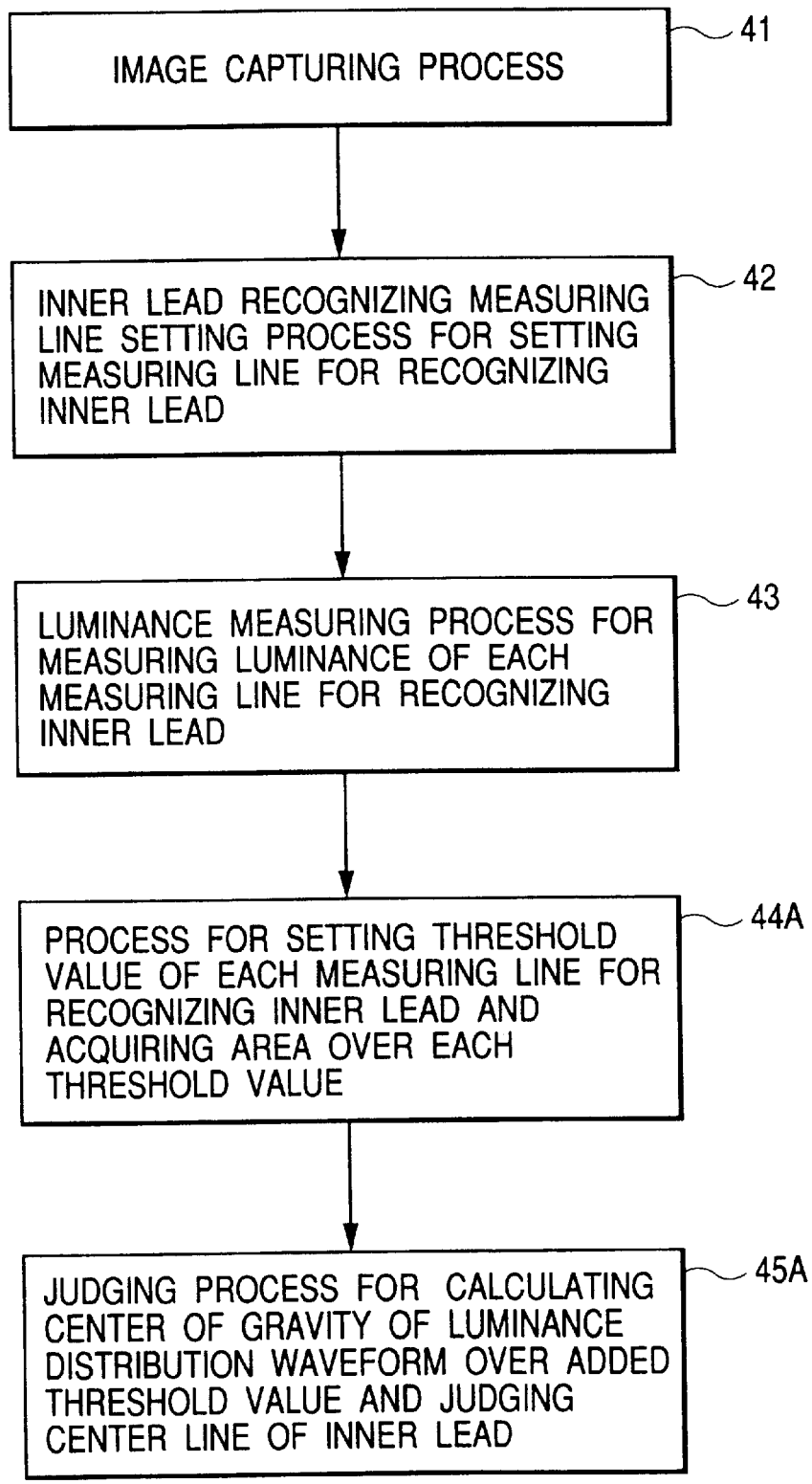

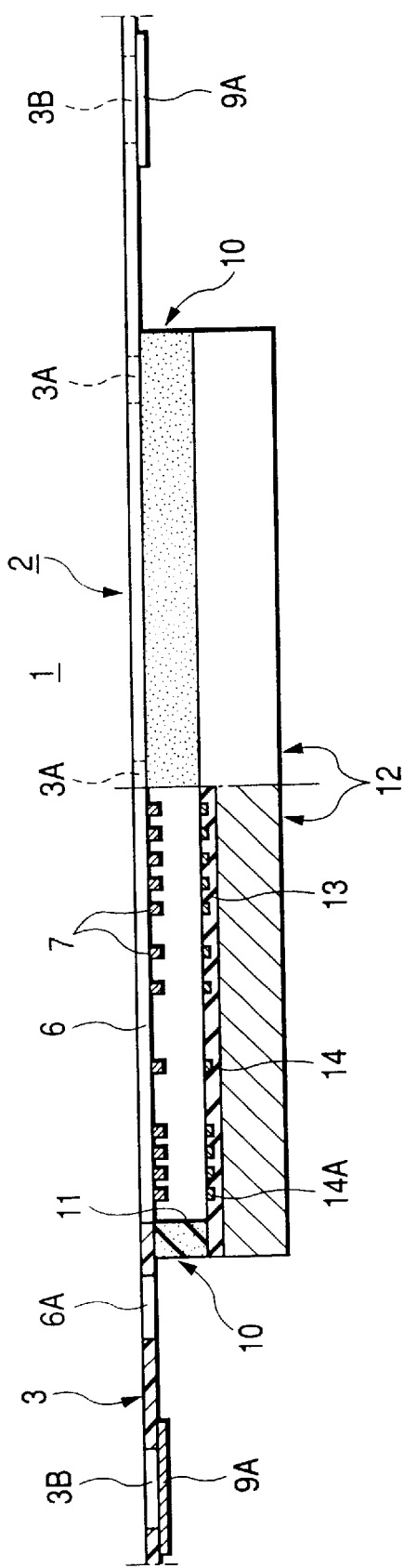
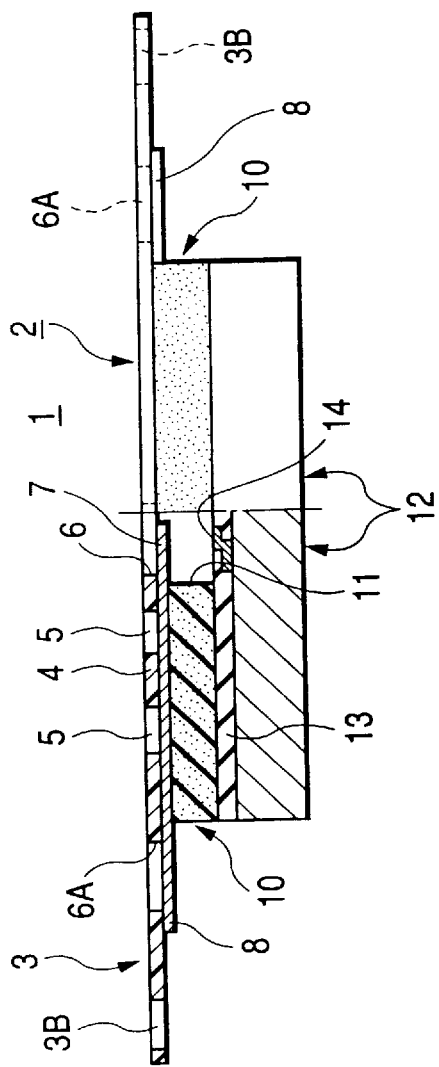
FIG. 21(a)
FIG. 21(b)

SEMICONDUCTOR INTEGRATED CIRCUIT

This is a continuation application of U.S. Ser. No. 09/003,516, filed Jan. 6, 1998 now U.S. Pat. No. 6,279,226 B1.

BACKGROUND OF THE INVENTION

The present invention relates to the manufacturing engineering of a semiconductor device, particularly relates to a bonding technique for bonding an inner lead laid on a carrier to an electrode pad formed on a semiconductor chip (hereinafter called chip) and, for example, relates to a bonding technique effective when utilized for a method of manufacturing a semiconductor integrated circuit (hereinafter called IC) provided with a chip-sized package or a chip scale package (hereinafter called CSP) in size equal to or approximately equal to the size of a chip.

As electronic equipment using ICs are miniaturized and thinned, the reduction of an IC package is desired. Various CSPs are developed to meet the above demand and, a micro ball grid array package (hereinafter called μBGA) constituted as follows is one example. That is, a tape carrier is mechanically connected on the main surface on the side of an electrode pad of a chip via an insulating film, each inner lead laid on the tape carrier is bonded to each electrode pad of the chip and a bump as each external terminal is soldered to each outer lead and protruded.

For a method of bonding an inner lead in μBGA, there is a single point bonding method (hereinafter called only bonding method) of successively welding multiple inner leads one at a time on each electrode pad arranged on the overall chip with pressure by a bonding tool.

CSP is described on pages 112 and 113 of a monthly, "Semiconductor World" published in May, 1995 by Press Journal.

For an example describing a method of bonding a memory chip to a TAB package in which when a memory chip is mounted in a tape automated bonding (TAB) type package according to a lead on chip method based upon a film carrier, no deterioration in the strength of bonding caused by the dislocation of bonding occurs, further forming of a metallic mold and others are not required and the cost is low, there is Japanese Patent Application Laid-Open No. Hei 6-13428. In the above bonding method, after an inner lead is bend and transformed by a bonding tool before bonding, the inner lead is pressurized by the bonding tool and bonded to an electrode pad of a chip.

SUMMARY OF THE INVENTION

However, it is clarified by the inventor that in the above bonding method, there is a problem that the center line of an inner lead cannot be recognized by an image recognition device because an electrode pad is located right under an inner lead.

Also, it is clarified by the inventor that in the above bonding method, there is a problem that the looped form of each inner lead after bonding is different because an error occurs in an interval between an inner lead and an electrode pad successively bonded by a bonding tool when a chip mechanically connected to an insulating film is tilted.

Further, it is clarified by the inventor that in the above bonding method, there is a problem that as an inner lead horizontally extended is bent and transformed by a bonding tool, the inner lead is distorted, stress is left in the inner lead after inner lead bonding and as a result, when stress generated by difference in the coefficient of thermal expansion (hereinafter called thermal stress) operates in a temperature cycle acceleration test and others, a part in which stress is left of the inner lead is cracked.

An object of the present invention is to provide bonding technique in which the center line of an inner lead can be recognized independent of an electrode pad.

Another object of the present invention is to provide bonding technique in which a looped form after bonding can be stabilized.

Another object of the present invention is to provide bonding technique in which stress can be prevented from being left in an inner lead after inner lead bonding.

Another object of the present invention is to provide bonding technique in which manufacturing based upon a tape can be realized by securing alignment based upon a tape.

The above objects, other objects, and the new characteristics of the present invention will be clarified from the description in this specification and attached drawings.

The outline of typical ones of inventions disclosed in the present invention will be described below.

That is, a method of manufacturing a semiconductor integrated circuit in which a semiconductor chip is mechanically connected to a carrier on one main surface of which plural inner leads are laid via an insulating film and each electrode pad of the semiconductor chip is bonded to the above each inner lead is characterized in that when the above inner lead is bonded to the above electrode pad, the position of the inner lead is observed individually or collectively and the inner lead is transformed by a bonding tool and bonded to the electrode pad based upon the result of the observation.

As an inner lead is transformed by a bonding tool based upon the observation of the position of the inner lead according to the above means, the inner lead can be precisely bonded to an electrode pad.

For the outline of the other invention, in a method of manufacturing μBGA·IC in which to stabilize the form of a letter S of an inner lead after bonding, a chip is fixed to a tape carrier on one main surface of which plural inner leads are laid via an insulating film and each electrode pad of the chip is bonded to each inner lead, when an inner lead is bonded to an electrode pad, first, a chip is supplied in a fixed position for a bonding tool using a sprocket hole of a tape carrier. Next, the respective positions of the inner lead and the electrode are recognized using a feature lead and the electrode pad. Afterward, after the center line of the inner lead is recognized, the inner lead is touched to the chip by the bonding tool, pressed in the direction of the base and bent in the form of a letter S, the end of the inner lead is bonded to the electrode pad by thermocompression by the bonding tool.

The other outline of typical ones of inventions disclosed in the present invention will be described below.

1. A bonding method in which a semiconductor chip is mechanically connected to a carrier on one main surface of which a group of inner leads are laid via an insulating film and after each electrode pad of the above semiconductor chip is aligned with each inner lead, each inner lead is bonded to each electrode pad of the semiconductor chip by a bonding tool and which is characterized by being provided with an image capturing process for capturing an image of the above inner lead having the above electrode pad as a background, an inner lead recognizing measuring line setting process for setting at least one image scanning line including the above electrode pad and at least one image scanning line on each side of the above electrode pad as each inner lead recognizing measuring line out of image scanning lines respectively perpendicular to the inner lead in the above captured image, a luminance measuring process for measuring luminance at each point on each scanning line every the above each inner lead recognizing measuring line, a forming process for adding luminance on the above each inner lead recognizing measuring line every same point and forming an added luminance distribution waveform, and a judging process for setting a threshold value for the above added luminance distribution waveform, calculating the center of gravity in an area equal to or larger than the threshold value and judging the center line of the above inner lead.

2. A bonding method in which a semiconductor chip is mechanically connected to a carrier on one main surface of which a group of inner leads are laid via an insulating film and after each electrode pad of the above semiconductor chip is aligned with each inner lead, each inner lead is bonded to each electrode pad of the semiconductor chip by a bonding tool and which is characterized by being provided with an image capturing process for capturing an image of the above inner lead having the above electrode pad as a background, an inner lead recognizing measuring line setting process for setting at least one image scanning line including the above electrode pad and at least one image scanning line on each side of the above electrode pad as each inner lead recognizing measuring line out of image scanning lines respectively perpendicular to the inner lead in the above captured image, a luminance measuring process for measuring luminance at each point on each scanning line every the above each inner lead recognizing measuring line, a forming process for setting a threshold value every the above each inner lead recognizing measuring line and forming each threshold value exceeding luminance distribution waveform, and a judging process for adding the above each threshold value exceeding luminance distribution waveform every same point, forming an added threshold value exceeding luminance distribution waveform, calculating the center of gravity in an area equal to or larger than the threshold value and judging the center line of the above inner lead.

3. A bonding method in which a semiconductor chip is mechanically connected to a carrier on one main surface of which a group of inner leads are laid via an insulating film and after each electrode pad of the above semiconductor chip is aligned with each inner lead, each inner lead is bonded to each electrode pad of the semiconductor chip by a bonding tool and which is characterized by being provided with an image capturing process for capturing an image corresponding to the above inner lead and the above electrode pad from the lateral direction of the above carrier and semiconductor chip, an inner lead recognizing measuring line setting process for setting at least one image scanning line corresponding to the above electrode pad and at least one image scanning line on each side of the image corresponding to the above electrode pad as each inner lead recognizing measuring line out of image scanning lines respectively perpendicular to the inner lead in the above captured image, a luminance measuring process for measuring luminance at each point on each scanning line every the above each inner lead recognizing measuring line, a forming process for adding luminance on the above each inner lead recognizing measuring line every same point and forming an added luminance distribution waveform, and a judging process for setting a threshold value for the above added luminance distribution waveform, calculating the center of gravity in an area equal to or larger than the threshold value and judging the center line in thickness of the above inner lead.

4. A bonding method in which a semiconductor chip is mechanically connected to a carrier on one main surface of which a group of inner leads are laid via an insulating film and after each electrode pad of the above semiconductor chip is aligned with each inner lead, each inner lead is bonded to each electrode pad of the semiconductor chip by a bonding tool and which is characterized by being provided with an image capturing process for capturing an image corresponding to the above inner lead and the above electrode pad from the lateral direction of the above carrier and semiconductor chip, an inner lead recognizing measuring line setting process for setting at least one image scanning line corresponding to the above electrode pad and at least one image scanning line on each side of the image corresponding to the above electrode pad as each inner lead recognizing measuring line out of image scanning lines respectively perpendicular to the inner lead in the above captured image, a luminance measuring process for measuring luminance at each point on each scanning line every the above each inner lead recognizing measuring line, a forming process for setting a threshold value every the above each inner lead recognizing measuring line and forming each threshold value exceeding luminance distribution waveform, and a judging process for adding the above each threshold value exceeding luminance distribution waveform every same point, forming an added threshold value exceeding luminance distribution waveform, calculating the center of gravity in an area equal to or larger than the threshold value and judging the center line in thickness of the above inner lead.

5. A bonding machine by the bonding tool of which each inner lead aligned with each electrode pad is bonded to each electrode pad of a semiconductor chip mechanically connected to a carrier on one main surface of which a group of inner leads are laid via an insulating film and which is characterized by being provided with an image capturing device for capturing an image of the above inner lead having the above electrode pad as a background, an inner lead recognizing measuring line setting section for setting at least one image scanning line including the above electrode pad and at least one image scanning line on each side of the above electrode pad as each inner lead recognizing measuring line out of image scanning lines respectively perpendicular to the inner lead in the above captured image, a luminance measuring section for measuring luminance at each point on each scanning line every the above each inner lead recognizing measuring line, a forming section for adding luminance on the above each inner lead recognizing measuring line every same point and forming an added luminance distribution waveform, and a judging process for setting a threshold value for the above added luminance distribution waveform, calculating the center of gravity in an area equal to or larger than the threshold value and judging the center line of the above inner lead.

6. A bonding machine by the bonding tool of which each inner lead aligned with each electrode pad is bonded to each electrode pad of a semiconductor chip mechanically connected to a carrier on one main surface of which a group of inner leads are laid via an insulating film and which is characterized by being provided with an image capturing device for capturing an image corresponding to the above inner lead and the above electrode pad from the lateral direction of the above carrier and semiconductor chip, an inner lead recognizing measuring line setting section for setting at least one image scanning line corresponding to the above electrode pad and at least one image scanning line on each side of the image corresponding to the above electrode pad as each inner lead recognizing measuring line out of image scanning lines respectively perpendicular to the inner lead in the above captured image, a luminance measuring section for measuring luminance at each point on each scanning line every the above each inner lead recognizing measuring line, a forming section for adding luminance on the above each inner lead recognizing measuring line every same point and forming an added luminance distribution waveform, and a judging section for setting a threshold value for the above added luminance distribution waveform, calculating the center of gravity in an area equal to or larger than the threshold value and judging the center line in thickness of the above inner lead.

7. A bonding method in which a semiconductor chip is mechanically connected to a carrier on one main surface of which a group of inner leads are laid via an insulating film and each inner lead is bonded to each electrode pad of the above semiconductor chip by a bonding tool and which is characterized in that before the above each inner lead is bonded to each electrode pad of the above semiconductor chip by a bonding tool, a height from the surface including the above group of electrode pads of the semiconductor chip to the above bonding tool is measured and bonding by the bonding tool is executed based upon the measured height.

8. A bonding method according to Paragraph 7 characterized in that the above measurement of the height is executed by touching the above bonding tool to the surface including the above group of electrode pads of the above semiconductor chip via the above inner lead.

9. A bonding method according to Paragraph 7 characterized in that the above measurement of the height is executed by touching the above bonding tool to at least three points on the surface including the above group of electrode pads of the above semiconductor chip and acquiring the degree of parallelization of the above semiconductor chip.

10. A bonding method according to Paragraph 7 characterized in that the measurement of the height of the above semiconductor chip is executed by detecting the surface including the above group of electrode pads of the semiconductor chip by a non-contact sensor.

11. A bonding machine by the bonding tool of which each inner lead is bonded to each electrode pad of a semiconductor chip mechanically connected to a carrier on one main surface of which a group of inner leads are laid via an insulating film and which is characterized in that before the above each inner lead is bonded to each electrode pad of the above semiconductor chip by the bonding tool, a height from the surface including the above group of electrode pads of the semiconductor chip to the above bonding tool is measured and bonding by the bonding tool is executed based upon the measured height.

12. A bonding machine according to Paragraph 11 characterized in that the above height is measured by touching the above bonding tool to the surface including the above group of electrode pads of the above semiconductor chip via each inner lead.

13. A bonding machine according to Paragraph 11 characterized in that the above height is measured by touching the above bonding tool to at least three points on the surface including the above group of electrode pads of the above semiconductor chip and acquiring the degree of parallelization of the semiconductor chip.

14. A bonding machine according to Paragraph 11 characterized in that the height of the above semiconductor chip is measured by detecting the surface including the above group of electrode pads of the above semiconductor chip by a non-contact sensor.

15. A method of manufacturing a semiconductor integrated circuit in which a semiconductor chip is mechanically connected to a carrier on one main surface of which plural inner leads are laid via an insulating film and each electrode pad of the semiconductor chip is bonded to each inner lead and which is characterized in that when the above inner lead is bonded to the above electrode pad, the position of the inner lead is observed individually or collectively, the inner lead is transformed by a bonding tool based upon the result of the observation and bonded to the electrode pad.

16. A method of manufacturing a semiconductor integrated circuit according to Paragraph 15 characterized by being provided with a connecting process for mechanically connecting the above semiconductor chip to the above carrier via the above insulating film and a bonding process for observing the position of the above inner lead individually or collectively, transforming the inner lead by the above bonding tool based upon the result of the observation and bonding the inner lead to the above electrode pad.

17. A method of manufacturing a semiconductor integrated circuit according to Paragraph 15 characterized in that before the above inner lead is bonded to the above electrode pad, a regular part regularly arranged on the above carrier is measured and the above semiconductor chip and the above bonding tool are aligned based upon the measurement.

18. A method of manufacturing a semiconductor integrated circuit according to Paragraph 15 characterized in that a feature lead arranged beforehand on the above carrier and a feature pad arranged beforehand on the above semiconductor chip are measured and the respective positions of the above inner lead and the semiconductor chip are recognized based upon the measurement.

19. A method of manufacturing a semiconductor integrated circuit according to Paragraph 15 characterized in that the image of the above inner lead is captured and the position of the above inner lead is measured based upon the captured image.

20. A bonding machine used for a method of manufacturing a semiconductor integrated circuit in which a semiconductor chip is mechanically connected to a carrier on one main surface of which plural inner leads are laid via an insulating film and each electrode pad of the semiconductor chip is bonded to above each inner lead and which is characterized in that when the above inner lead is bonded to above electrode pad, the position of the inner lead is observed individually or collectively, the inner lead is transformed by a bonding tool based upon the result of the observation and bonded to the electrode pad.

21. A bonding machine according to Paragraph 20 characterized by being provided with an observation device for observing the position of the above inner lead individually or collectively and a controller for transforming the inner lead by the above bonding tool based upon the result of the observation and bonding it to the above electrode pad.

22. A bonding machine according to Paragraph 20 characterized by being provided with an observation device for observing a regular part regularly arranged on the above carrier before the above inner lead is bonded to the above electrode pad and a controller for aligning the above semiconductor chip and the above bonding tool based upon the observation.

23. A bonding machine according to Paragraph 20 characterized by being provided with an observation device for observing a feature lead beforehand arranged on the above carrier and a feature pad beforehand arranged on the above semiconductor chip and a controller for recognizing the respective positions of the above inner lead and the semiconductor chip based upon the observation.

24. A bonding machine according to Paragraph 20 characterized by being provided with an image capturing device for capturing the image of the above inner lead and a controller for observing the position of the inner lead based upon the captured image.

25. A method of manufacturing a semiconductor integrated circuit in which a semiconductor chip is mechanically connected to a carrier on one main surface of which plural inner leads are laid via an insulating film and each electrode pad of the semiconductor chip is bonded to the above each inner lead and which is characterized in that in the above bonding, a part of the above inner lead is bent by a bonding tool, pressed upon the above electrode pad and bonded to it.

26. A method of manufacturing a semiconductor integrated circuit according to Paragraph 25 characterized in that after a part of the above inner lead is touched onto the above semiconductor chip by the above bonding tool, the bonding tool is horizontally moved and the inner lead is bent in the form of a letter S.

27. A method of manufacturing a semiconductor integrated circuit according to Paragraph 26 characterized in that after the above bonding tool by which a part of the above inner lead is touched onto the above semiconductor chip is lifted, it is horizontally moved.

28. A method of manufacturing a semiconductor integrated circuit according to Paragraph 27 characterized in that after the above bonding tool by which a part of the above inner lead is touched onto the above semiconductor chip is lifted, the bonding tool is horizontally moved across the bonded part of the above electrode pad in the direction of the base of the inner lead and further, returned to the bonded part.

29. A method of manufacturing a semiconductor integrated circuit according to Paragraph 25 characterized in that after a part of the above inner lead is struck and cut by the above bonding tool, one cut piece is bent by the bonding tool and bonded to the above electrode pad.

30. A method of manufacturing a semiconductor integrated circuit according to Paragraph 20 characterized in that the end of the above inner lead is touched onto the above semiconductor chip by the above bonding tool.

31. A method of manufacturing a semiconductor integrated circuit according to Paragraph 25 characterized in that after a part of the above inner lead is moved in the direction of the above semiconductor chip by the above bonding tool, the bonding tool is horizontally moved and the inner lead is bent in the form of a letter S.

32. A method of manufacturing a semiconductor integrated circuit according to Paragraph 31 characterized in that after the above bonding tool by which a part of the above inner lead is moved in the direction of the above semiconductor chip is lifted, it is horizontally moved across the bonded part of the above electrode pad in the direction of the base of the inner lead and further, returned to the bonded part.

33. A bonding machine used for a method of manufacturing a semiconductor integrated circuit in which a semiconductor chip is mechanically connected to a carrier on one main surface of which plural inner leads are laid via an insulating film and each electrode pad of the semiconductor chip is bonded to the above each inner lead and which is characterized in that in the above bonding, a part of the above inner lead is bent by a bonding tool, pressed upon the above electrode pad and bonded.

34. A bonding machine according to Paragraph 33 characterized in that after a part of the above inner lead is touched onto the above semiconductor chip by the above bonding tool, the bonding tool is horizontally moved and the inner lead is transformed in the form of a letter S.

35. A method of manufacturing a semiconductor integrated circuit including the following processes:
(1) a process for supplying a chip-lead complex tape in which multiple semiconductor integrated circuit chips are fixed on a carrier tape provided with a wiring pattern including multiple inner leads to a lead bonding machine,
(2) a process for optically observing one unit area including one chip of the above multiple chips on the above supplied chip-lead complex tape in the above lead bonding machine,
(3) a process for correcting positional relationship between the above lead in a plane parallel to a first main surface of the above chip and the above pad based upon the result of the above observation in the above lead bonding machine by transforming an inner lead part to be connected to a bonding pad on the first main surface of the above one chip and projected from the surface of the above carrier tape, and
(4) a process for connecting the above lead and pad by a bonding tool after the above lead is corrected in the above lead bonding machine.

36. A method of manufacturing a semiconductor integrated circuit according to Paragraph 35 characterized in that the above lead is transformed by the above bonding tool.

37. A method of manufacturing a semiconductor integrated circuit according to Paragraph 36 characterized in that the bonding of the above lead is executed for every lead by the above bonding tool.

38. A method of manufacturing a semiconductor integrated circuit according to Paragraph 37 characterized in that a unit area on the above chip-lead complex tape corresponds to one unit or plural units of a chip-sized package.

39. A method of manufacturing a semiconductor integrated circuit consisting of the following processes:
(1) a process for supplying a chip-lead complex tape in which multiple semiconductor integrated circuit chips are fixed on a carrier tape provided with a wiring pattern including multiple inner leads to a lead bonding machine,
(2) a process for detecting relative positional relationship among the above lead bonding machine, the above pad and lead in the lead bonding machine by optically observing one unit area including one chip of the above multiple chips on the above supplied chip-lead complex tape,
(3) a process for correcting relative positional relationship between the above lead to be connected to a bonding pad on a first main surface of the above one chip in a plane parallel to the first main surface of the above chip and the above pad based upon the result of the above detection in the above lead bonding machine, and
(4) a process for connecting the above lead and pad by a bonding tool after the above correction in the above lead bonding machine.

40. A method of manufacturing a semiconductor integrated circuit according to Paragraph 39 characterized in that the bonding of the above lead is executed for every lead by the above bonding tool.

41. A method of manufacturing a semiconductor integrated circuit according to Paragraph 40 characterized in that a unit area on the above chip-lead complex tape corresponds to one unit or plural units of a chip-sized package.

42. A method of manufacturing a semiconductor integrated circuit consisting of the following processes:
   (1) a process for supplying a chip-lead complex tape in which multiple semiconductor integrated circuit chips are fixed on a carrier tape provided with a wiring pattern including multiple inner leads to a lead bonding machine,
   (2) a process for moving one unit area including one chip of the above multiple chips on the above supplied chip-lead complex tape to a position in which bonding is executed in the above lead bonding machine,
   (3) a process for pushing down the end of an inner lead or the vicinity after being moved from on the above carrier tape moved to a bonding position in the above unit area to over the corresponding pad of a chip in the same area by a bonding tool in the above lead bonding machine,
   (4) a process for forming the above inner lead by pushing the above pushed-down inner lead in the direction of the base of the inner lead across over the above pad area by the above bonding tool and transforming the above inner lead in the above lead bonding machine, and
   (5) a process for bonding the above lead and pad by pressing the above formed inner lead upon the above pad by the above bonding tool.

43. A method of manufacturing a semiconductor integrated circuit according to Paragraph 42 characterized in that the above process for pushing down is continued until the above bonding tool reaches the surface of the above chip via the above inner lead.

44. A method-of manufacturing a semiconductor integrated circuit according to Paragraph 43 characterized in that the bonding of the above lead is executed for every lead by the above bonding tool.

45. A method of manufacturing a semiconductor integrated circuit according to Paragraph 44 characterized in that a unit area on the above chip-lead complex tape corresponds to on unit or plural units of a chip-sized package.

46. A method of manufacturing a semiconductor integrated circuit consisting of the following processes:
   (1) a process for supplying a chip-lead complex tape in which multiple semiconductor integrated circuit chips are fixed on a carrier tape provided with wiring including an inner lead part with the above chip-lead complex tape wound on a loading reel,
   (2) a process for carrying and supplying the above each lead and each bonding pad of the above chip to a part for bonding using a friction roller by successively unwinding the above chip-lead complex tape wound on the above loading reel, and
   (3) a process for winding the above chip-lead complex tape on an unloading reel after bonding is finished.

47. A method of manufacturing a semiconductor integrated circuit according to Paragraph 46 characterized in that the carriage of the above chip-lead complex tape is controlled by optically detecting an opening provided periodically in the direction of the length of a carrier tape.

48. A method of manufacturing a semiconductor integrated circuit consisting of the following processes:
   (1) a process for supplying a chip-lead complex tape in which multiple semiconductor integrated circuit chips are fixed on a carrier tape provided with a wiring pattern including multiple inner leads to a lead bonding machine,
   (2) a process for moving one unit area including one chip of the above multiple chips on the above supplied chip-lead complex tape to a position for executing bonding in the above lead bonding machine,
   (3) a process for pushing down the vicinity of the end of an inner lead which is set so that the end of the inner lead is located in an opening through the opening of a tape over the corresponding pad of a chip in the above unit area from on the above carrier tape moved to a bonding position in the same area, that is, a lead on the reverse side to the above inner lead in a part to be cut which is formed so that it is weaker than the other part by a bonding tool in the above lead bonding machine,
   (4) a process for forming the above inner lead by transforming the inner lead cut as a result of pushing down by the above bonding tool in the above lead bonding machine, and
   (5) a process for bonding the above lead and pad by pressing the above formed inner lead upon the above pad by the above bonding tool.

49. A method of manufacturing a semiconductor integrated circuit including the following processes:
   (1) a process for supplying a chip-lead complex tape in which multiple semiconductor integrated circuit chips are fixed on a carrier tape provided with a wiring pattern including multiple inner leads to a lead bonding machine,
   (2) a process for moving one unit area including one chip of the above multiple chips on the above supplied chip-lead complex tape to a position for executing bonding in the above lead bonding machine,
   (3) a process for diagonally pushing down the end of an inner lead or the vicinity which is set so that the end of the inner lead is located in an opening through the opening of a tape over the corresponding pad of a chip in the above unit area from on the above carrier tape moved to a bonding position in the same area from the reverse side to the above inner lead in a part to be cut which is formed so that it is weaker than the other part to the side of the base of the above inner lead by a bonding tool in the above lead bonding machine,
   (4) a process for forming the above inner lead by transforming the inner lead cut as a result of pushing down by the above bonding tool in the above lead bonding machine, and
   (5) a process for bonding the above lead and pad by pressing the above formed inner lead upon the above pad by the above bonding tool.

50. A lead bonding machine characterized in that after a chip-lead complex tape in which a semiconductor integrated circuit chip is fixed on a carrier tape is supplied with the above tape wound on a loading reel, carried by a friction roller and a lead is bonded to a bonding pad on the above semiconductor integrated circuit chip, the above tape is wound on an unloading reel.

51. A lead bonding machine according to Paragraph 50 characterized in that if correction is required, the bonding of the above lead is executed after positional relationship between the above lead and the corresponding bonding pad is corrected by transforming an inner lead part of the lead.

52. A lead bonding machine according to Paragraph 51 characterized in that the correction by transformation of the above lead is executed if necessary based upon the result of optically observing positional relationship between a lead and a bonding pad.

53. A lead bonding machine according to Paragraph 52 characterized in that the bonding of the above lead is executed for every lead by a bonding tool.

54. A lead bonding machine according to Paragraph 53 characterized in that the correction by transformation of the above lead is executed for every lead by the above bonding tool.

BRIEF DESCRIPTION OF THE DRAWINGS

FIG. 1 is a flowchart showing an inner lead recognition method in a bonding method equivalent to an embodiment of the present invention;

FIG. 4(a) is an enlarged partial sectional view showing a process for cutting an inner lead, FIG. 4(b) is an enlarged partial sectional view showing a process for measuring a height, FIG. 4(c) is an enlarged partial sectional view showing a process for lifting a bonding tool after the measurement of the height, FIG. 4(d) is an enlarged partial sectional view showing a process for forming the inner lead, and FIG. 4(e) is an enlarged partial sectional view showing a bonding process;

FIG. 5(a) is a plan omitting a part and FIG. 5(b) is a front sectional view omitting a part;

FIG. 6(a) is a plan and FIG. 6(b) is a front view a part of which is a sectional view;

FIG. 7 is a flowchart showing an inner lead recognition method in a bonding method equivalent to an embodiment of the present invention;

FIG. 9 is a flowchart showing an inner lead recognition method in a bonding method equivalent to an embodiment of the present invention;

FIG. 11(a) is a partial sectional view showing a process for cutting an inner lead, FIG. 11(b) is a partial sectional view showing a process for measuring a height, FIG. 11(c) is a partial sectional view showing a process for lifting a bonding tool after the measurement of the height, FIG. 11(d) is a partial sectional view showing a process for forming an inner lead and FIG. 11(e) is a partial sectional view showing a bonding process;

FIG. 13(a) is a plan omitting a part and FIG. 13(b) is a front view omitting a part a part of which is a sectional view;

FIG. 14(a) is a plan a part of which is a sectional view and FIG. 14(b) is a front view a part of which is a sectional view;

FIG. 21(a) is a front view a part of which is a sectional view showing the workpiece and FIG. 21(b) is a side view a part of which is a sectional view;

FIG. 22(a) is a plan, FIG. 22(b) is a front view a part of which is a sectional view, and FIG. 22(c) is an enlarged side view a part of which is a sectional view;

FIG. 24(a) is a screen view showing the whole workpiece, FIG. 24(b) is a screen view showing a step for measuring a feature lead, and FIG. 24(c) is a screen view showing a step for measuring a feature pad;

DESCRIPTION OF THE PREFERRED EMBODIMENTS

Figure 2A:
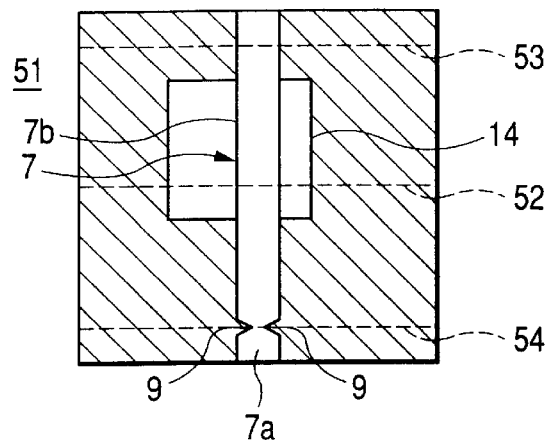
FIGS. 2(a) to (f) are explanatory drawings for explaining each process.

Referring to the drawings, embodiments of the present invention will be described below.

First Embodiment

Figure 5A:
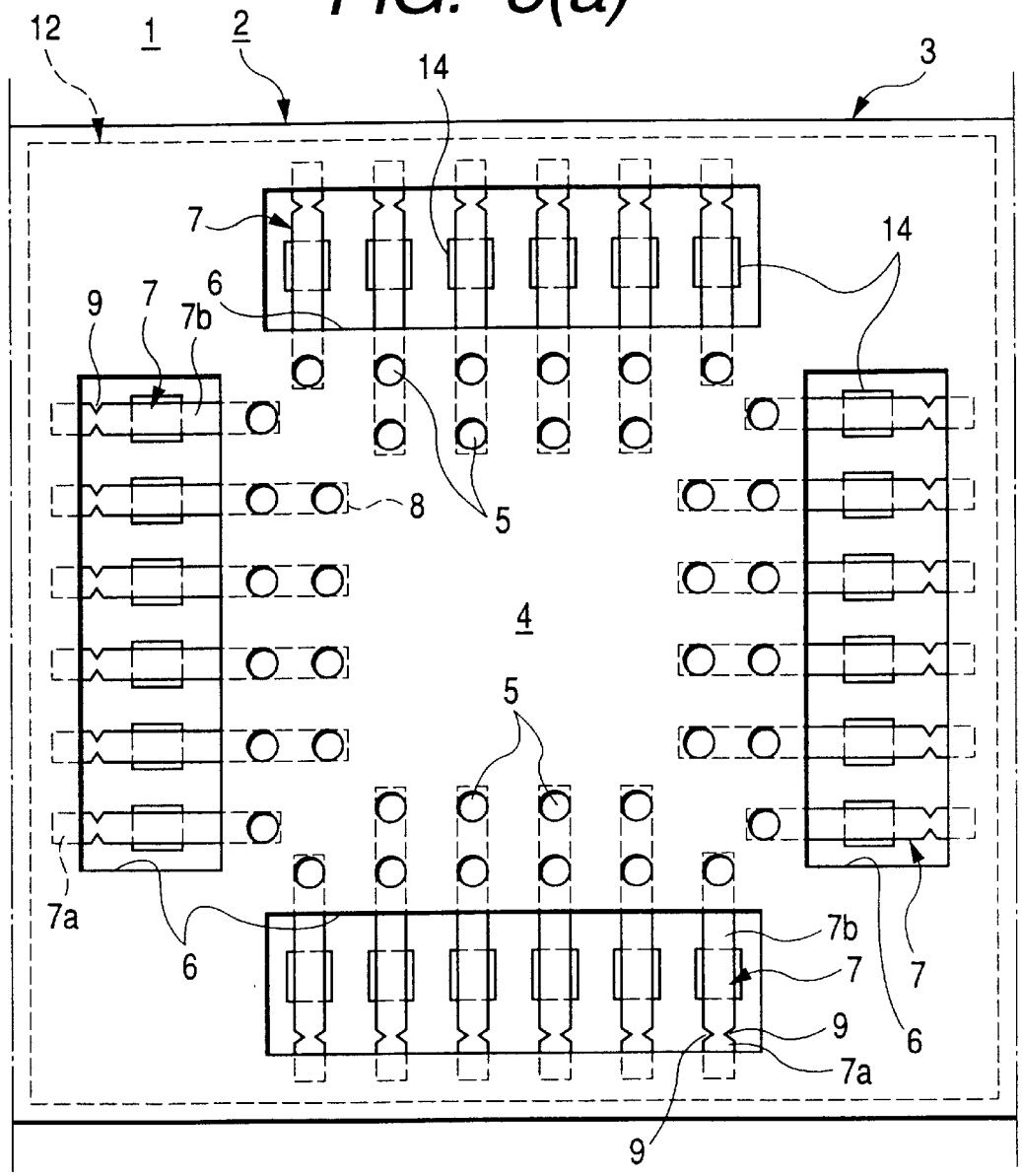
FIGS. 5(a) and (b) show a workpiece.
Figure 5B:
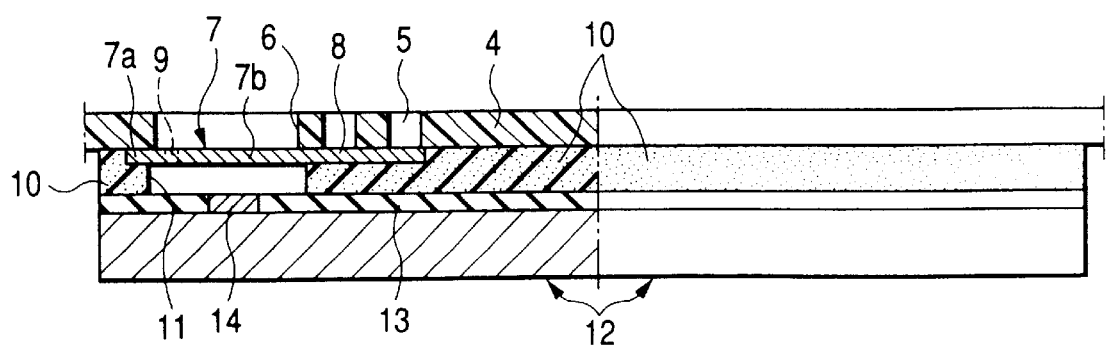
Figure 6A:
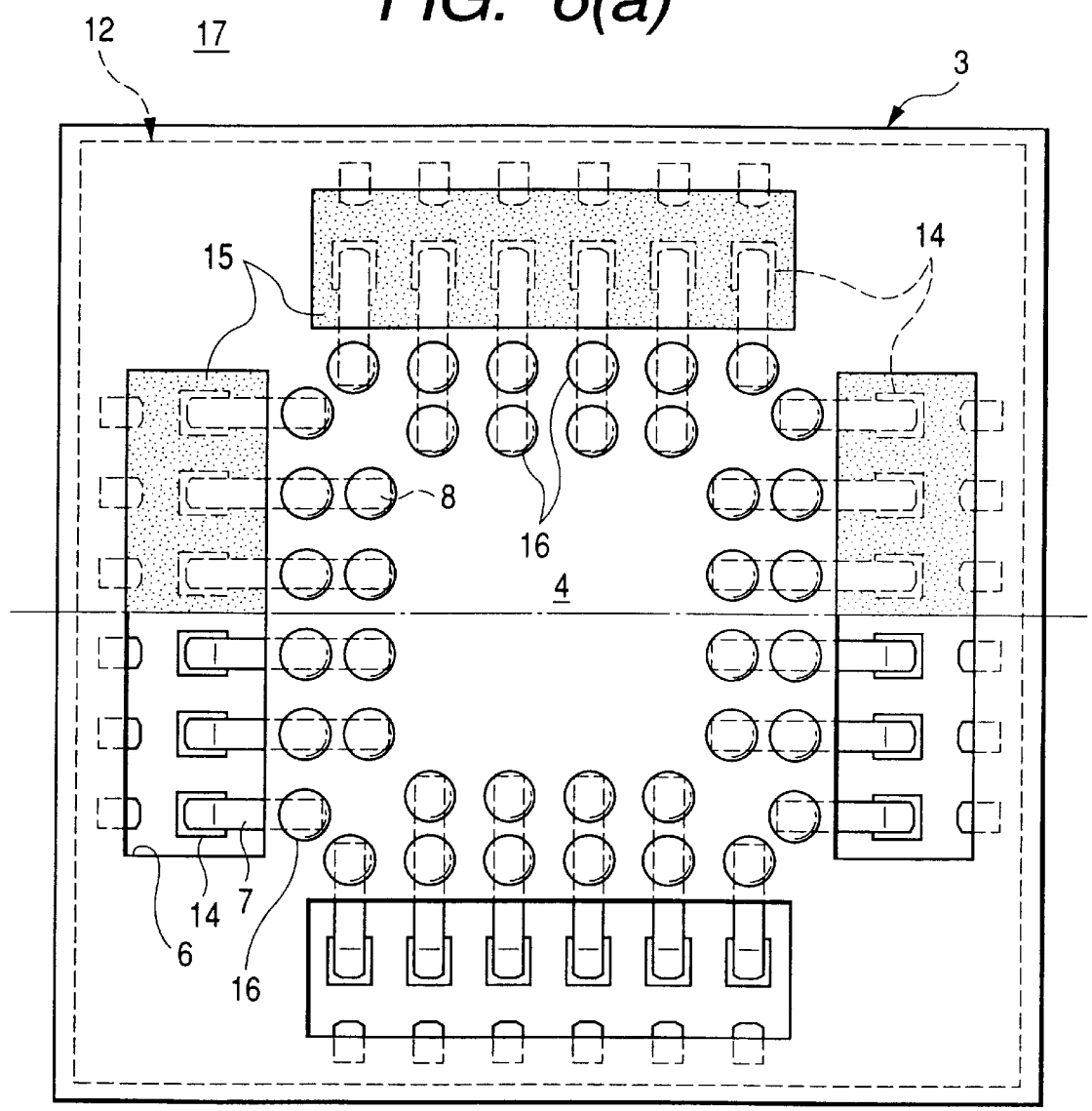
FIGS. 6(a) and (b) show a manufactured microball grid array integrated circuit ($\mu$BGA·IC)
Figure 6B:
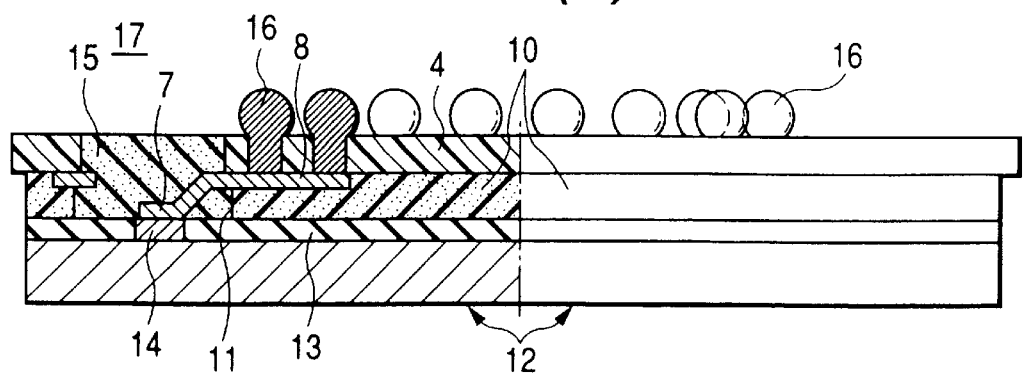

FIG. 1 is a flowchart showing an inner lead recognition method in a bonding method equivalent to an embodiment of the present invention. FIGS. 2(a) to (f) are explanatory drawings for explaining each process. FIG. 3 is a schematic drawing showing a bonding machine equivalent to an embodiment of the present invention. FIGS. 4(a) to (e) are sectional views showing each process of the bonding method. FIGS. 5(a) and (b) show a workpiece, FIG. 5(a) is a plan omitting a part and FIG. 5(b) is a front sectional view omitting a part. FIGS. 6(a) and (b) show a manufactured microball grid array integrated circuit ($\mu$BGA·IC), FIG. 6(a) is a plan and FIG. 6(b) is a front view a part of which is a sectional view.

In this embodiment, the bonding method according to the present invention is used in a bonding process in a method of manufacturing an integrated circuit (IC) provided with a microball grid array ($\mu$BGA) (hereinafter called $\mu$BGA·IC), that is, a so-called chip-sized package (CSP) and is executed by a bonding machine shown in FIG. 3. A workpiece 1 in the bonding process in the method of manufacturing $\mu$BGA·IC is constituted as shown in FIG. 5. In the workpiece 1 (a chip lead complex tape), a chip (a semiconductor integrated circuit chip) is mechanically connected (fixed such as fastened, bonded and stuck) to a tape carrier (a wiring tape) via an insulating layer (if necessary, a conductive film may also be inserted between insulating layers). The tape carrier 2 as a carrier is equivalent to a tape automated bonding (TAB) tape used in a method of manufacturing IC (TCP·IC) provided with a tape carrier package(TCP). As the tape carrier 2 is constituted so that the same pattern is repeated in the longer direction (plural patterns may also exist in the direction perpendicular to the longer direction), the constitution of only one unit is described and shown in drawings.

The tape carrier 2 is provided with the body 3 of the carrier made of resin which is an insulator such as polyimide in which the same patterns are integrated with a tape which continues in the longer direction and in the body 3 of the carrier, a square bump formation part 4 which may also be rectangular or in the other form is arranged in a row (may also be in plural rows) in the longer direction. In the bump formation part 4, multiple bump holes 5 are made on a square line which may also be a line rectangular or in the other form and each bump hole 5 is provided to electrically connect a bump described later to an outer lead described later. Four window apertures 6 respectively formed in the shape of a rectangle are made and arranged in the form of a square frame which may also be a frame rectangular or in the other form along the four sides of the bump formation part 4.

Plural inner leads 7 are wired through each window aperture 6 in the shorter direction on the main surface on one side of the body 3 of the carrier (hereinafter called the lower surface). Each outer lead 8 is coupled to one end on the side of the bump formation part 4 of each inner lead 7 (hereinafter called the inner end) and each inner lead 7 and each outer lead 8 connected to each other are mechanically and electrically integrated. A group of inner leads 7 and a group of outer leads 8 are formed by conductive material such as copper and gold. For a method of forming the group of inner leads 7 and the group of outer leads 8, there are a method of patterning copper or gold foil fixed on the body 3 of the carrier by suitable means such as welding and bonding by lithography and etching, a method of selectively plating gold on the body 3 of the carrier by lithography and others. The part opposite to the bump hole 5 of each outer lead 8 is exposed from the bump formation part 4.

The inner leads 7 are respectively wired at regular intervals in parallel in the longer direction of each window aperture 6. A pair of triangular notches 9 are formed in V shape on both sides in a part which crosses the window aperture 6 of each inner lead 7. That is, each inner lead 7 is constituted so that it can be readily cut on a line which connects both notches 9 (If a notch is formed as described above, there is effect that a lead can be prevented from being deformed when a tape is carried before, however, if there is no such problem, a lead where a notch is formed beforehand as shown in FIGS. 25 and 26 may also be used. If a lead where a notch is beforehand formed is used, a lead forming characteristic may be further satisfactory.). In each inner lead 7, a pair of notches 9 are arranged in a position biased toward the reverse side (hereinafter called outside) to the bump formation part 4 extending from the center to the window aperture 6. That is, the length of a part 7a (hereinafter called a short part) from both notches 9 to the outside of the window aperture 6 in each inner lead 7 is shorter than the length of a part 7b (hereinafter called a long part) from both notches 9 to the inside of the window aperture 6 in each inner lead 7.

On the lower surface of the body 3 of the carrier, an insulating film 10 made of elastomer and silicon rubber is deposited by suitable means such as bonding, and the group of inner leads 7 and the group of outer leads 8 are covered by the insulating film 10. A rectangular window aperture 11 is made in a part opposite to each window aperture 6 of the body 3 of the carrier in the insulating film 10 so as to expose the group of inner leads 7 so that the window aperture is a little larger than the window aperture 6 of the body 3 of the carrier. Therefore, the tape carrier 2 is constituted by the body 3 of the carrier, the group of inner leads 7, the group of outer leads 8 and the insulating film 10.

As shown in FIG. 5, a chip 12 is formed in a flat square the area of which is approximately equal to that of one unit of the tape carrier 2 and desired semiconductor integrated circuits including a semiconductor device are formed on one main surface (hereinafter called on the active area side). That is, as for the chip 12, semiconductor integrated circuits are formed on the active area side in the state of a semiconductor wafer in a preprocess in manufacturing IC and divided in the form of a flat square in a dicing process. The surface of the chip 12 on the active area side is coated with a passivation film 13 and an electrode pad 14 is exposed in an opening formed in the passivation film 13. Plural electrode pads 14 are formed and correspond to each inner lead 7 in the tape carrier 2.

The chip 12 constituted as described above is mechanically connected to the tape carrier 2 constituted as described above as shown in FIG. 5. That is, the chip 12 is arranged in the tape carrier 2 so that each electrode pad 14 is registered to each inner lead 7, bonded between the passivation film 13 and the insulating film 10 and mechanically connected. In this state, each inner lead 7 is opposite to each electrode pad 14 in a position distant upward by the thickness of the insulating film 10 and a bond layer. In each inner lead 7, a pair of notches 9 are arranged in a position biased left from right over the electrode pad 14 and approximately the center of the long part 7b of the inner lead 7 is located right over the electrode pad 14.

A bonding machine shown in FIG. 3 is provided with a stage 21 and the stage 21 is constituted so that a workpiece 1 constituted as described above is horizontally held. An XY table 22 is installed next to the stage 21 and constituted so that a bonding head 23 mounted on the XY table is moved in x- and y-directions. One end of a bonding arm 24 to the end of which a bonding tool 25 is attached is supported by the bonding head 23 and the bonding head 23 is constituted so that the bonding tool 25 is lifted or lowered by operating the bonding arm 24. A position detecting sensor 26 is attached to the bonding arm 24 and connected to a main controller described later. A controller 27 (hereinafter called an operating controller) for controlling the above operation is connected to the XY table 22 and the bonding head 23 and a controller 28 (hereinafter called a main controller) for instructing operation is connected to the operating controller 27. A display 29 is connected to the main controller 28.

An industrial television camera 31 (hereinafter called a camera) as an image capturing device for constituting an inner lead recognition system 30 is attached to the bonding head 23 via a stand 36 and the camera 31 photographs a workpiece 1 on the stage 21. An inner lead recognizing measuring line setting section 32 (hereinafter called a setting section) for setting a measuring line for recognizing an inner lead is connected to the camera 31 and a luminance measuring section 33 is connected to the setting section 32. A forming section 34 for forming an added luminance distribution waveform is connected to the luminance measuring section 33 and a judging section 35 for judging the center line of an inner lead is connected to the forming section 34. The judging section 35 is connected to the main controller 28 so that the result of judgment is sent to the main controller 28.

Next, referring to FIGS. 1 to 3, an inner lead recognition method in a bonding method equivalent to an embodiment of the present invention by the bonding machine constituted as described above will be described.

The main controller 28 drives the XY table 22 and moves the camera 31 in a position for photographing an inner lead 7 to be bonded in a workpiece 1 loaded on the stage 21. The camera 31 executes an image capturing process 41 shown in FIG. 1 and photographs an inner lead 7 to be bonded. An image 51 shown in FIG. 2(a) photographed by the camera 31 is displayed on the display 29 and input to the setting section 32.

The setting section 32 executes an inner lead recognizing measuring line setting process 42 shown in FIG. 1, sets one image scanning line including the electrode pad 14 of image scanning lines respectively perpendicular to the inner lead 7 in the image 51 shown in FIG. 2(a) to an inner lead recognizing measuring line 52 opposite to the electrode pad (hereinafter called a central measuring line) and respectively sets two image scanning lines 53 and 54 respectively adjacent to the electrode pad 14 to an inner lead recognizing measuring line outside the electrode pad (hereinafter called an inner end measuring line and an outer end measuring line).

Figure 2B:
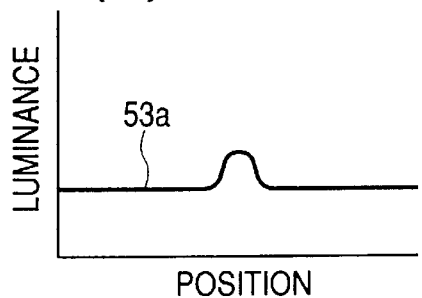
Figure 3:
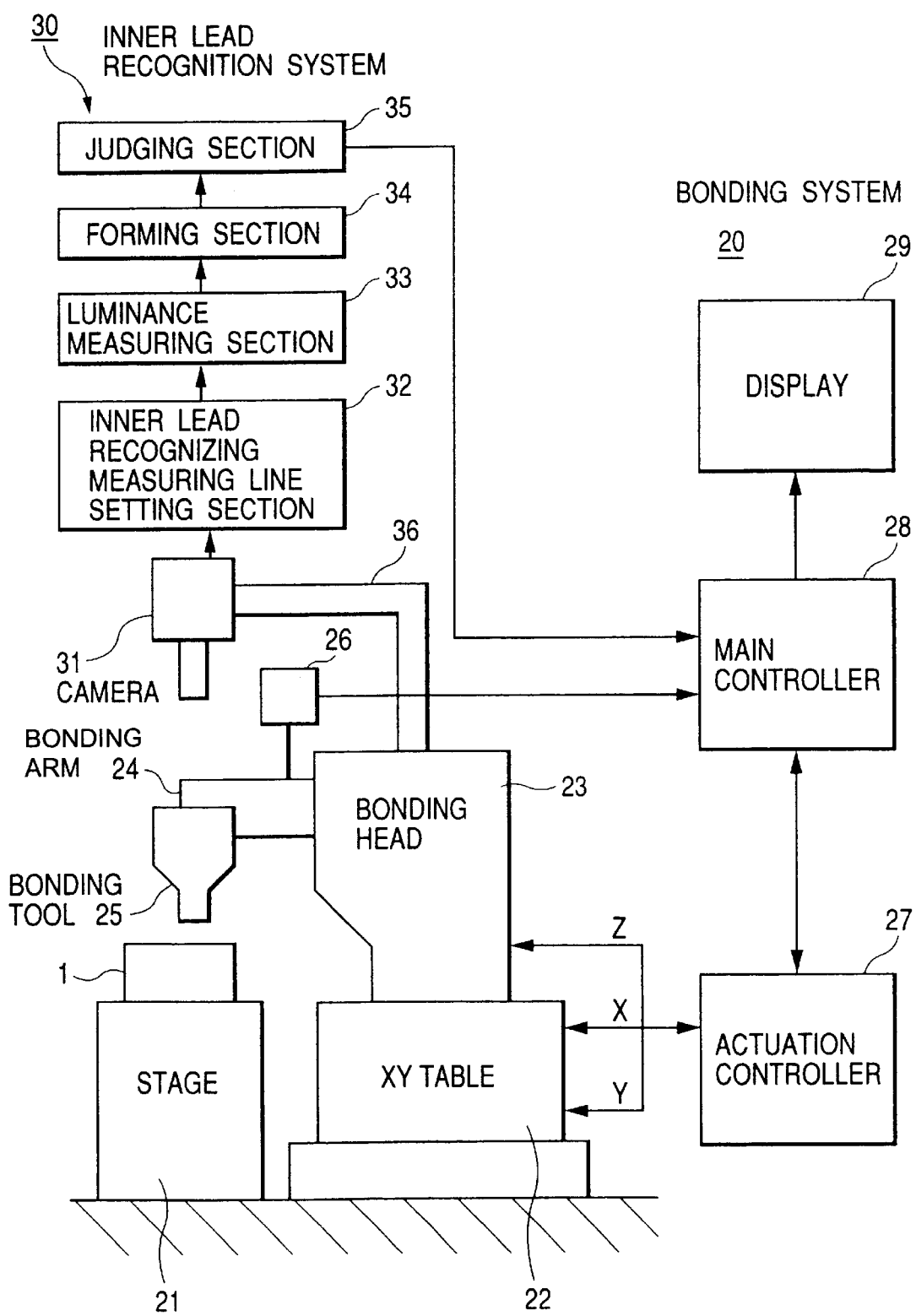
FIG. 3 is a schematic drawing showing a bonding machine equivalent to an embodiment of the present invention.

The luminance measuring section 33 executes a luminance measuring process 43 shown in FIG. 1, measures luminance at each point on each scanning line every the central measuring line 52, the inner end measuring line 53 and the outer end measuring line 54 and forms a central measuring line luminance waveform 52a, an inner end measuring line luminance waveform 53a and an outer end measuring line luminance waveform 54a as shown in FIGS. 2(b), (c), and (d). These central measuring line luminance waveform 52a, inner end measuring line luminance waveform 53a and outer end measuring line luminance waveform 54a are input to the forming section 34.

Figure 2E:
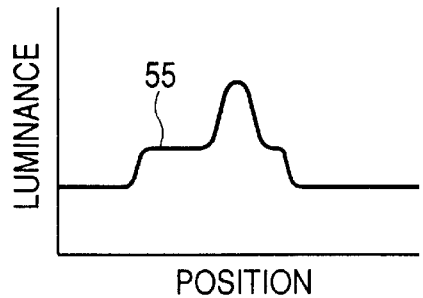
Figure 2C:
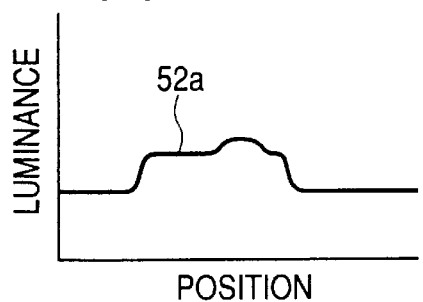

The forming section 34 executes a forming process 44 shown in FIG. 1 and forms an added luminance distribution waveform 55 shown in FIG. 2(e) by relating each point in the central measuring line luminance waveform 52a, the inner end measuring line luminance waveform 53a and the outer end measuring line luminance waveform 54a shown in FIGS. 2(b), (c), and (d), that is, by equalizing each time series and overlapping the respective waveforms. That is, luminance in the central measuring line luminance waveform 52a, the inner end measuring line luminance waveform 53a and the outer end measuring line luminance waveform 54a is added every point and the added luminance distribution waveform 55 is formed. The added luminance distribution waveform 55 is input to the judging section 35.

Figure 2F:
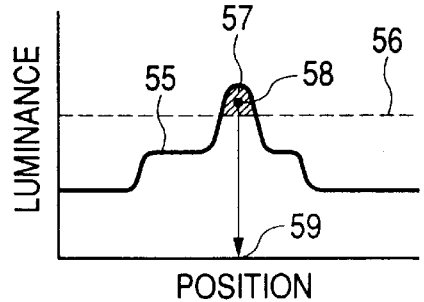
Figure 2D:
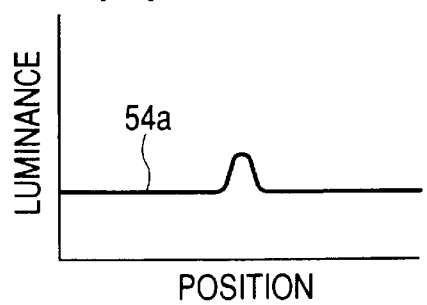

The judging section 35 executes a judging process shown in FIG. 1 and first sets a threshold value 56 to the added luminance distribution waveform 55 as shown in FIG. 2(f). Next, the center of gravity in an area 57 equal to or larger than the threshold value 56 in the added luminance distribution waveform 55 is calculated and a position opposite to the center of gravity 58 is judged to be the position 59 of the center line of an inner lead 7 to be bonded. That is, the position of the inner lead 7 to be bonded is precisely recognized.

The inner lead 7 is precisely bonded to the electrode pad 14 by aligning the center line of the bonding tool 25 of the bonding machine 20 with the position 59 of the center line of the inner lead 7 acquired as described above by the operation of the XY table 22 under the control of the operating controller 27 according to the instruction of the main controller 28.

Next, referring to FIG. 4, a bonding method equivalent to the embodiment of the present invention by the bonding machine constituted as described above will be described.

Figure 4A:
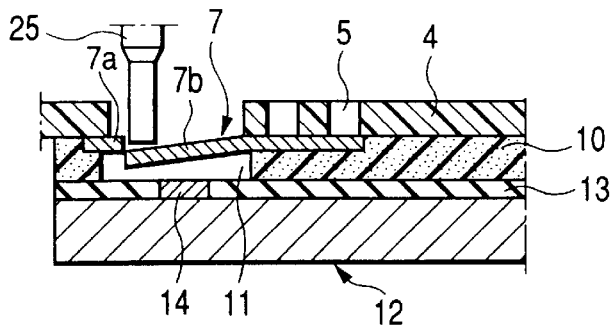
FIGS. 4(a) to (e) show the bonding method equivalent to the embodiment of the present invention.

When the bonding tool 25 pushes down a part near to the notch 9 in the long part 7b of the inner lead 7 as shown in FIG. 4(a), the inner lead 7 is cut in a line connecting both notches 9.

Figure 4B:
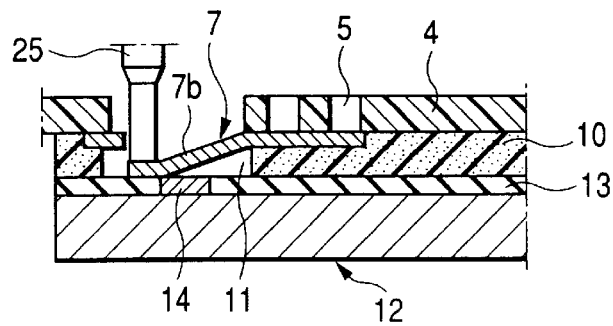

When the bonding tool 25 is further lowered as shown in FIG. 4(b), the cut piece in the long part 7b of the inner lead 7 is pushed down and reaches the upper surface of the chip 12.

It is judged by the main controller 28 by analyzing positional data from the position detecting sensor 26 attached to the bonding arm 24 whether the bonding tool 25 is touched to the upper surface of the chip 12 via the inner lead 7 or not. If it is judged that the bonding tool 25 does not reach the upper surface of the chip 12, the main controller 28 operates an alarm system such as a buzzer and instructs the display 29 to display the contents of the alarm. Next, the bonding tool 25 is gradually lowered and touched to the upper surface of the chip 12 via the inner lead 7 by the manual operation of a keyboard by an operator or automatic instruction control by the main controller 28.

If it is judged that the bonding tool 25 reaches the upper surface of the chip 12 via the inner lead 7, the main controller 28 reads positional data from the position detecting sensor 26 when the bonding tool reaches and measures the height of a point where the bonding tool reaches on the upper surface of the chip 12.

Figure 4C:
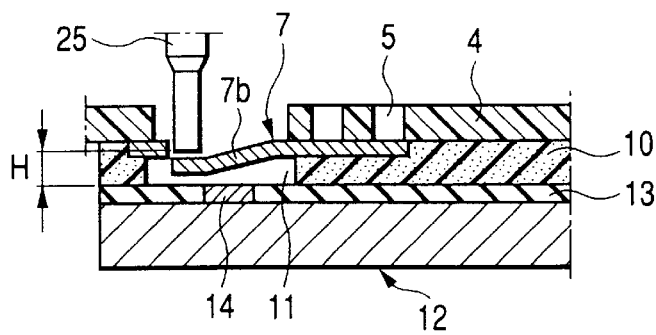

The main controller 28 which finishes measuring the height of the point where the bonding tool 25 reaches lifts the bonding tool 25 by a predetermined height H as shown in FIG. 4(c). The optimum value of the predetermined height H every bonding condition is acquired by an empirical method such as an experiment, simulation by a computer and past proven data and stored in the main controller 28 via a keyboard beforehand. The main controller 28 instructs a predetermined height H to the operating controller 27. The operating controller 27 lifts the bonding tool 25 by the predetermined height H by controlling the bonding head 23 and oscillating the bonding arm 24.

When the bonding tool 25 is lifted by the predetermined height H, the cut piece in the long part 7b of the inner lead 7 is a little lifted by the spring back of the inner lead 7 from the upper surface of the chip 12 as shown in FIG. 4(c). In a state in which the cut piece in the long part 7b of the inner lead 7 is lifted from the chip 12, the bonding tool 25 lifted by the predetermined height H is distant from the upper surface of the cut piece in the long part 7b of the inner lead 7.

Figure 4D:
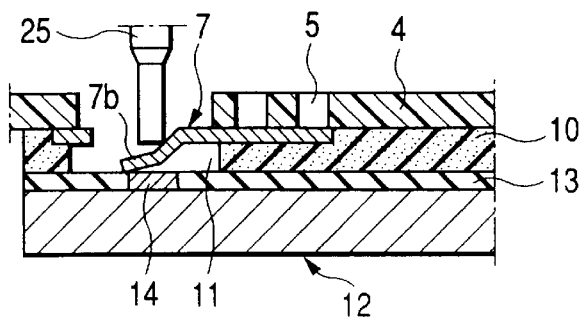

Next, as shown in FIG. 4(d), the bonding tool 25 is moved in parallel as far as over the electrode pad 14 in the direction of the bump formation part 4 with the bonding tool maintained at the height as it is. As the cut piece in the long part 7b of the inner lead 7 is shifted in the direction of the bump formation part 4 by the bonding tool 25 and is pushed diagonally downward as the bonding tool is moved in parallel, the cut piece is in a predetermined looped form and the lower surface of the end is touched to the upper surface of the electrode pad 14.

Figure 4E:
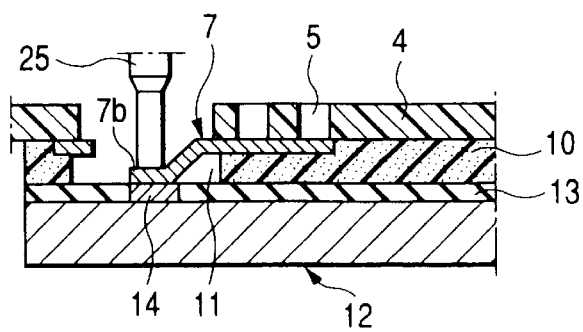

Next, as shown in FIG. 4(e), the bonding tool 25 is lowered and pushes the cut piece in the long part 7b of the inner lead 7 down. The end on the side of the cut end of the cut piece in the long part 7b of the inner lead 7 is pressed on the electrode pad 14 with the end forming a predetermined looped form by the above pushing down. The bonding tool 25 presses the end on the side of the cut end of the cut piece in the long part 7b of the inner lead 7 on the electrode pad 14 and bonds them by thermocompression by applying heat and ultrasonic energy. That is, the inner lead 7 is bonded to the electrode pad 14 by the bonding tool 25.

Afterward, the chip 12 is electrically connected to the tape carrier 2 by repeating the inner lead recognition method described above and the bonding method every inner lead 7. Before the inner lead 7 is bonded to the electrode pad 14 of the chip 12 by the bonding tool 25 in bonding every inner lead 7, the position 59 of the center line of the inner lead 7 is recognized, a height from the electrode pad 14 in the chip 12 to the bonding tool 25 is measured without omission and bonding by the bonding tool 25 is executed under an optimum condition corresponding to the recognized position 59 of the center line and the measured height.

Therefore, for example, even if an error in an interval between the bonding tool and the inner lead 7 bonded successively by the bonding tool 25 and between the inner lead and the electrode pad 14 occurs because the chip 12 mechanically connected via the insulating film 10 under the bump formation part 4 is tilted, the looped form of each inner lead 7 after bonding is suitably formed because bonding by the bonding tool 25 is executed under an optimum condition corresponding to the above error every inner lead 7.

When the above bonding of all inner leads 7 is finished, the group of inner leads 7 is sealed by a resin sealed part 15 by potting insulating material such as elastomer and silicon rubber inside each window aperture 6 of the tape carrier 2 as shown in FIG. 6.

Next, a bump 16 protruded from the upper surface of the bump formation part 4 is formed on the tape carrier 2 as shown in FIG. 6 by soldering a solder ball in a part exposed at the bottom of the bump hole 5 of each outer lead 8 in the tape carrier 2. As described above, μBGA·IC 17 shown in FIG. 6 is manufactured.

A chip-sized package manufactured as described above is supplied to a mounted device in a state in which it is attached to a tape carrier or divided into units if necessary and electrically or mechanically connected to another wiring board via the bump electrode 16 and other connecting structure.

According to the above embodiment, the following effect is obtained:

(1) As the bonding tool 25 can be precisely aligned with the inner lead 7 by successively recognizing the position 59 of the center line of the inner lead 7 before the inner lead 7 is bonded to the electrode pad 14 of the chip 12 by the bonding tool 25 when the inner lead 7 is bonded to the electrode pad 14 by the bonding tool 25 and each inner lead 7 can be suitably bonded to each electrode pad 14, the quality, the reliability and the yield of μBGA·IC 17 can be enhanced.

(2) As the area 57 equal to or larger than the threshold value 56 in the added luminance distribution waveform 55 can be formed by forming the added luminance distribution waveform 55 by adding each luminance every same point in the central measuring line luminance waveform 52a, the inner end measuring line luminance waveform 53a, and the outer end measuring line luminance waveform 54a and setting the threshold value 56 to the added luminance distribution waveform 55, the position 59 of the center line of the inner lead 7 can be precisely judged regardless of the existence of the electrode pad 14 to which the inner lead 7 is to be bonded and the position of the inner lead 7 to be bonded can be precisely recognized.

FIG. 7 is a flowchart showing an inner lead recognition method in the bonding method equivalent to the embodiment of the present invention. FIGS. 8 are explanatory drawings for explaining each process shown in FIG. 7.

This embodiment is different from the above first embodiment in that an image corresponding to an inner lead and an electrode pad is fetched from a horizontal direction to recognize the center line in the thickness of the inner lead. Referring to FIGS. 7 and 8, the inner lead recognition method in the bonding method equivalent to this embodiment will be described below.

Figure 8A:
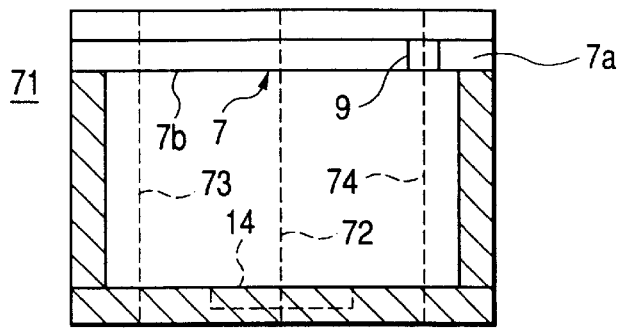
FIGS. 8(a) to (f) are explanatory drawings for explaining each process.

In this embodiment, a camera fetches an image 71 shown in FIG. 8(a) corresponding to an inner lead 7 and an electrode pad 14 with the camera turned sideways and in the state, an image capturing process 61 shown in FIG. 7 is executed. The image 71 photographed by the camera turned sideways and shown in FIG. 8(a) is displayed on a display and input to a setting section 32.

The setting section 32 executes an inner lead recognizing measuring line setting process 62 shown in FIG. 7, sets one image scanning line including the electrode pad 14 of vertical scanning lines (a virtual scanning line in the case of a television receiver, however, it can be readily set by image processing) respectively perpendicular to the inner lead 7 in the image 71 to an inner lead recognizing measuring line corresponding to an electrode pad 72 (hereinafter called central measuring line) as shown in FIG. 8(a), and respectively sets image scanning lines on both sides of the electrode pad 14 to inner lead recognizing measuring lines outside the electrode pad 73 and 74 (hereinafter called an inner end measuring line and an outer end measuring line).

Figure 8B:
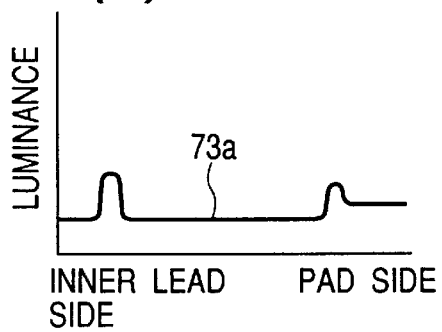

A luminance measuring section 33 executes a luminance measuring process 63 shown in FIG. 1, measures luminance at each point on each scanning line every the central measuring line 72, the inner end measuring line 73, and the outer end measuring line 74 and forms a central measuring line luminance waveform 72a, an inner end measuring line luminance waveform 73a and an outer end measuring line luminance waveform 74a respectively shown in FIGS. 8(b), (c), and (d). These central measuring line luminance waveform 72a, inner end measuring line luminance waveform 73a and outer end measuring line luminance waveform 74a are input to a forming section 34.

Figure 8E:
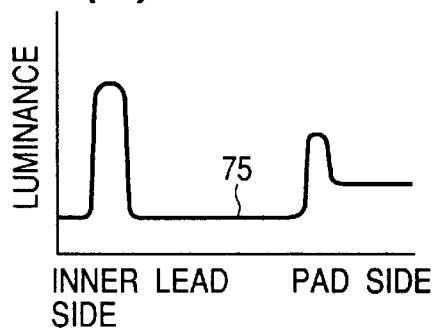
Figure 8C:
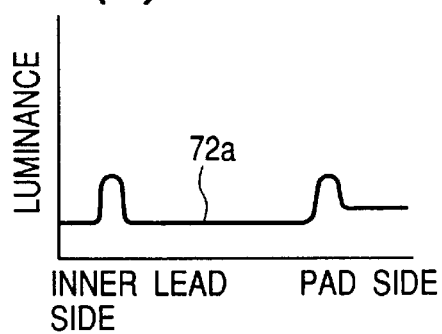

The forming section 34 executes a formation process 44 shown in FIG. 1 and forms an added luminance distribution waveform 75 shown in FIG. 8(e) by aligning each point on each scanning line in the central measuring line luminance waveform 72a, the inner end measuring line luminance waveform 73a and the outer end measuring line luminance waveform 74a shown in FIGS. 8(b), (c), and (d) that is, by equalizing time series and overlapping each waveform. That is, luminance in the central measuring line luminance waveform 72a, the inner end measuring line luminance waveform 73a and the outer end measuring line luminance waveform 74a is added every each point and the added luminance distribution waveform 75 is formed. The added luminance distribution waveform 75 is input to a judging section 35.

Figure 8F:
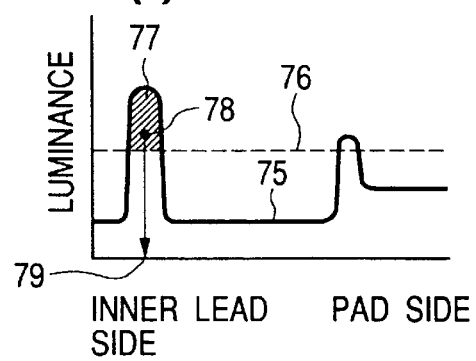
Figure 8D:
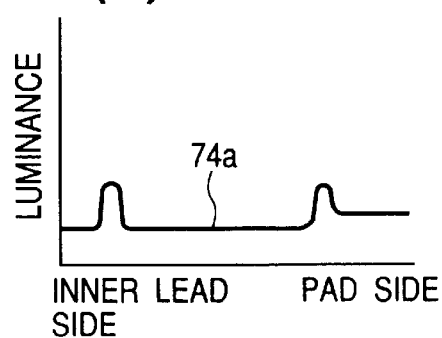

The judging section 35 executes a judging process 65 shown in FIG. 1 and first, sets a threshold value 76 of the added luminance distribution waveform 75 as shown in FIG. 8(f) Next, the center of gravity 78 in an area 77 equal to or larger than the threshold value 76 in the added luminance distribution waveform 75 is calculated and a position opposite to the center of gravity 78 is judged to be the position 79 of the center line in the direction of the thickness of the inner lead 7. That is, the above shows that the position in height of the inner lead 7 to be bonded is precisely recognized.

The inner lead 7 is precisely bonded to the electrode pad 14 by utilizing the height of a bonding tool 25 of a bonding machine 20 in the position acquired as described above of the center line in the direction of the thickness of the inner lead 7, that is, the position 79 in height for the operation of a bonding head 23 under the control of an operating controller 27 according to the instruction of a main controller 28.

FIG. 9 is a flowchart showing an inner lead recognition method in the bonding method equivalent to the embodiment of the present invention. FIGS. 10 are explanatory drawings for explaining each process.

Figure 10A:
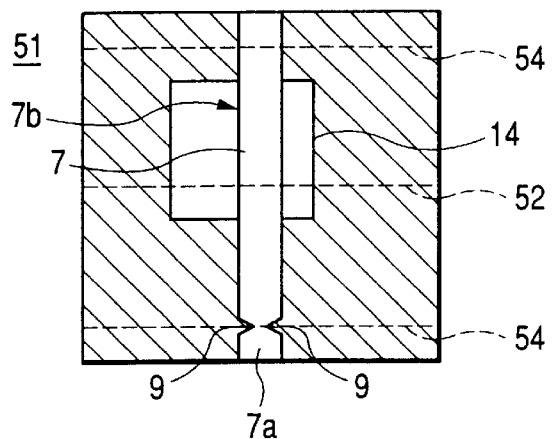
FIGS. 10(a) to (f) are explanatory drawings for explaining each process.
Figure 10B:
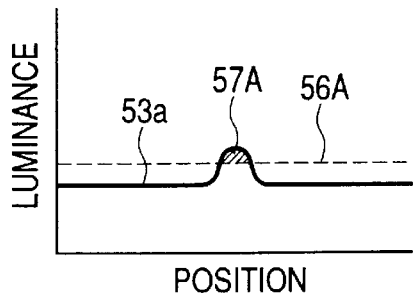
Figure 10E:
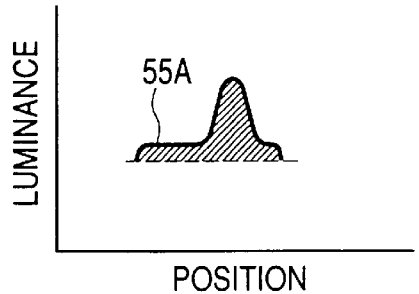
Figure 10C:
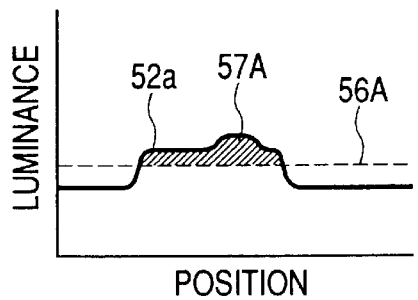
Figure 10F:
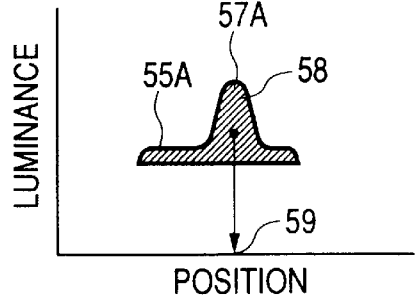
Figure 10D:
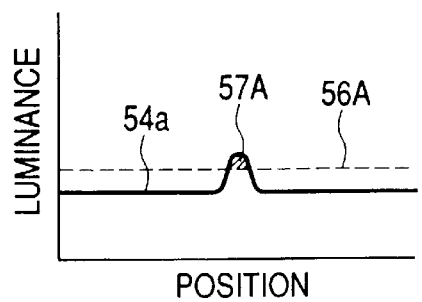

This embodiment is different from the above first embodiment in that a threshold value exceeding added luminance distribution waveform 55A shown in FIG. 10(e) is formed by setting a threshold value 56A every a central measuring line luminance waveform 52a, an inner end measuring line luminance waveform 53a, and an outer end measuring line luminance waveform 54a as shown in FIGS. 10(b), (c), and (d), equalizing the time series of the above waveforms and overlapping the above waveforms after acquiring each area 57A exceeding the threshold value 56A, the center of gravity 58 in the area 57A in the threshold value exceeding added luminance distribution waveform 55A is calculated as shown in FIG. 10(f) and a position opposite to the center of gravity 58 is judged to be the position 59 of the center line of the inner lead 7 to be bonded.

Also in the above embodiment, similarly, after each area exceeding the threshold value is acquired for each central measuring line luminance waveform 72a, each inner end measuring line luminance waveform 73a, and each outer end measuring line luminance waveform 74a, a threshold value exceeding added luminance distribution waveform is formed, the center of gravity is calculated and a position opposite to the center of gravity may be judged to be the position of the center line in the direction of the thickness of the inner lead 7.

The present invention made by the inventor is described concretely above based upon the embodiments, however, the present invention is not limited to the above embodiments and it need scarcely be said that variations may be allowed in a range in which the outline is unchanged.

For example, only one inner end measuring line and only one outer end measuring line are set, however, it is desirable that as many inner end measuring lines and outer end measuring lines as possible are set in a range in which the number of pixels of a camera allows because the more above measuring lines are set, the smaller the effect of an electrode pad is relatively.

For an image capturing device, not only an industrial television camera is used but an area sensor, a line sensor such as a charge coupled device (CCD) and others may also be used. In that case, an image capturing device may also be constituted so that an image is scanned by moving the image capturing device or by moving a stage.

For a bonding method for electrically connecting an inner lead to an electrode pad, not only an ultrasonic thermocompression bonding method is used but a pressure welding method, an eutectic method and others may also be used.

A bonding machine for executing bonding is not limited to a bonding machine constituted for only single point bonding and an existing wire bonding machine may also be utilized.

The body of a carrier which is a carrier for the group of inner leads and the group of outer leads is not only constituted by a tape but it may also be constituted by a rigid substrate formed by an insulating resin film, ceramics or insulating material such as resin.

A case in which the present invention made by the inventor is applied to the method of manufacturing μBGA·IC is mainly described above, however, the present invention is not limited to it and can be applied to the whole bonding technology used for a method of manufacturing CSP·IC and others.

Second Embodiment

Figure 12:
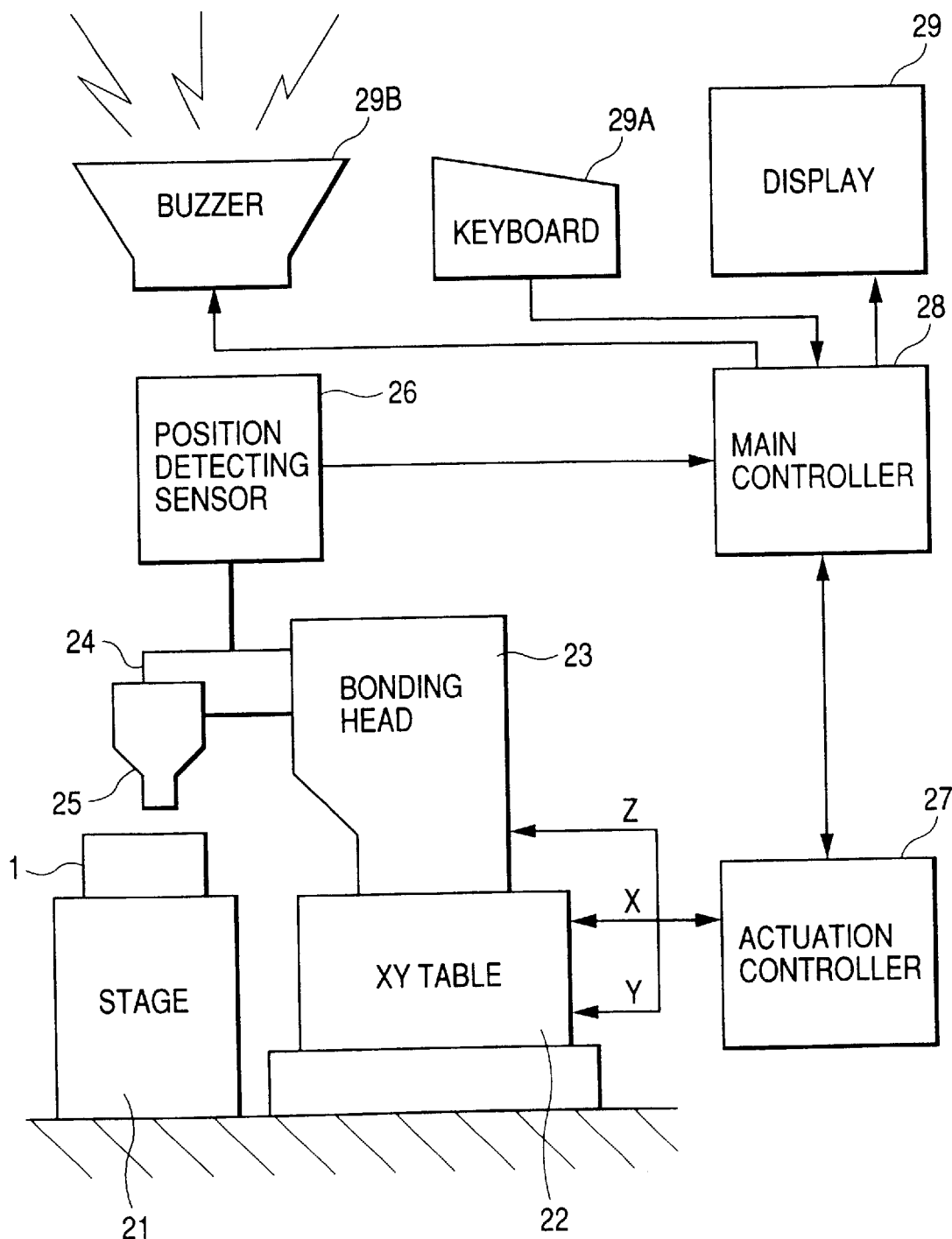
FIG. 12 is a schematic drawing showing a bonding machine equivalent to an embodiment of the present invention.
Figure 13A:
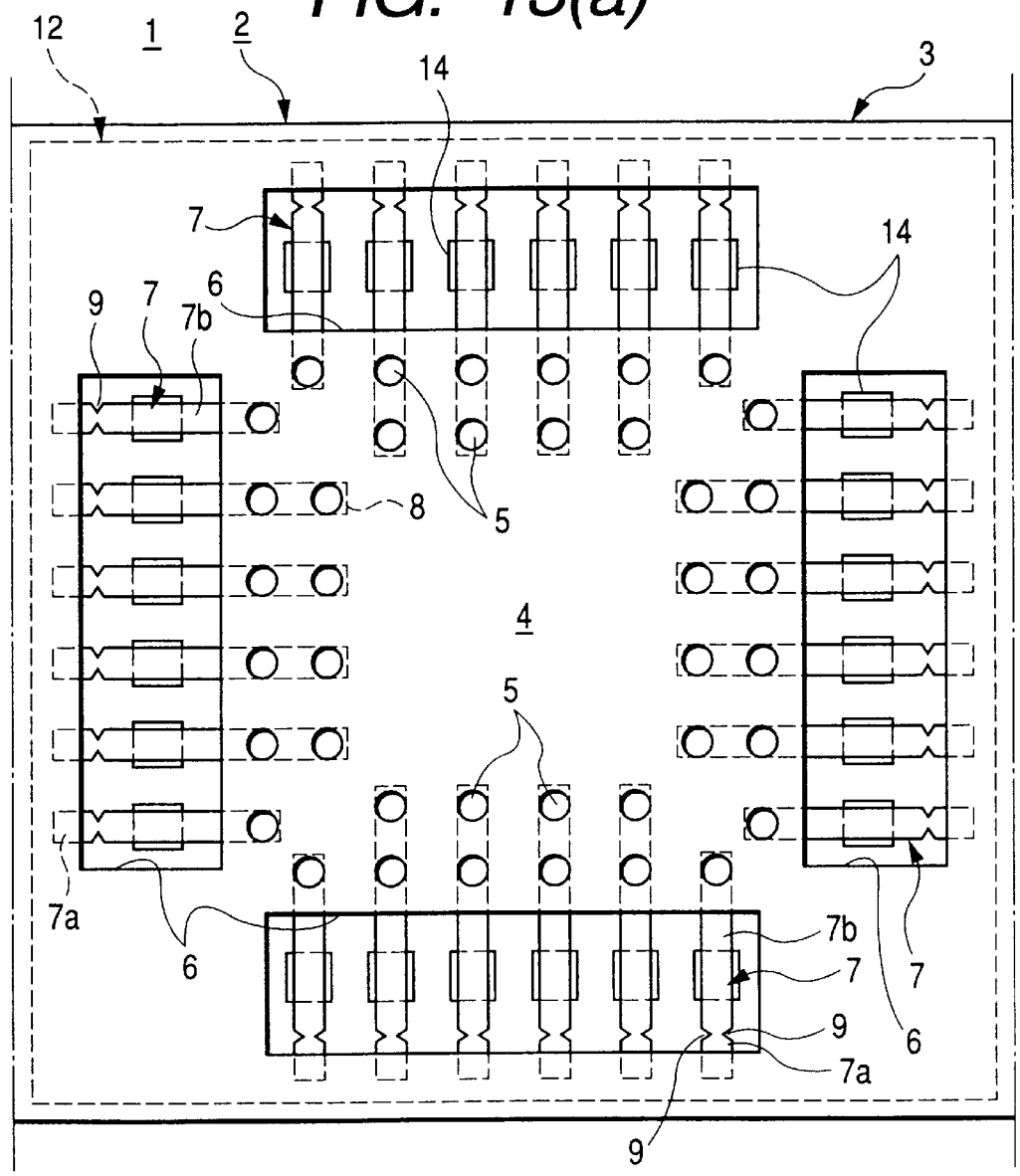
FIGS. 13(a) and (b) show a workpiece.
Figure 13B:
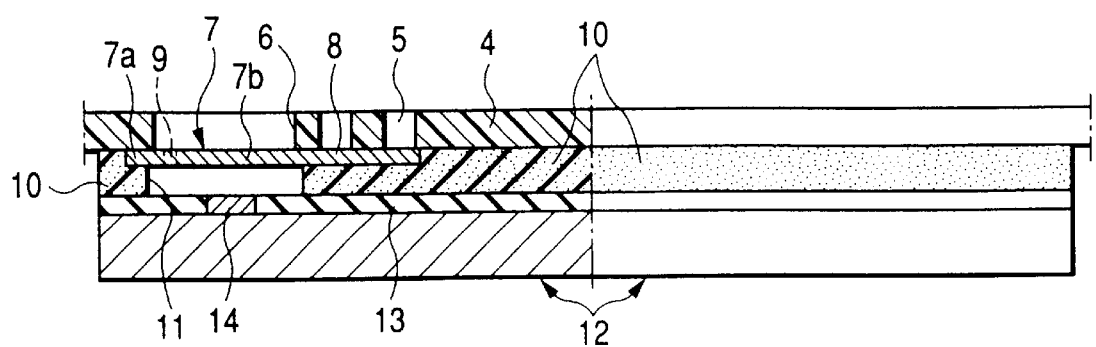
Figure 14A:
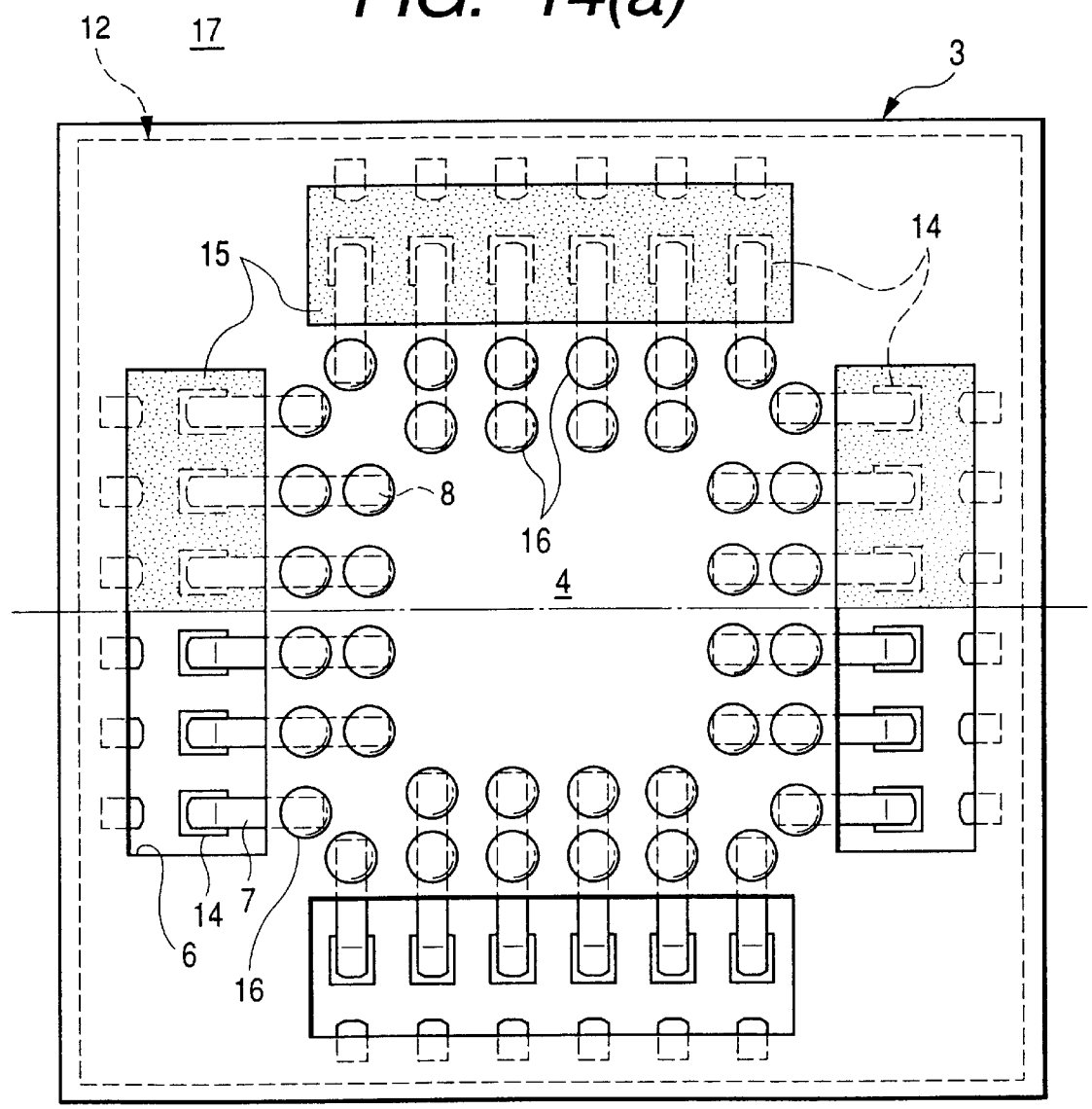
FIGS. 14(a) and (b) show a manufactured $\mu$BGA·IC.
Figure 14B:
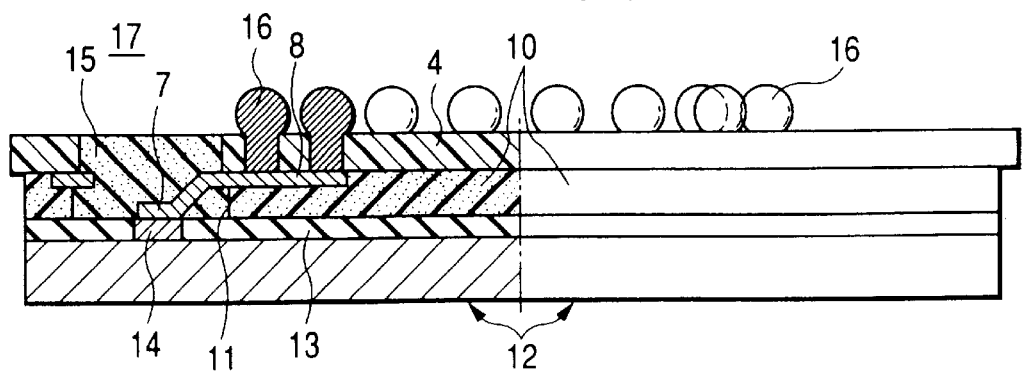

FIGS. 11 are partial sectional views showing each process in a bonding method equivalent to an embodiment of the present invention. FIG. 12 is a schematic drawing showing a bonding machine equivalent to the embodiment of the present invention. FIGS. 13 show a workpiece, FIG. 13(a) is a partially omitted plan and FIG. 13(b) is a partially omitted front view showing a partial section. FIGS. 14 show manufactured μBGA·IC, FIG. 14(a) is a plan showing a partial section and FIG. 14(b) is a front view showing a partial section.

In this embodiment, the bonding method according to the present invention is used for a bonding process in a method of manufacturing IC provided with μBGA (hereinafter called μBGA·IC) and executed by a bonding machine shown in FIG. 12. A workpiece 1 in the bonding process in the method of manufacturing μBGA·IC is constituted as shown in FIG. 13. In the workpiece 1, a chip is mechanically connected to a tape carrier via an insulating layer. The tape carrier 2 as a carrier is equivalent to a tape automated bonding (TAB) tape used in a method of manufacturing IC provided with a tape carrier package (TCP·IC). As the tape carrier 2 is constituted so that the same pattern is repeated in the longer direction, only one unit is described and shown.

The tape carrier 2 is provided with the body 3 of the carrier made of resin which is an insulator such as polyimide in which the same patterns are integrated with a tape which continues in the longer direction and in the body 3 of the carrier, square bump formation parts 4 are arranged in a row in the longer direction. In the bump formation part 4, many bump holes 5 are made, arranged on a square loop line and each bump hole 5 is constituted so that a bump described later is electrically connected to an inner lead described later. Four window apertures 6 formed in the form of a rectangle are made and arranged in the form of a square frame near to the four sides of the bump formation part 4.

Plural inner leads 7 are wired on one main surface (hereinafter called the lower surface) of the body 3 of the carrier so that they cross each window aperture 6 in the shorter direction. Each outer lead 8 is coupled to one end on the side of the bump formation part 4 of each inner lead 7 (hereinafter called the inner end) and the coupled inner lead 7 and outer lead 8 are mechanically and electrically integrated. A group of inner leads 7 and a group of outer leads 8 are formed by conductive material such as copper and gold. For a method of forming the group of inner leads 7 and the group of outer lead 8, there are a method of patterning copper or gold foil fixed to the body 3 of the carrier by suitable means such as welding and bonding by lithography and etching, a method of selectively plating the body 3 of the carrier with gold by lithography and others. A part opposite to the bump hole 5 of each outer lead 8 is exposed from the bump formation part 4.

Inner leads 7 are wired in parallel at a fixed interval in the longer direction of each window aperture 6. A pair of triangular notches 9 are formed on both sides of a part which crosses the window aperture 6 of each inner lead 7. That is, each inner lead 7 is constituted so that it can be readily cut in a line connecting both notches 9. In each inner lead 7, a pair of notches 9 are formed in a position biased on the reverse side (hereinafter called outside) to the bump formation part 4 from the center in the window aperture 6. That is, the length of a part 7a (hereinafter called short part) in which both notches 9 in each inner lead 7 are biased outside the window aperture 6 is shorter than that of a part 7b (hereinafter called long part) in which both notches 9 in each inner lead 7 are distant from the inner side of the window aperture 6.

An insulating film 10 made of elastomer and silicon rubber is deposited on the lower surface of the body 3 of the carrier by suitable means such as bonding, and the group of inner leads 7 and the group of outer leads 8 are covered with the insulating film 10. A rectangular window aperture 11 is made in a part opposite to each window aperture 6 of the body 3 of the carrier in the insulating film 10 so as to expose the group of inner leads 7 so that the window aperture 11 is a little larger than the window aperture 6 of the body 3 of the carrier. Therefore, the tape carrier 2 is constituted by the body 3 of the carrier, the group of inner leads 7, the group of outer leads 8 and the insulating film 10.

As shown in FIG. 13, a chip 12 is formed in the form of a flat square approximately equal to one unit of the tape carrier 2 in area and on the side of one main surface (hereinafter called active area side), desired semiconductor integrated circuits including a semiconductor device are formed. That is, in the preprocess of manufacturing IC, semiconductor integrated circuits are formed on the active area side of the chip 12 in a state of a semiconductor wafer and the chip 12 is divided in a flat square in a dicing process. The surface of the chip 12 on the active area side is coated with a passivation film 13 and an electrode pad 14 is exposed outside in an opening formed in the passivation film 13. Plural electrode pad 14 are formed and they respectively correspond to each inner lead 7 in the tape carrier 2.

The chip 12 constituted as described above is mechanically connected to the tape carrier 2 constituted as described above as shown in FIG. 13. That is, the chip 12 is arranged so that each electrode pad 14 corresponds to each inner lead 7 in the tape carrier 2, the passivation film 13 and the insulating film 10 are bonded and the chip is mechanically connected to the tape carrier. In this state, each inner lead 7 is opposite to each electrode pad 14 in a position distant upward by the thickness of the insulating film 10 and a bonding layer. In each inner lead 7, a pair of notches 9 are arranged in a position biased left from right over the electrode pad 14 and approximately the center of the long part 7b of each inner lead 7 is located over each electrode pad 14.

A bonding machine 20 shown in FIG. 12 is provided with a stage 21 and the stage 21 is constituted so that a workpiece 1 constituted as described above is horizontally held. An XY table 22 is installed next to the stage 21 and the XY table 22 is constituted so that a bonding head 23 mounted on it is moved in x- and y-directions. One end of a bonding arm 24 to the other end of which a bonding tool 25 is attached is supported by the bonding head 23 and the bonding head 23 is constituted so that the bonding tool 25 is lifted or lowered by operating the bonding arm 24. A position detecting sensor 26 is attached to the bonding arm 24, detects the position of the bonding arm 24 and sends the detected position to a main controller described later.

A controller 27 for controlling the operation of the XY table and the bonding head (hereinafter called operating controller) is connected to the XY table 22 and the bonding head 23 and a controller 28 for instructing operation (hereinafter called main controller) is connected to the operating controller 27. A display 29, a keyboard 29A and a buzzer 29B as an alarm are connected to the main controller 28.

Next, referring to FIG. 11, a bonding method equivalent to an embodiment of the present invention by the bonding machine constituted as described above will be described.

Figure 11A:
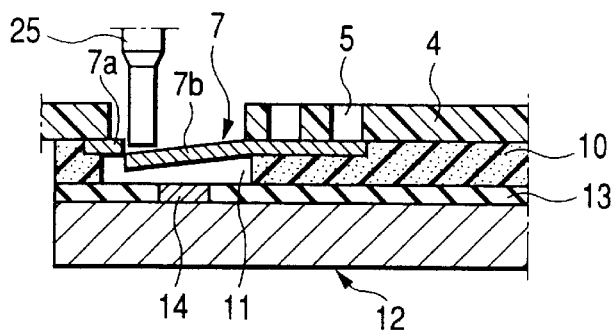
FIGS. 11(a) to (e) show the bonding method equivalent to the embodiment of the present invention.

As shown in FIG. 11(a), when the bonding tool 25 pushes down a part near to the notches 9 in the long part 7b of the inner lead 7, the inner lead 7 is cut in a line connecting both notches 9. In this case, when the bonding tool 25 is lowered so that it approaches the electrode pad diagonally from a position distant from the above pad 14, cuts the part of the notches of the lead and is further diagonally lowered, the bonding tool can securely hold the lead also after cutting. If the bonding tool pushes down a part 7a of the lead on the reverse side of the notches when the bonding tool is diagonally lowered similarly, the absorption of stress by the looseness of the lead is small and the lead may be smoothly cut.

Figure 11B:
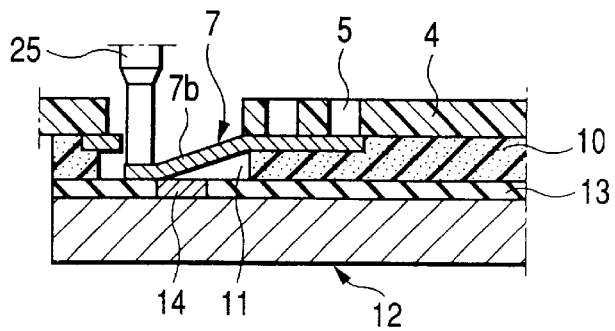

As shown in FIG. 11(b), the cut piece in the long part 7b of the inner lead 7 is pushed down by further lowering the bonding tool 25 and touched to the upper surface of the chip 12.

It is judged in the main controller 28 by analyzing positional data from the position detecting sensor 26 whether the bonding tool 25 reaches the upper surface of the chip 12 via the inner lead 7 or not. If the bonding tool 25 is judged to be not touched to the upper surface of the chip 12, the main controller 28 operates the buzzer 29B and instructs the display 29 to display the contents of the alarm. Next, the bonding tool 25 is gradually lowered by manual operation by an operator via the keyboard 29A or automatic instruction control by the main controller 28 and touched to the upper surface of the chip 12 via the inner lead 7.

If the bonding tool 25 is judged to be touched to the upper surface of the chip 12 via the inner lead 7, the main controller 28 reads positional data from the position detecting sensor 26 when the bonding tool reaches the upper surface of the chip and measures a height in which the bonding tool reaches the upper surface of the chip 12 via the inner lead.

Figure 11C:
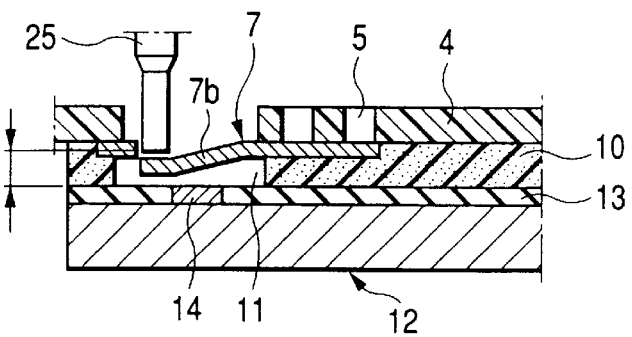

The main controller 28 which finishes the measurement of the height of the bonding tool 25 lifts the bonding tool 25 by a predetermined height H as shown in FIG. 11(c). An optimum value of the predetermined height H corresponding to each bonding condition is acquired by an empirical method such as an experiment, simulation by a computer and past proven data and stored in the main controller 28 via the keyboard 29A beforehand. The main controller 28 instructs a predetermined height H to the operating controller 27. The operating controller 27 lifts the bonding tool 25 by the predetermined height H by controlling the bonding head 23 and oscillating the bonding arm 24.

When the bonding tool 25 is lifted by the predetermined height H, the cut piece in the long part 7b of the inner lead 7 is a little lifted by the spring back of the inner lead 7 from the upper surface of the chip 12 as shown in FIG. 11(c). In a state in which the cut piece in the long part 7b of the inner lead 7 is lifted from the chip 12, the bonding tool 25 lifted by the predetermined height H is distant from the upper surface of the cut piece in the long part 7b of the inner lead 7.

Figure 11D:
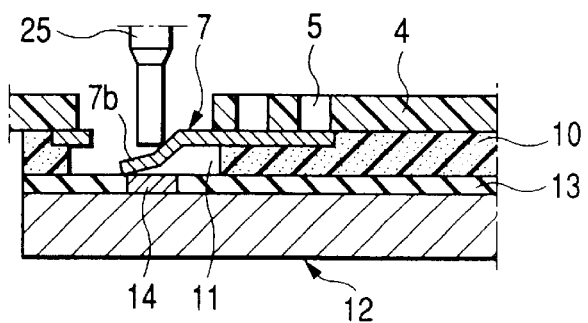

Next, as shown in FIG. 11(d), the bonding tool 25 is moved in parallel as far as over the electrode pad 14 in the direction of the bump formation part 4 with the bonding tool maintained at the height as it is. As the cut piece in the long part 7b of the inner lead 7 is shifted in the direction of the bump formation part 4 by the bonding tool 25 and is pushed diagonally downward as the bonding tool is moved in parallel, the cut piece is in a predetermined looped form and the lower surface of the end is touched to the upper surface of the electrode pad 14.

Figure 11E:
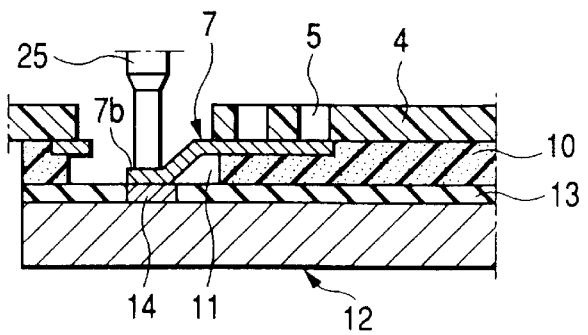

Next, as shown in FIG. 11(e), the bonding tool 25 is lowered and pushes the cut piece in the long part 7b of the inner lead 7 down. The end on the side of the cut end of the cut piece in the long part 7b of the inner lead 7 is pressed on the electrode pad 14 with the end forming a predetermined looped form by the above pushing down. The bonding tool 25 presses the end on the side of the cut end of the cut piece in the long part 7b of the inner lead 7 on the electrode pad 14 and bonds them by thermocompression by applying heat and ultrasonic energy. That is, the inner lead 7 is bonded to the electrode pad 14 by the bonding tool 25.

Afterward, the chip 12 is electrically connected to the tape carrier 2 by repeating the above bonding operation every inner lead 7. Before the inner lead 7 is bonded to the electrode pad 14 of the chip 12 by the bonding tool 25 in bonding every inner lead 7, a height from the electrode pad 14 in the chip 12 to the bonding tool 25 is measured without omission and bonding by the bonding tool 25 is executed under an optimum condition corresponding to the measured height. Therefore, for example, even if an error in an interval between the inner lead 7 bonded successively by the bonding tool 25 and the electrode pad 14 occurs because the chip 12 mechanically connected via the insulating film 10 under the bump formation part 4 is tilted, the looped form of each inner lead 7 after bonding is suitably formed because bonding by the bonding tool 25 is executed under an optimum condition corresponding to the above error every inner lead 7.

When the above bonding of all inner leads 7 is finished, the group of inner leads 7 is sealed by a resin sealed part 15 by potting insulating material such as elastomer and silicon rubber inside each window aperture 6 of the tape carrier 2 as shown in FIG. 14.

Next, a bump 16 protruded from the upper surface of the bump formation part 4 is formed on the tape carrier 2 as shown in FIG. 14 by soldering a solder ball in a part exposed at the bottom of the bump hole 5 of each outer lead 8 in the tape carrier 2. As described above, µBGA·IC 17 shown in FIG. 14 is manufactured.

According to the above embodiment, the following effect is obtained:

(1) As each inner lead 7 can be bonded to each electrode pad 14 with each inner lead in a suitable looped form by successively measuring a height from the electrode pad 14 in the chip 12 to the bonding tool 25 and executing bonding by the bonding tool 25 under an optimum condition corresponding to each measured height before the inner lead 7 is bonded to the electrode pad 14 in the chip 12 by the bonding tool 25 in bonding the inner lead 7 to the electrode pad 14 by the bonding tool 25, the quality, the reliability, and the yield of µBGA·IC 17 can be enhanced.

(2) For example, as bonding by the bonding tool 25 is executed under an optimum condition corresponding to the following error every inner lead 7 even if an error in an interval between the inner lead 7 successively bonded by the bonding tool 25 and the electrode pad 14 occurs because the chip 12 mechanically connected under the bump formation part 4 via the insulating film 10 is tilted, the looped form of each inner lead 7 after bonding can be suitably formed.

(3) As bonding operation can be completed on the same stage by continuously executing the measurement of a height and bonding after the measurement by a series of operation of the same bonding tool 25, time required for bonding operation can be reduced and the structure of the bonding machine can be simplified.

The present invention made by the inventor is described above concretely based upon the above embodiments, however, the present invention is not limited to the above embodiments and it goes without saying that variations may be allowed in a range in which the outline is unchanged.

For example, a height is not always measured every inner lead and a height may also be measured by touching a bonding tool in at least three places on the upper surface which is a plain face including the group of electrode pads of a chip and acquiring the degree of parallelism.

A height is measured not only by touching a bonding tool to the upper surface which is a plain face including the group of electrode pads of a chip but it may also be measured by using a non-contact type sensor such as laser beam distance measuring equipment. Measurement by a non-contact type sensor may also be executed online and offline.

A bonding method of electrically connecting each inner lead to each electrode pad is not limited to an ultrasonic thermocompression bonding method, and a pressure welding method, an eutectic method, and the like may also be used.

A bonding machine for executing bonding is not limited to a bonding machine constituted for only single point bonding and an existing wire bonding machine may also be utilized.

The body of a carrier which is a carrier for the group of inner leads and the group of outer leads is constituted not only by a tape but it may also be constituted by a rigid substrate formed by an insulating resin film, ceramics or insulating material such as resin.

A case in which the present invention made by the inventor is applied to the method of manufacturing µBGA·IC is mainly described above, however, the present invention is not limited to it and can be applied to the whole bonding technology used for a method of manufacturing CSP·IC and the like.

Third Embodiment

Figure 15:
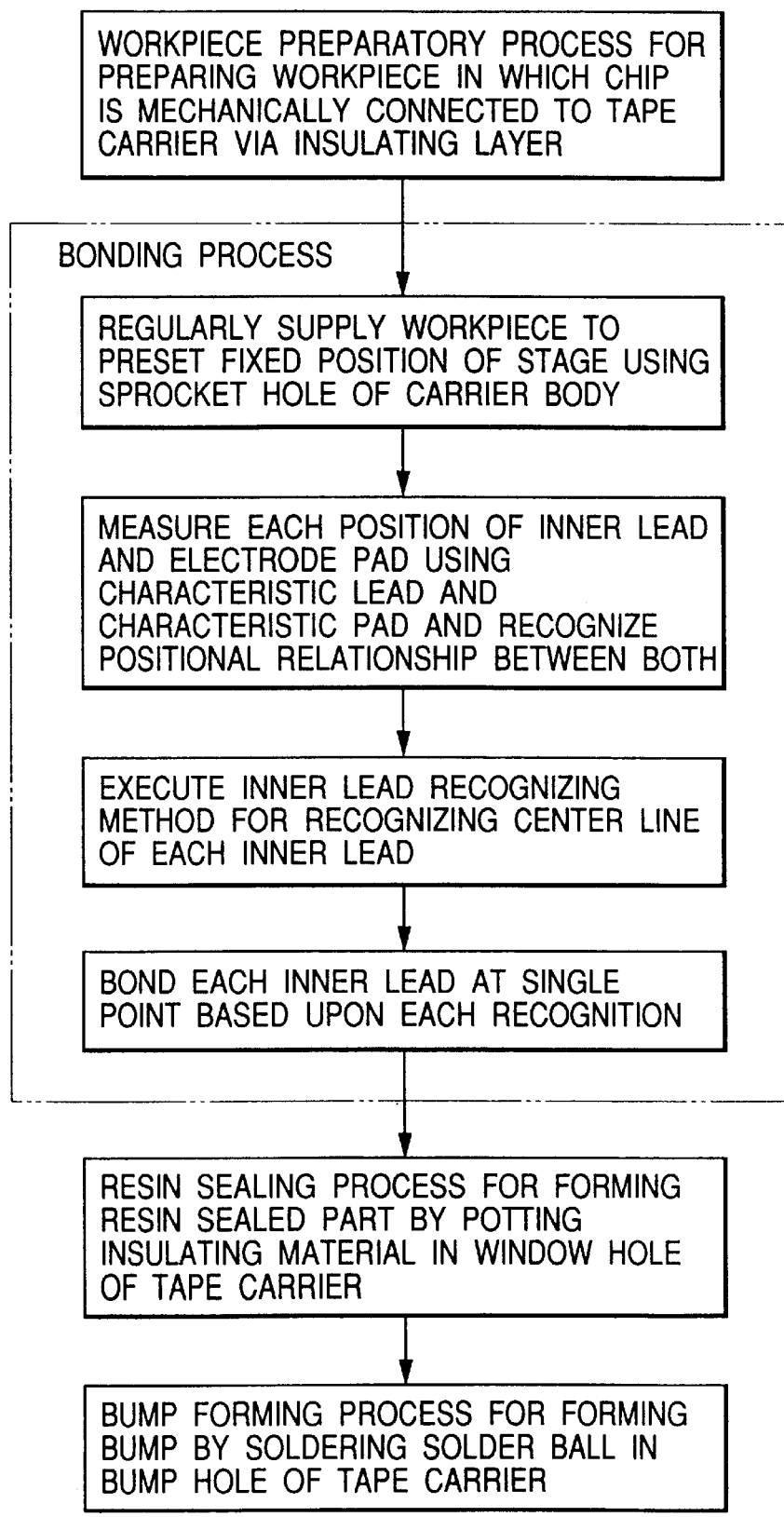
FIG. 15 is a flowchart showing a method of manufacturing $\mu$BGA·IC equivalent to an embodiment of the present invention.
Figure 16:
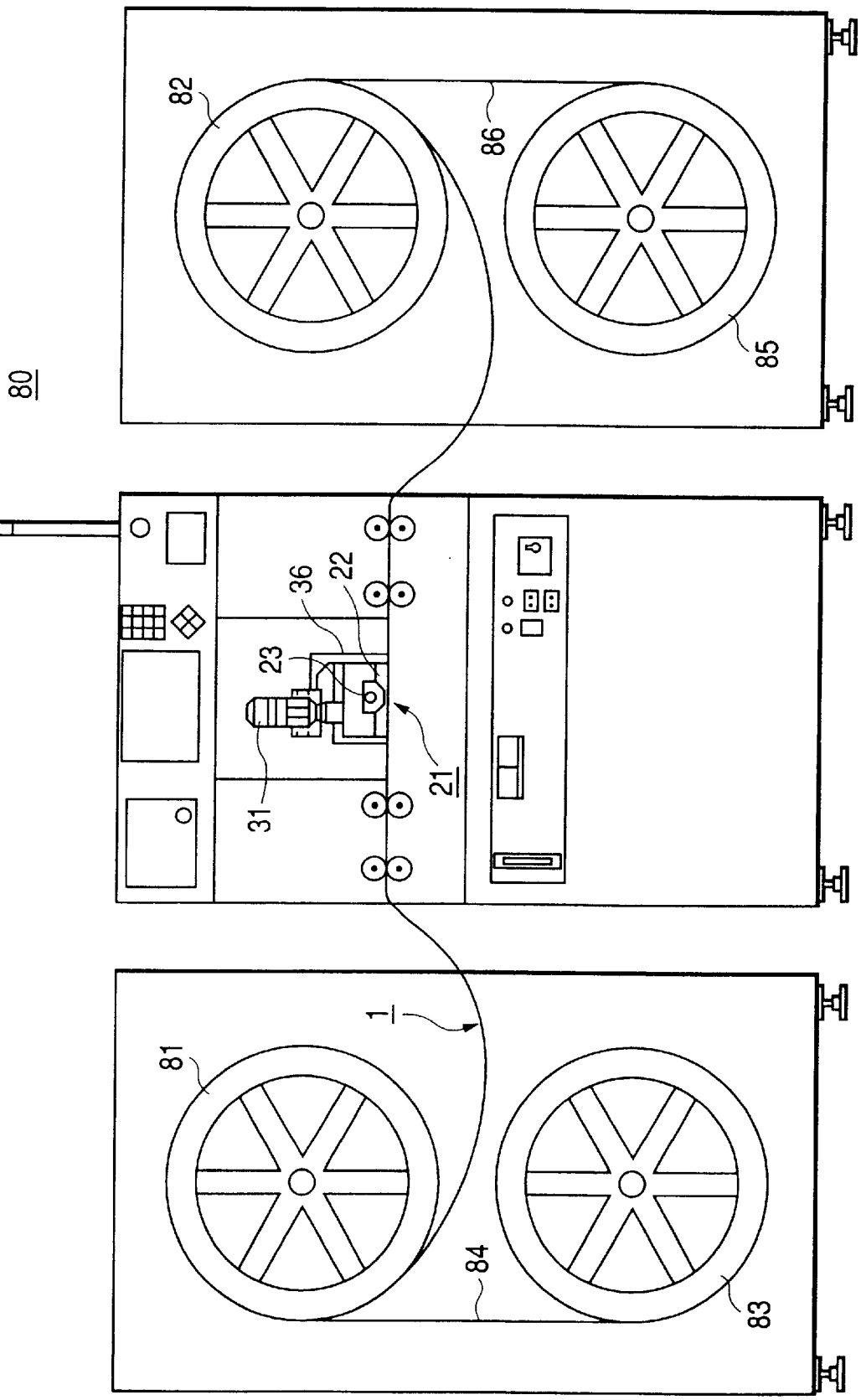
FIG. 16 is a front view showing a bonding machine used for the above method.
Figure 17:
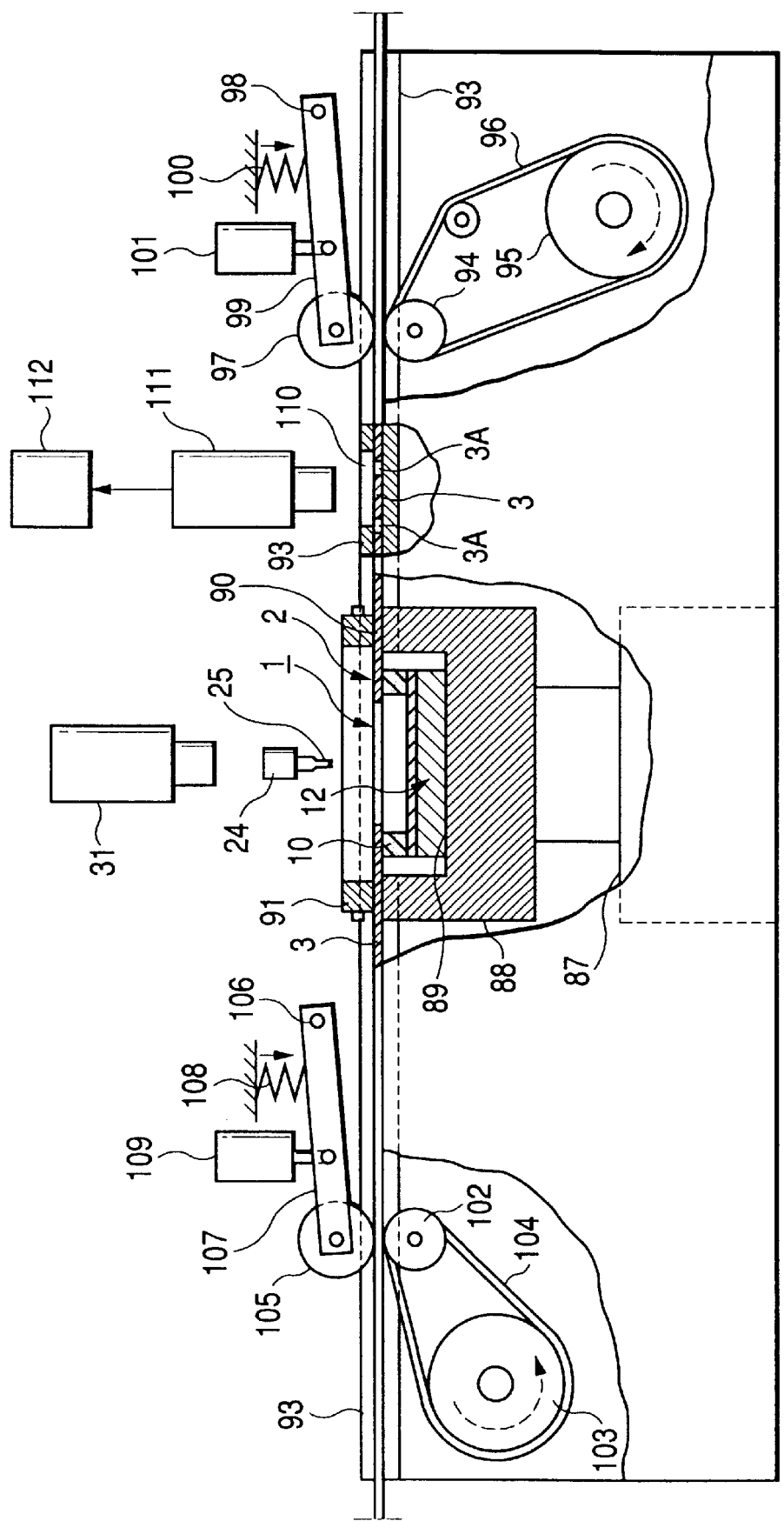
FIG. 17 is a front view a part of which is a sectional view showing the main part.
Figure 18:
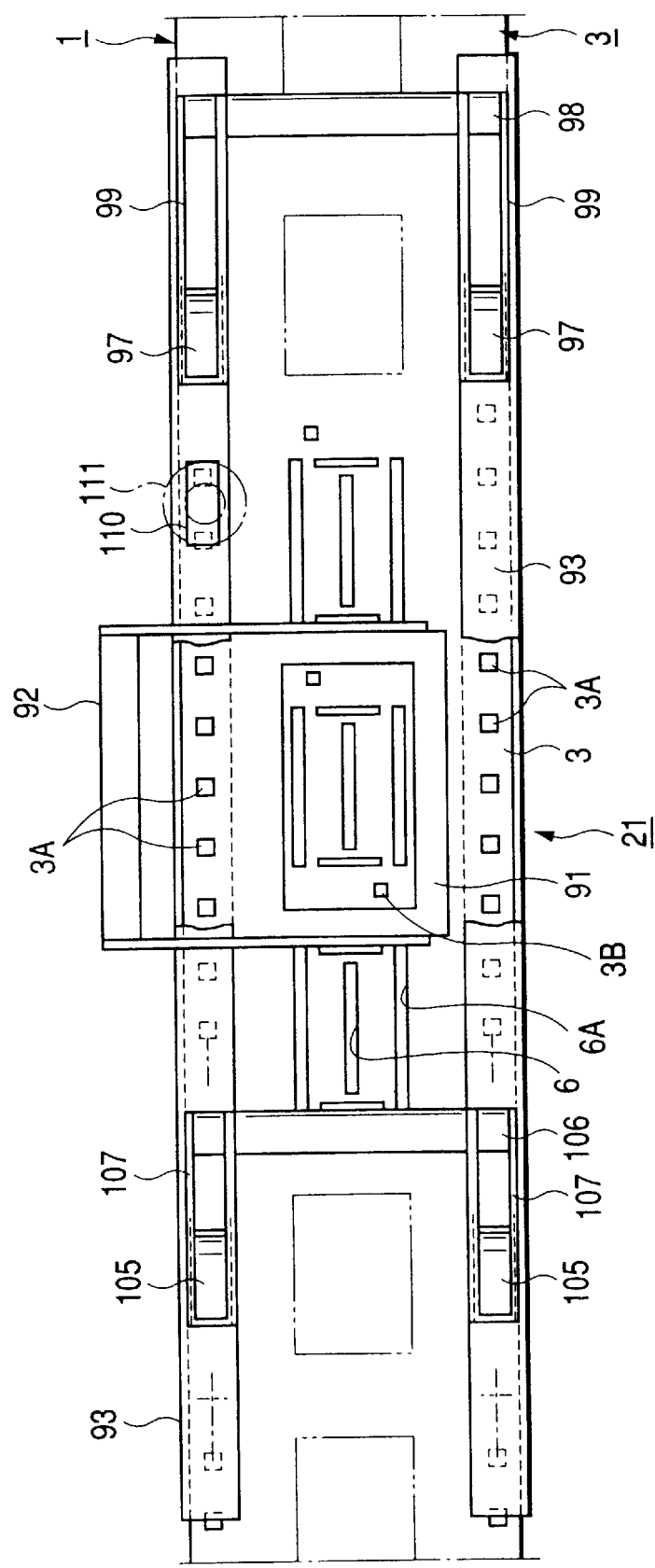
FIG. 18 is a plan showing the main part.
Figure 19:
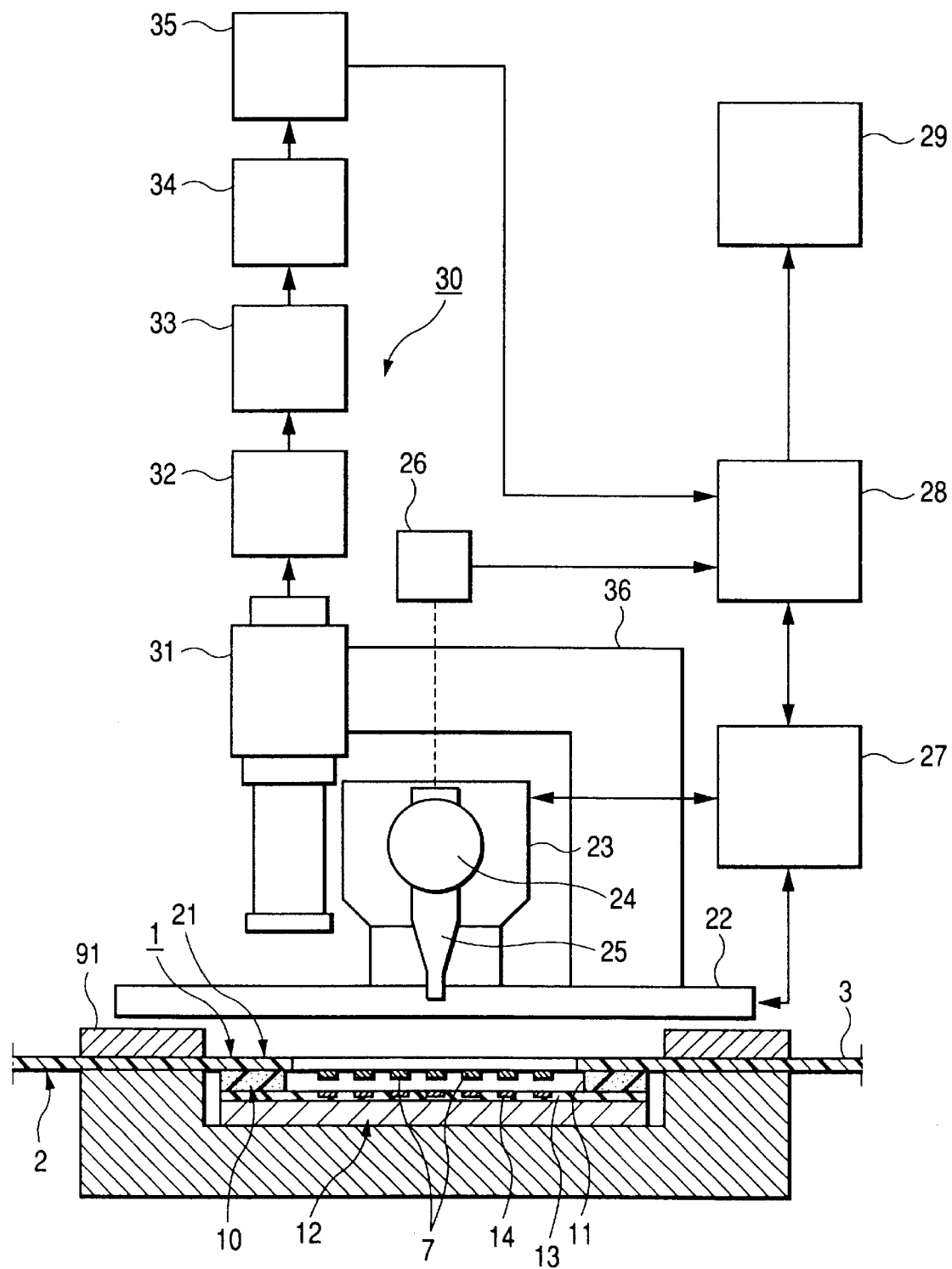
FIG. 19 is a front view apart of which is a sectional view showing the main part including a block diagram.
Figure 20:
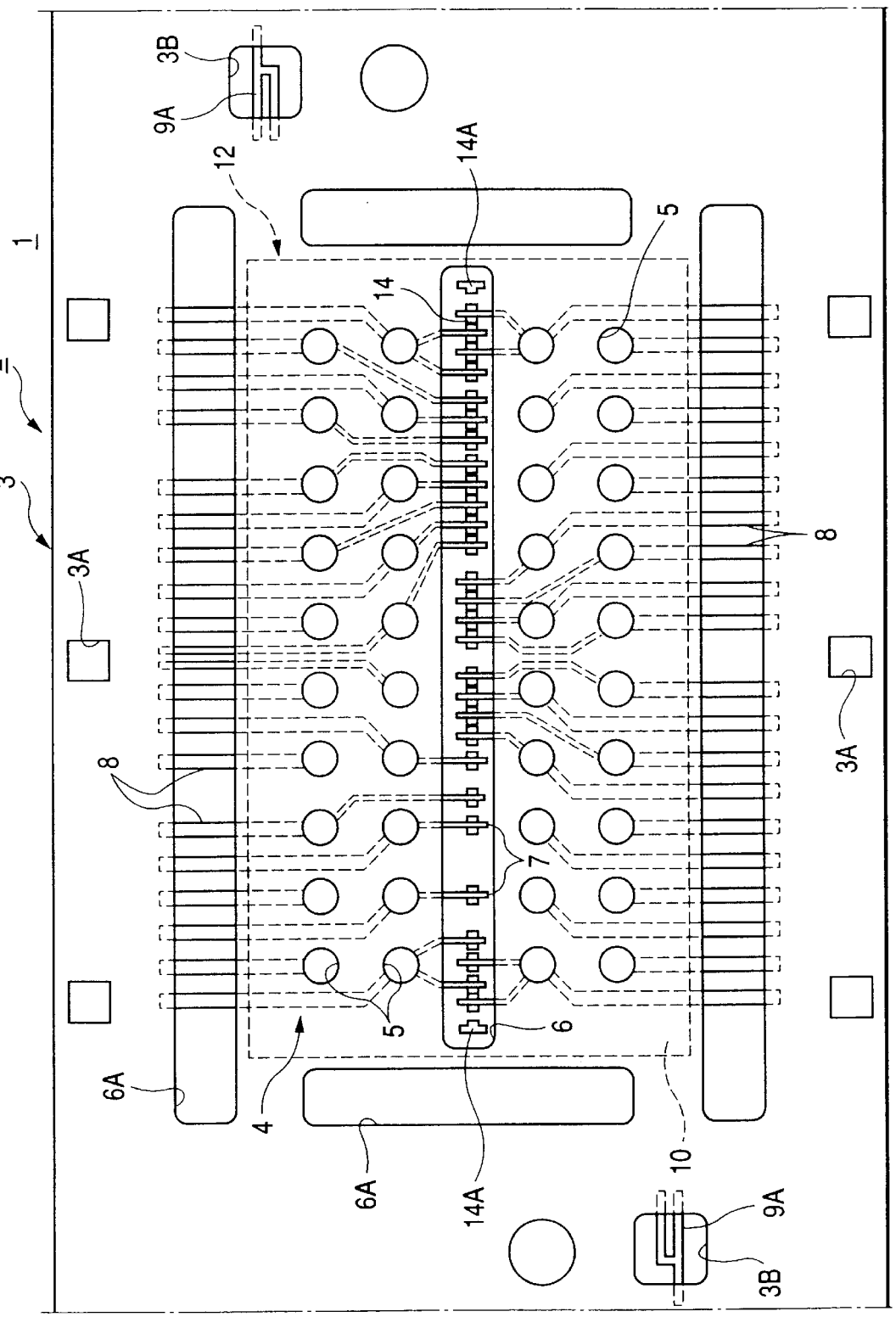
FIG. 20 is a plan showing a workpiece and omitting a part.
Figure 22A:
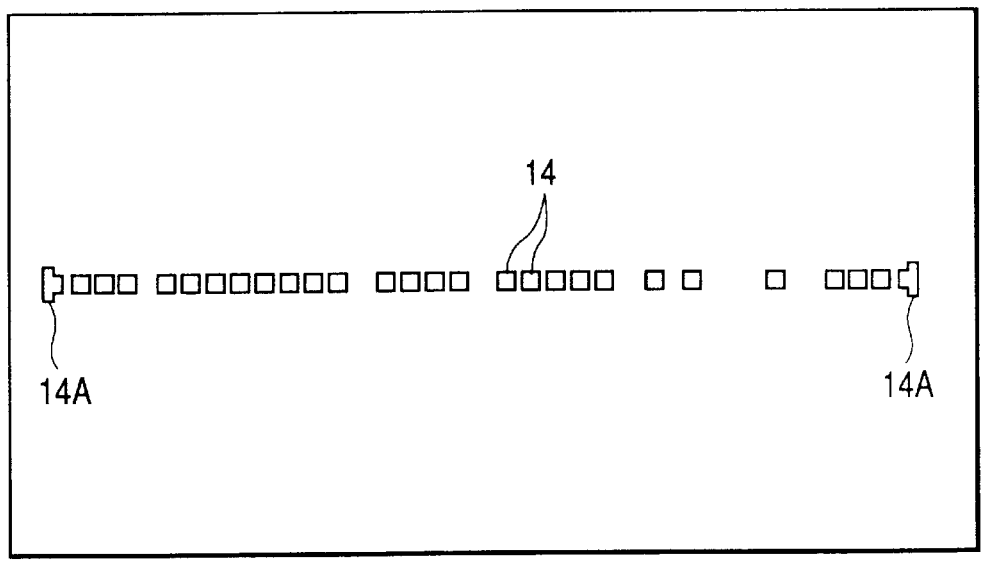
FIGS. 22(a) to (c) show a chip.
Figure 22B:
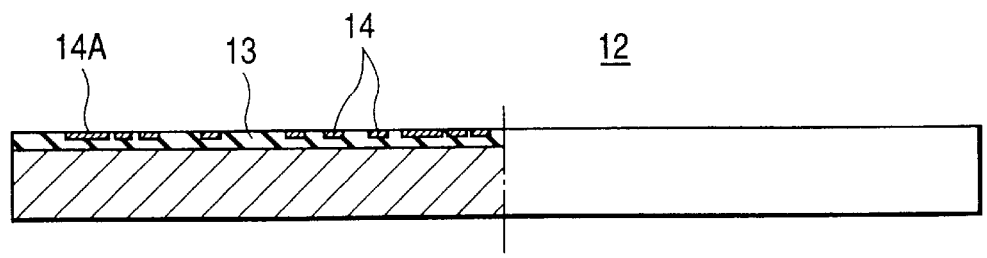
Figure 22C:
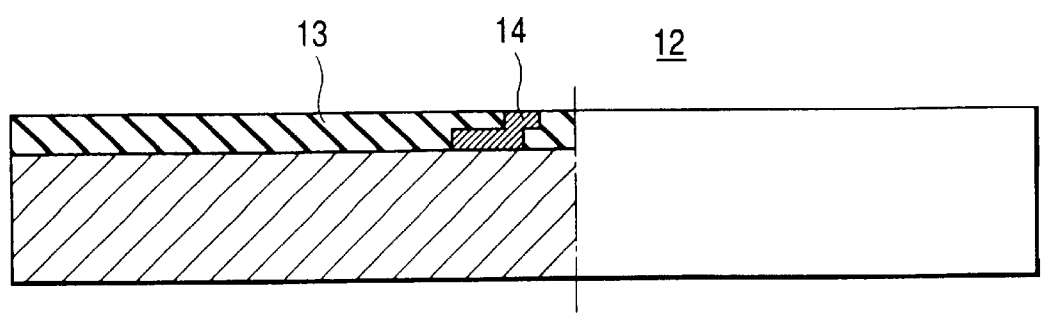

FIG. 15 is a flowchart showing a method of manufacturing µBGA·IC equivalent to an embodiment of the present invention. FIG. 16 is a front view showing a bonding machine used for the above method. FIG. 17 is a partial sectional front view showing the main part. FIG. 18 is a plan showing the above main part. FIG. 19 is a partial sectional front view including the block diagram of the above main part. FIG. 20 is a plan omitting a part showing a workpiece. FIG. 21(a) is a partial sectional front view showing the workpiece and FIG. 21(b) is a partial sectional side view showing the workpiece. FIGS. 22(a) to (c) show a chip, FIG. 22(a) is a plan, FIG. 22 (b) is a partial sectional front view, and FIG. 22(c) is an enlarged partial sectional side view.

Figure 23:
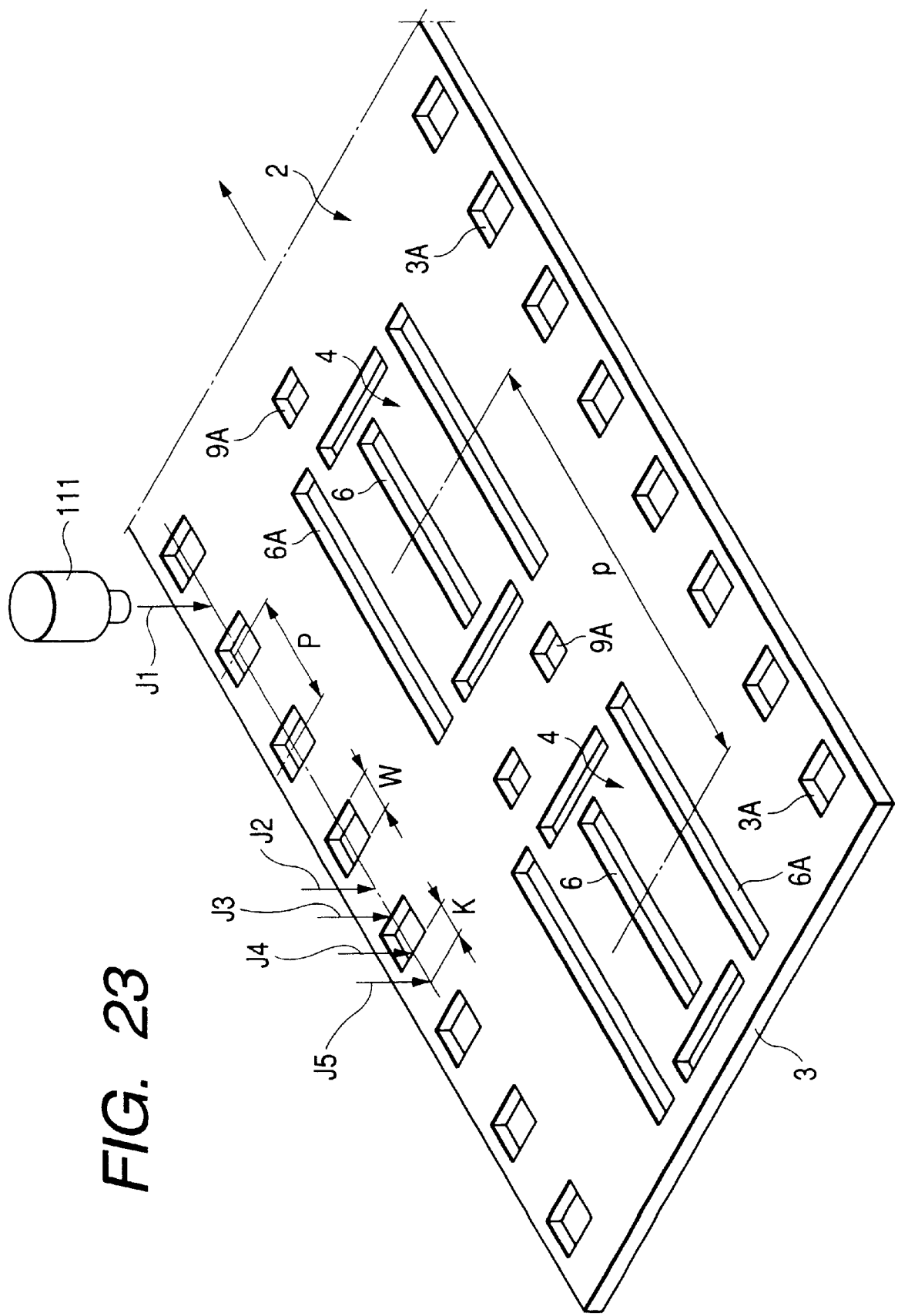
FIG. 23 is a perspective view showing a method of supplying a workpiece to a state and positioning it.
Figure 24A:
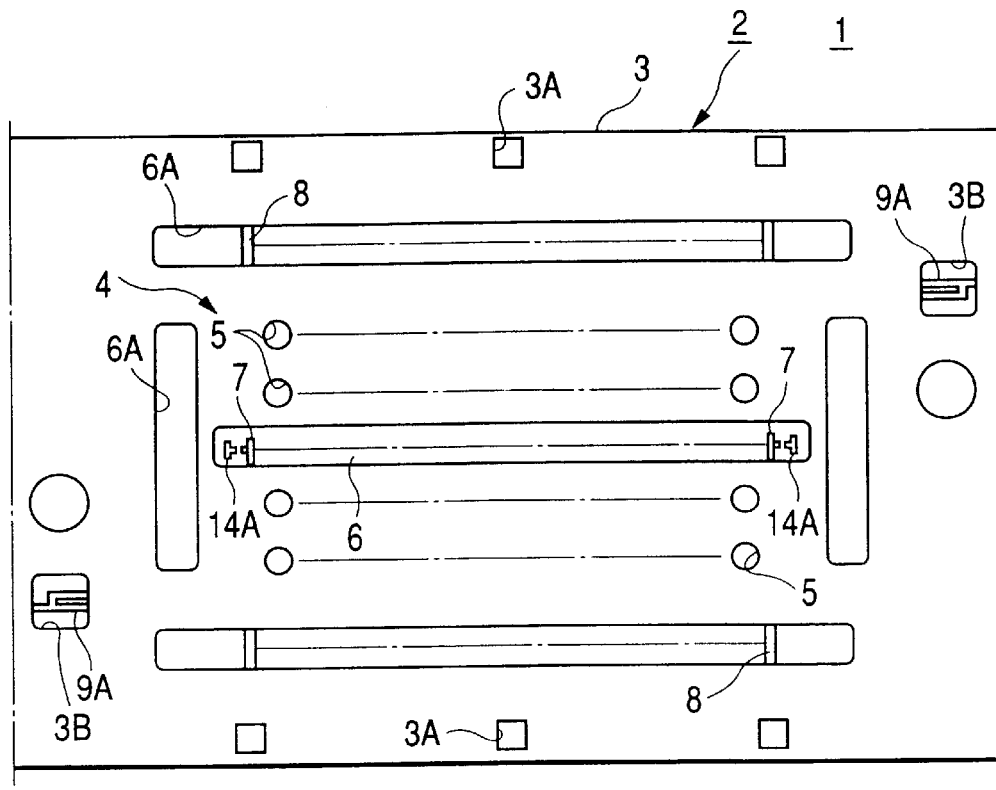
FIGS. 24(a) to (c) are explanatory drawings for explaining a method of measuring positional relationship between an inner lead and an electrode pad.
Figure 24B:
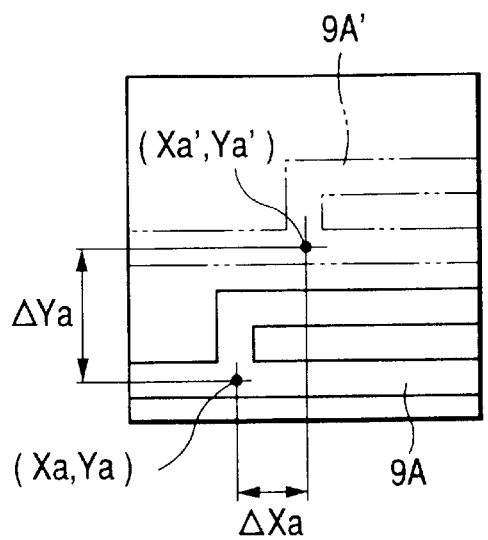
Figure 24C:
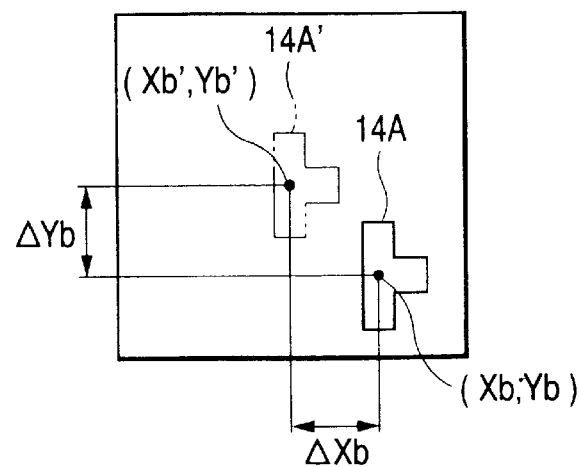
Figure 25A:
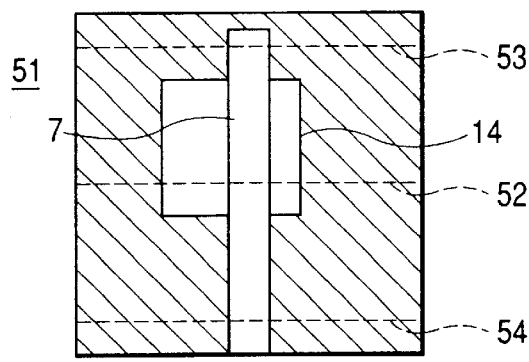
FIGS. 25(a) to (f) are explanatory drawings for explaining each process of the inner lead recognition method.

FIG. 23 is a perspective view showing the supply of the workpiece to a stage and a positioning method. FIGS. 24(a) to (c) are explanatory drawings for explaining a method of measuring positional relationship between each inner lead and each electrode pad, FIG. 24(a) shows a screen displaying the whole workpiece, FIG. 24(b) shows a screen displaying a step for measuring a feature lead, and FIG. 24(c) shows a screen displaying a step for measuring a feature pad. FIGS. 25(a) to (f) are explanatory drawings for explaining each process in an inner lead recognition method. FIGS. 26(a) to (c) are explanatory drawings for explaining each process in a bonding method.

In this embodiment, a method of manufacturing a semiconductor integrated circuit according to the present invention is constituted as a method of manufacturing IC provided with μBGA (hereinafter called μBGA·IC) and a bonding process which is a main process in the method of manufacturing μBGA·IC is executed by a bonding machine shown in FIGS. 16 to 19.

As shown in FIG. 15, in the method of manufacturing μBGA·IC, a workpiece shown in FIGS. 20 and 21 is prepared in a workpiece preparing process and supplied to a bonding process in which the bonding method is executed. That is, the workpiece 1 supplied to the bonding process is constituted as shown in FIGS. 20 and 21. In the workpiece 1, a chip is mechanically connected to a tape carrier via an insulating layer. The tape carrier 2 as a carrier is equivalent to a tape automated bonding (TAB) tape used in a method of manufacturing IC provided with a tape carrier package (TCP·IC). As the tape carrier 2 is constituted so that the same pattern is repeated in the longer direction, only one unit is described and shown.

The tape carrier 2 is provided with the body 3 of the carrier made of resin which is an insulator such as polyimide in which the same patterns are integrated with a tape which continues in the longer direction and in the body 3 of the carrier, bump formation parts 4 are arranged in a row in the longer direction. In the bump formation part 4, many bump holes 5 are made, arranged on four parallel lines and each bump hole 5 is constituted so that a bump described later is electrically connected to an outer lead described later. A window aperture 6 formed in the form of a rectangle are made in parallel with each row of the bump holes 5 on the center line of the bump formation part 4. Four long holes 6A for assisting cutting are made in the periphery of the bump formation part 4 in the form of a rectangular frame.

Plural inner leads 7 are wired on one main surface (hereinafter called the lower surface) of the body 3 of the carrier so that the plural inner leads cross each window aperture 6 in the shorter direction. Each outer lead 8 is coupled to one end on the side of the bump formation part 4 of each inner lead 7 (hereinafter called the outer end) and the coupled inner lead 7 and outer lead 8 are mechanically and electrically integrated. A part opposite to the bump hole 5 of each outer lead 8 is exposed from the bump formation part 4 and the outer end of each outer lead 8 is extended to the outside of the long hole 6A. The group of inner leads 7 and the group of outer leads 8 are formed by conductive material such as copper and gold. For a method of forming the group of inner leads 7 and the group of outer lead 8, there are a method of patterning copper or gold foil fixed to the body 3 of the carrier by suitable means such as welding and bonding by lithography and etching, a method of selectively plating the body 3 of the carrier with gold by lithography and others.

Inner leads 7 are wired in parallel at a fixed interval in the longer direction of each window aperture 6. A part protruded into the window aperture 6 of each inner lead 7 is cut in a position in which the part crosses the center line of the window aperture 6. That is, the length of the part protruded into the window aperture 6 of each inner lead 7 is set so that the above length is shorter than the width of the window aperture 6 and longer than a half of the width.

Multiple sprocket holes 3A (hereinafter called holes) as a regular part arranged regularly are made and arranged on both sides of the body 3 of the carrier at an equal interval in longer direction and each hole 3A is formed in the form of a square. A pair of feature lead display holes 3B (hereinafter called display holes) for displaying each lead 9A as a characteristic part (hereinafter called feature lead) are respectively made on both sides of the group of outer leads 8 in the body 3 of the carrier in a diagonal position and each display hole 3B is formed in the form of a square. The feature lead 9A is respectively formed on the lower surface of the body 3 of the carrier of each display hole 3B, each feature lead 9A is formed in the form of approximately a letter h to distinguish an inner lead 7 and an outer lead 8 and arranged sideways.

An insulating film 10 made of elastomer and silicon rubber is deposited on the lower surface of the body 3 of the carrier by suitable means such as bonding, and the group of inner leads 7 and the group of outer leads 8 are covered with the insulating film 10. A rectangular window aperture 11 is made in a part opposite to the window aperture 6 of the body 3 of the carrier in the insulating film 10 so as to expose the group of inner leads 7 so that the window aperture 11 is a little larger than the window aperture 6 of the body 3 of the carrier. Therefore, the tape carrier 2 is constituted by the body 3 of the carrier, the group of inner leads 7, the group of outer leads 8, and the insulating film 10.

As shown in FIG. 22, a chip 12 is formed in the form of a flat rectangle and desired semiconductor integrated circuits including a semiconductor device are formed on the side of one main surface (hereinafter called the active area side). That is, in the preprocess of manufacturing IC, semiconductor integrated circuits are formed on the active area side of the chip 12 in a state of a semiconductor wafer and the chip 12 is divided in a flat rectangle in a dicing process. The surface of the chip 12 on the active area side is coated with a passivation film 13 and an electrode pad 14 is exposed outside in an opening formed in the passivation film 13. Plural electrode pad 14 are formed and they respectively correspond to each inner lead 7 in the tape carrier 2. A pair of pads 14A as a characteristic part (hereinafter called feature pads) are respectively formed on both sides of a group of electrode pads 14 and each feature pad 14A is formed in the form of T to distinguish from the electrode pad 14.

The chip 12 is mechanically connected to the tape carrier 2 in the workpiece 1 as shown in FIGS. 20 and 21. That is, the chip 12 is arranged so that each electrode pad 14 corresponds to each inner lead 7 in the tape carrier 2, the passivation film 13 and the insulating film 10 are bonded and the chip is mechanically connected to the tape carrier. In this state, each inner lead 7 is opposite to each electrode pad 14 in a position distant upward by the thickness of the insulating film 10 and a bonding layer, and the end of the inner lead 7 is located over the electrode pad 14.

As shown in FIG. 16, a bonding machine 80 is provided with a stage 21 and the stage 21 is constituted so that a workpiece 1 constituted as described above is horizontally held. As shown in FIG. 19, an XY table 22 is installed next to the stage 21 and the XY table 22 is constituted so that a bonding head 23 mounted on it is moved in x- and y-directions. One end of a bonding arm 24 to the other end of which a bonding tool 25 is attached is supported by the bonding head 23 and the bonding head 23 is constituted so that the bonding tool 25 is lifted or lowered by operating the bonding arm 24. A position detecting sensor 26 is attached to the bonding arm 24 and connected to a main controller described later. A controller 27 for controlling the operation of the XY table 22 and the bonding head 23 (hereinafter called operating controller) is connected to the XY table 22 and the bonding head 23 and a controller 28 for instructing operation (hereinafter called main controller) is connected to the operating controller 27. A display 29 is connected to the main controller 28.

An industrial television camera 31 (hereinafter called camera) as an image capturing device for constituting an inner lead recognizing apparatus 30 is attached to the XY table 22 via a stand 36 and the camera 31 photographs the workpiece 1 on the stage 21. An inner lead recognizing measuring line setting section 32 (hereinafter called setting section) for setting a measuring line for recognizing an inner lead is connected to the camera 31 and a luminance measuring section 33 is connected to the setting section 32. A forming section 34 for forming an added luminance distribution waveform is connected to the luminance measuring section 33 and a judging section 35 for judging the center line of an inner lead is connected to the forming section 34. The judging section 35 is connected to the main controller 28 to send the result of the judgment to the main controller 28.

As shown in FIG. 16, the bonding machine 80 is provided with a loading reel 81 and an unloading reel 82 for carrying the workpiece 1 and the workpiece 1 is extended between the loading reel 81 and the unloading reel 82. A spacer tape winding reel 83 is supported under the loading reel 81 and the spacer tape winding reel 83 is constituted so that a spacer tape 84 after the loading reel 81 lets out the workpiece is wound. A spacer tape supply reel 85 is supported under the unloading reel 82 and the space tape supply reel 85 is constituted so that a spacer tape 86 is supplied when the unloading reel 82 winds the workpiece 1.

As shown in FIGS. 17 and 18, a heat block 88 lifted or lowered by a lifting/lowering driver 87 is equipped in a place in which the stage 21 of the bonding machine 80 is set and a concave portion 89 is provided to the upper surface of the heat block 88 to house the chip 12 of the workpiece 1. A lower presser foot 90 is formed by the outer part of the concave portion 89 in the upper face of the heat block 88. An upper presser foot 91 formed in the form of a rectangle which has the same form as that of the lower presser foot 90 is equipped over the heat block 88 and the upper presser foot 91 is supported by a rotary actuator 92 so that the upper presser foot is reciprocated in a vertical direction. The upper presser foot 91 fixes the workpiece 1 on the stage 21 by being turned to the lower side and pressing the periphery of the chip 12 in the workpiece 1 upon the lower presser foot 90.

A pair of front and rear guide rails 93 are laid in parallel horizontally crosswise at both (hereinafter called front and rear) ends of the workpiece 1 in the bonding machine 80. The workpiece 1 is horizontally guided by both guide rails 93 at both ends of the body 3 of the carrier in which the holes 3A are arranged with a group of holes 3A put between both guide rails 93 so that the workpiece can be slid and sent from the side of the loading reel 81 to the direction of the unloading reel 82.

A pair of front and rear feed rollers 94 are supported in a position distant from the stage 21 on the right side of both guide rails 93 with the feed rollers in contact with the respective lower surfaces of both ends of the body 3 of the carrier so that the feed rollers can be rotated and a belt 96 driven by a feed motor 95 is wound on both feed rollers 94. A pair of front and rear press rollers 97 are arranged on the upper side of both feed rollers 94 via the body 3 of the carrier with the body 3 of the carrier put between each press roller 97 and each feed roller 94, and both press rollers 97 are supported so that they can be rotated by one end of an arm 99 the other end of which is supported by a pin 98 so that the other end can be turned in a vertical direction. A spring 100 is fitted in a position near the pin 98 of the arm 99 so that the spring presses the arm 99 downward and an electromagnetic plunger 101 is fitted in a position closer the press roller 97 than to the spring 100 of the arm 99 so that the electromagnetic plunger vertically moves the arm 99.

A pair of front and rear back tension rollers 102 are supported in a position distant left from the stage 21 of both guide rails 93 with the back tension rollers in contact with the respective lower surfaces of both ends of the body 3 of the carrier so that the back tension rollers can be rotated and a belt 104 driven by a back tension motor 103 is respectively wound on both back tension rollers 102. A pair of front and rear press rollers 105 are arranged on the upper side of the both back tension rollers 102 via the body 3 of the carrier with the body 3 of the carrier put between each press roller 105 and each back tension roller 102 and both press rollers 105 are supported so that both press rollers can be rotated by one end of an arm 107 the other end of which is supported by a pin 106 so that the arm can be turned in a vertical direction. A spring 108 is fitted in a position near the pin 106 of the arm 107 so that the spring presses the arm 107 downward and an electromagnetic plunger 109 is fitted in a position closer the press roller 105 than to the spring 108 of the arm 107 so that the electromagnetic plunger 109 vertically moves the arm 107.

A hole inspection hole 110 is made in a position distant right from the stage 21 of the rear guide rail 93 in the form of a rectangle larger than the hole 3A made on the body 3 of the carrier and a photosensor 111 as a hole detecting device is equipped over the hole inspection hole 110 with the photosensor supported by a stand and the like. The photosensor 111 is constituted so that it detects the hole 3A via the hole inspection hole 110. A workpiece position controller 112 for controlling the position of the workpiece 1 based upon the passage of the hole 3A is connected to the photosensor 111 and the controller 112 is constituted so that it controls the feed motor 95, the back tension motor 103 and the electromagnetic plungers 101 and 109 as described later.

A bonding method by the bonding machine constituted as described above will be described below.

First, a method of supplying a workpiece to the stage and positioning it on the stage will be described. In the description, an interval p (one pitch) between adjacent chips 12 in the carrier 2 are assumed to be set to a dimension equivalent to four holes 3A including respective intervals in the carrier 2 as shown in FIG. 23.

As the arm 99 is turned downward by the spring 100 as shown in FIG. 17 when the electromagnetic plunger 101 on the feeding side is extended and operated according to a preset sequence in a state shown in FIG. 16, the press roller 97 holds the body 3 of the carrier between the press roller and the feed roller 94 by force by the spring 100. Simultaneously, as the arm 107 is turned upward according to the force of the spring 108 when the electromagnetic plunger 109 on the side of back tension is reduced, the press roller 105 releases a state in which the body 3 of the carrier is held between the press roller and the back tension roller 102. Next, when the feed roller 94 is rotated by the feed motor 95 according to a preset sequence, the body 3 of the carrier held between the feed roller 94 and the press roller 97 is fed from the side of the loading reel 81 to the side of the unloading reel 82.

When the carrier 2 is fed by three pitches in pitch P between adjacent holes 3A by the above feed, the position of the photosensor 111 is relatively moved from a feed start position J1 to a second position J2. At this time, as the feed roller 94 and the press roller 97 are respectively slid, the second position J2 is unsettled.

When the carrier 2 is fed by the feed motor 95 by two pitches (2×P) in pitch P between adjacent holes 3A, the electromagnetic plunger 109 on the side of back tension is extended and operated according to a preset sequence. As the arm 107 is turned downward by the force of the spring 108 when the electromagnetic plunger 109 on the side of back tension is extended, the press roller 105 holds the body 3 of the carrier between the press roller and the back tension roller 102 by the force of the spring 108. Next, when the back tension roller 102 is rotated by the back tension motor 103, the body 3 of the carrier held between the back tension roller 102 and the press roller 105 is pulled from the side of the loading reel 81 to the side of the unloading reel 82. Hereby, the looseness of the carrier 2 is removed.

Next, the feed motor 95 is operated to feed the carrier 2 by one pitch (1×P) in pitch between adjacent holes 3A. According to the above feed, the position of the photosensor 111 is relatively moved to the third position J3, the fourth position J4 and the fifth position J5 as shown in FIG. 23. However, when the photosensor 111 detects the edge of the opening on the upstream side of the hole 3A while the photosensor passes the third position J3, it stops the feed motor 95. When the feed motor 95 is stopped, the photosensor 111 is relatively stopped in an arbitrary position between the third position J3 and the fourth position J4, that is, in a middle position in the hole 3A.

Next, the feed motor 95 is operated to feed the carrier 2 by length equivalent to one width (1×W) in the width W of the hole 3A. According to the above feed, the position of the photosensor 111 securely exceeds the fourth position J4. However, when the photosensor 111 detects the edge of the opening on the downstream side of the hole 3A while the photosensor passes the fourth position J4, the photosensor stops the feed motor 95. Hereby, the photosensor 111 is relatively stopped in the fourth position J4.

Next, the feed motor 95 feeds the carrier 2 by a preset correction value K so that the carrier is located in a position in which the center of the stage 21 and the center of the chip 12 are aligned and is stopped. According to the above feed and stop, the photosensor 111 is relatively stopped in the fifth position J5. As the fifth position J5 is always a fixed position determined by the correction value K between adjacent holes 3A, the workpiece 1 is supplied in an always fixed related position on the stage 21 and stopped.

As described above, according to constitution that the edge of the opening on the downstream side of the hole 3A (In this embodiment, a conventional type sprocket hole is not used for a sprocket hole for feed. In this embodiment, the hole 3A is an opening for detecting position in a suitable form such as a rectangle and a square which is numerously made in a suitable position of a tape in a row or plural rows at a single or multiply period in the longitudinal direction of the tape.) of the carrier 2 is detected by the photosensor 111 and the carrier 2 is fed by a predetermined correction value K from the above position of the edge, as various changes can be promptly processed by the simple operation of suitably inputting the length of new pitch, the new number of pitches and a new correction value K even if the size of the chip 12 and the length of the inner lead 7 and the outer lead 8 are changed or even if pitch between the holes 3A and the size of the hole 3A are changed, hybrid production such as change in a type is allowed and in the meantime, the generality of a bonding machine can be enhanced.

When the workpiece 1 is supplied to a preset fixed position on the stage 21 and stopped there as described above, the heat block 88 is lifted by the lifting/lowering driver 87 and the upper presser foot 91 is lowered by the rotary actuator 92. As the workpiece 1 is pressed upon the lower presser foot 90 of the heat block 88 by the lowering of the upper presser foot 91, it is positioned on the stage 21. As the lower surface of the chip 12 of the workpiece 1 is in contact with the bottom of the concave portion 89 of the heat block 88, the chip 12 is heated by the heat block 88.

When the workpiece is positioned on the stage, positional relationship between an inner lead in the workpiece and an electrode pad is measured by a method described next and suitably corrected.

As described above, as the workpiece 1 is always stopped on the stage 21 according to preset positional relationship, the center of the camera 31 and the center of the workpiece 1 can be approximately aligned as shown in FIG. 24 for example. If the center of the camera 31 is located in an origin O on the coordinates of the workpiece 1 as shown in FIG. 24, a position on the coordinates of the feature lead 9A on the left side can be acquired from the design data of the workpiece 1.

As shown in FIG. 24(b), a cutout window for the camera 31 is set to a position on the coordinates of the feature lead 9A on the left side. As in an actual workpiece 1, the body 3 of the carrier, the hole 3A and the like are not always formed according to a design value, an error (ΔXa, ΔYa) occurs between an actual feature lead 9A and a feature lead 9A' in design as shown in FIG. 24(b) for example. The above error (ΔXa, ΔYa) is acquired according to the following algorithm.

First, an actual feature lead 9A photographed by the camera 31 is recognized as an image and the central coordinates (Xa, Ya) for the origin O are acquired based upon the above recognition. Next, difference between the above central coordinates (Xa, Ya) and the central coordinates (Xa', Ya') of a feature lead 9A in design for the origin O is acquired. The value of the above difference is equivalent to the value of the above error (ΔXa, ΔYa).

Next, as shown in FIG. 24(c), the cutout window for the camera 31 is set to a position on the coordinates of a feature pad 14A on the left side. As in an actual workpiece 1, the chip 12 is not always fixed on the body 3 of the carrier according to design, an error (ΔXb, ΔYb) occurs between an actual feature pad 14A and a feature pad 14A' in design as shown in FIG. 24(c) for example. The value of the above error (ΔXb, ΔYb) is acquired according to the same algorithm as in the case of the feature lead 9A.

Next, the value of an error related to a feature lead 9A and a feature pad 14A on the right side is respectively acquired by the same method. The value of an error related to the coordinate position of each inner lead 7 in design and the coordinate position of each electrode pad 14 in design is respectively acquired by statistical processing for these values of errors. The respective values of errors and preset allowance values are compared. If the value of an error is out of a range, it is warned that correction is impossible. If the value of an error is in a range, each correction value between opposite inner lead 7 and electrode pad 14 is acquired.

As described above, bonding operation for an uncorrectable error can be omitted by acquiring positional relationship between each inner lead 7 and each electrode pad 14 using the feature lead 9A and the feature pad 14A and if correction is allowed, the precision of bonding can be enhanced by correction. Further, the cutout window for the camera 31 can be precisely set to relational position between each inner lead 7 and each electrode pad 14 by an inner lead recognition method described next.

When positional relationship between an inner lead and an electrode pad in a workpiece is acquired as described above, the inner lead recognition method shown in FIGS. 25(a) to (f) is executed.

As shown in FIG. 19, the main controller 28 drives the XY table 22 and moves the camera 31 in a position for an inner lead 7 to be bonded to be photographed in the workpiece 1 loaded on the stage 21. At this time, the positional coordinates of the inner lead 7 acquired as described above are used. The camera 31 executes the image capturing process 41 shown in FIG. 1 and photographs an inner lead 7 to be bonded. An image 51 photographed by the camera 31 and shown in FIG. 25(a) is displayed on the display 29 and input to the setting section 32.

The setting section 32 executes the inner lead recognizing measuring line setting process 42, sets one image scanning line including an electrode pad 14 of image scanning lines respectively perpendicular to an inner lead 7 in the image 51 to an inner lead recognizing measuring line corresponding to an electrode pad (hereinafter called central measuring line) 52 and sets two image scanning lines on both sides of the electrode pad 14 to each inner lead recognizing measuring line outside an electrode pad (hereinafter respectively called inner end measuring line and outer end measuring line) 53 and 54.

Figure 25B:
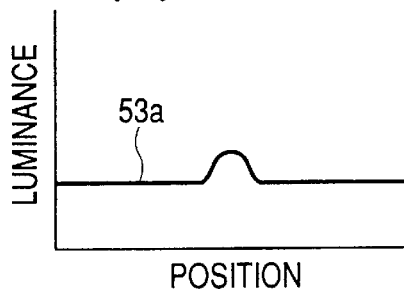
Figure 26A:
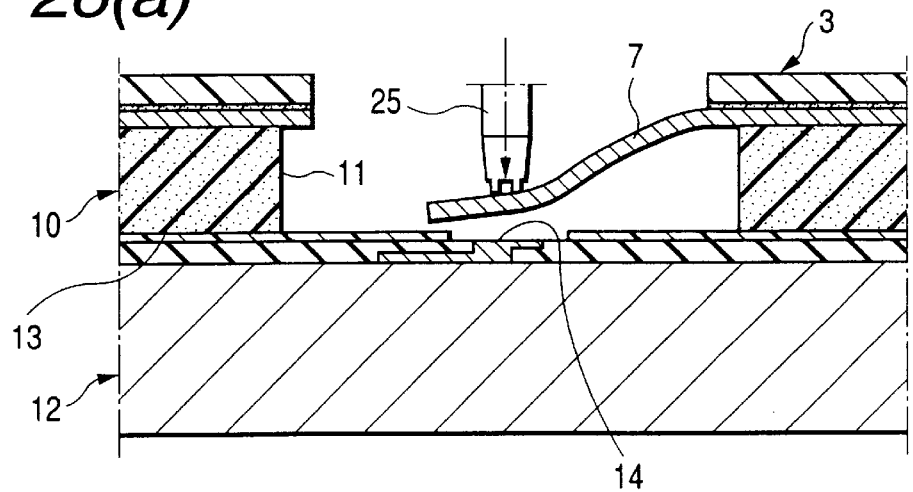
FIGS. 26(a) to (c) are explanatory drawings for explaining each process of the bonding method.
Figure 26B:
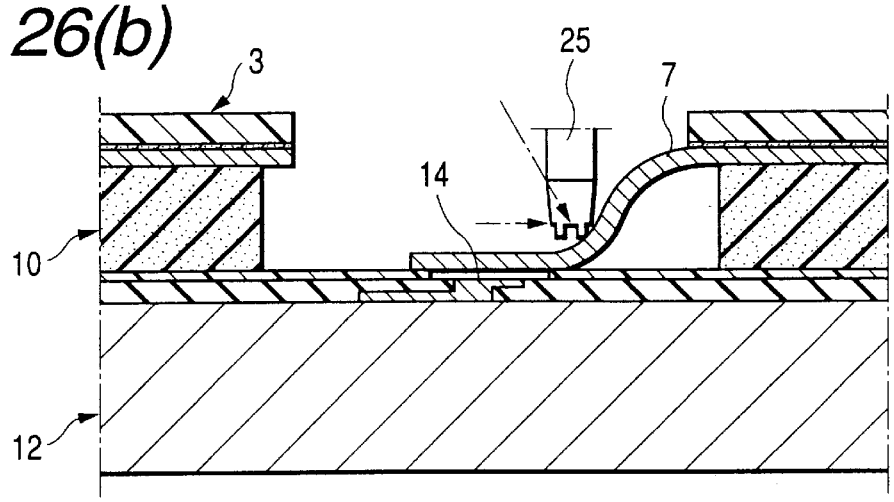
Figure 26C:
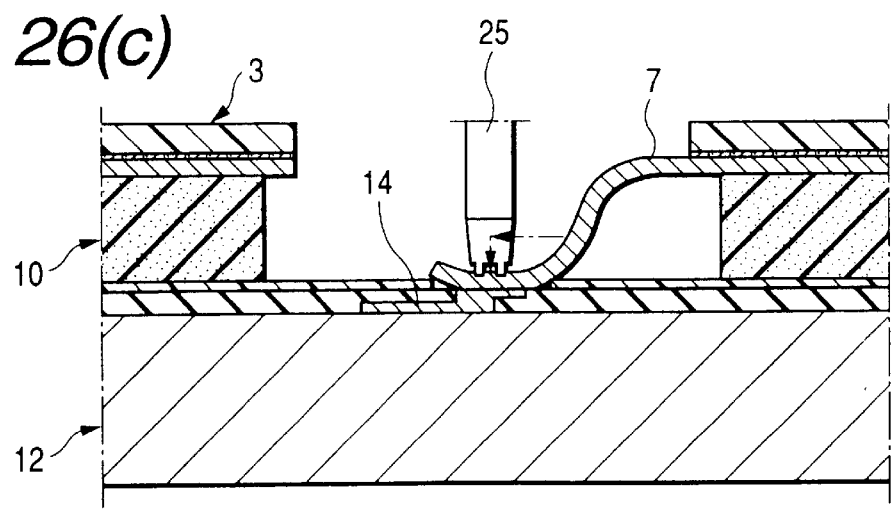

A luminance measuring section 33 executes the luminance measuring process 43, measures luminance at each point on each scanning line every the central measuring line 52, the inner end measuring line 53, and the outer end measuring line 54 and forms a central measuring line luminance waveform 52a, an inner end measuring line luminance waveform 53a, and an outer end measuring line luminance waveform 54a as shown in FIGS. 25(b), (c), and (d). These central measuring line luminance waveform 52a, inner end measuring line luminance waveform 53a, and outer end measuring line luminance waveform 54a are input to a forming section 34.

Figure 25E:
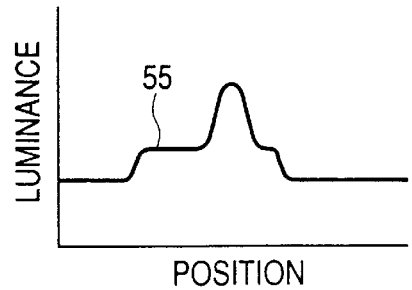
Figure 25C:
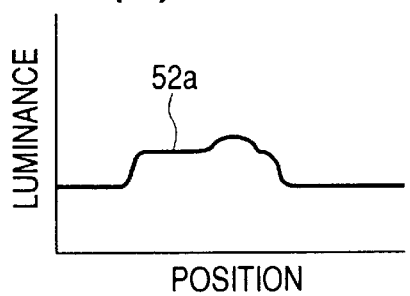

The forming section 34 executes the formation process 44 and forms an added luminance distribution waveform 55 shown in FIG. 25(e) by aligning each point on each scanning line in the central measuring line luminance waveform 52a, the inner end measuring line luminance waveform 53a, and the outer end measuring line luminance waveform 54a shown in FIGS. 25(b), (c), and (d), that is, by equalizing time series and overlapping each waveform. That is, luminance in the central measuring line luminance waveform 52a, the inner end measuring line luminance waveform 53a, and the outer end measuring line luminance waveform 54a is added at every point and the added luminance distribution waveform 55 is formed. The added luminance distribution waveform 55 is input to a judging section 35.

Figure 25F:
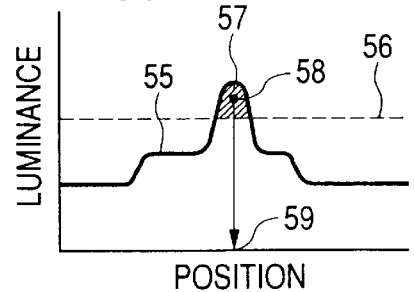
Figure 25D:
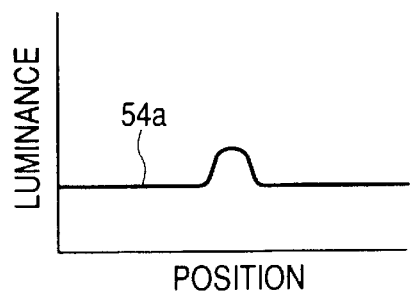

The judging section 35 executes the judging process 45 shown in FIG. 1 and first, sets a threshold value 56 of the added luminance distribution waveform 55 as shown in FIG. 25(f). Next, the center of gravity 58 in an area 57 equal to or larger than the threshold value 56 in the added luminance distribution waveform 55 is calculated and a position opposite to the center of gravity 58 is judged to be the position 59 of the center line of the inner lead 7 to be bonded. That is, the above shows that the position of the inner lead 7 to be bonded is precisely recognized.

The inner lead 7 is precisely bonded to the electrode pad 14 by the bonding tool 25 as shown in FIG. 26 by aligning the center line of the bonding tool 25 of the bonding machine 20 with the position 59 of the center line of the inner lead 7 acquired as described above by operating the XY table 22 under the control of the operating controller 27 according to the instruction of the main controller 28.

As shown in FIG. 26(a), the bonding tool 25 pushes down a part over the electrode pad 14 of the inner lead 7 up to a height in an extent that the bonding tool 25 does not reach on the upper surface of the chip 12 via the inner lead 7. The main controller 28 judges by analyzing positional data from the position detecting sensor 26 equipped in the bonding arm 24 whether the bonding tool 25 reaches the upper surface of the chip 12 via the inner lead 7 or not.

When the bonding tool 25 pushes down the end of the inner lead 7 up to a predetermined height, it is moved in parallel in the direction of the base supported by the insulating film 10 of the inner lead 7 as shown in FIG. 26(b). As the bonding tool is moved in parallel, the inner lead 7 is curved in the shape of a letter S as a whole. That is, the base of the inner lead 7 is bent in a looped form which does not cause distortion and the lower surface of the end is touched to the upper surface of the electrode pad 14.

At this time, not only the bonding tool 25 is horizontally moved after it is lowered vertically but the bonding tool 25 may also be lowered diagonally as shown by the locus of an imaginary line in FIG. 26(b).

Next, as shown in FIG. 26(c), the bonding tool 25 is returned over the center of the electrode pad 14 and next, the bonding tool 25 is lowered vertically. The bonding tool 25 presses the end of the inner lead 7 upon the electrode pad 14 by the above lowering. The bonding tool 25 presses the end of the inner lead 7 upon the electrode pad 14 and bonds the end of the inner lead to the electrode pad by thermocompression by applying heat and ultrasonic energy. That is, the inner lead 7 is bonded to the electrode pad 14 by the bonding tool 25.

Afterward, the chip 12 is electrically connected to the tape carrier 2 by repeating the above inner lead recognition method and bonding method every inner lead 7. In bonding every inner lead 7, before the inner lead 7 is bonded to the electrode pad 14 of the chip 12 by the bonding tool 25, the position 59 of the center line of the inner lead 7 is recognized and bonding by the bonding tool 25 is respectively executed under an optimum condition corresponding to the recognized position 59 of the center line.

When the above bonding operation of all inner leads 7 is finished, the tape carrier 2 is fed by one pitch p by the above operation according to the above method of supplying a workpiece to the stage and positioning it. Afterward, the bonding of the workpiece 1 let out from the loading reel 81 is successively executed by repeating the above processes.

Figure 27:
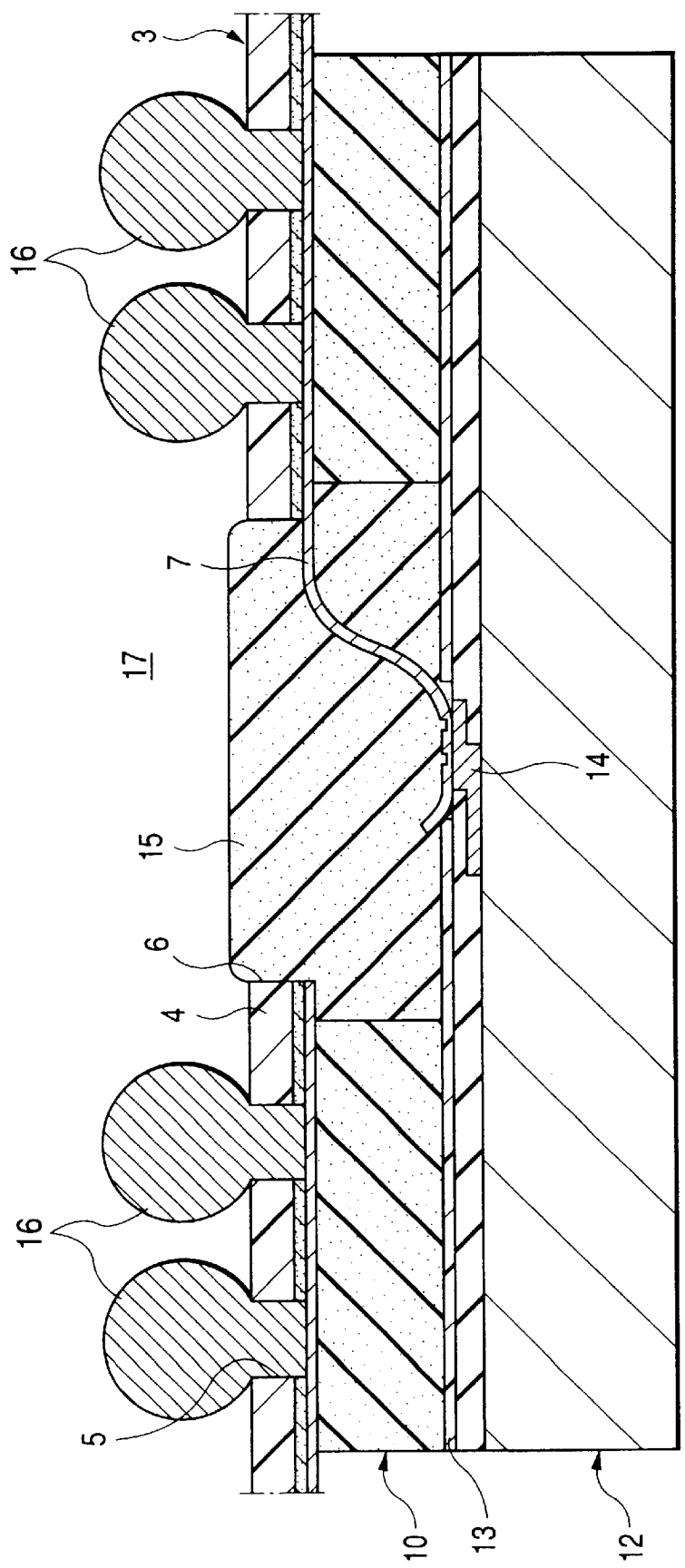

Afterward, as shown in FIG. 15, in a resin sealed body forming process in the method of manufacturing μBGA·IC, a group of inner leads 7 and a group of electrode pads 14 are sealed by a resin sealed part 15 by potting insulating material such as elastomer and silicon rubber inside each window aperture 6 of the tape carrier 2 as shown in FIG. 27.

Also, in a bump forming process in the method of manufacturing μBGA·IC, a bump 16 protruded from the upper surface of the bump formation part 4 is formed on the tape carrier 2 as shown in FIG. 27 by soldering a solder ball in a part exposed at the bottom of each bump hole 5 of each outer lead 8 of the tape carrier 2.

Figure 28:
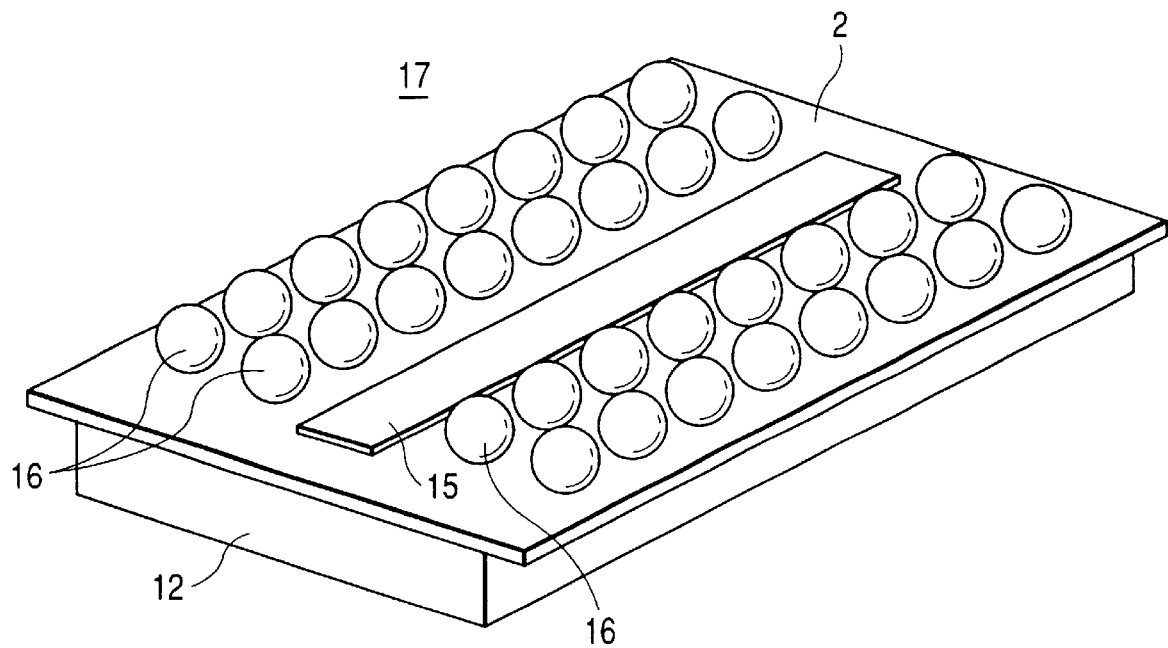

By the above manufacturing method, μBGA·IC 17 shown in FIG. 28 is manufactured.

Next, a bonding method shown in FIGS. 29 to 33 in which bonding by a bonding tool is executed after the height of a chip is measured will be described.

Figure 29:
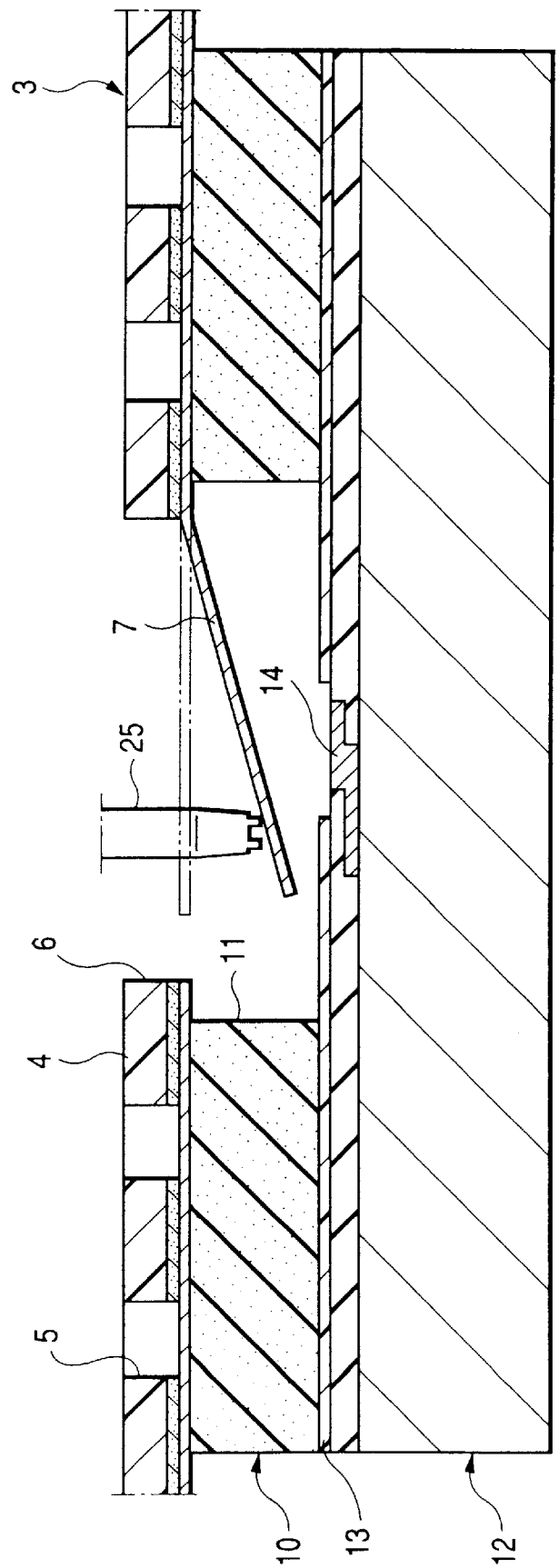

As shown in FIG. 29, when the bonding tool 25 pushes down the end of the inner lead 7, the inner lead 7 is curved downward with it the upper edge of the window aperture 11 of the insulating film 10 as a starting point.

Figure 30:
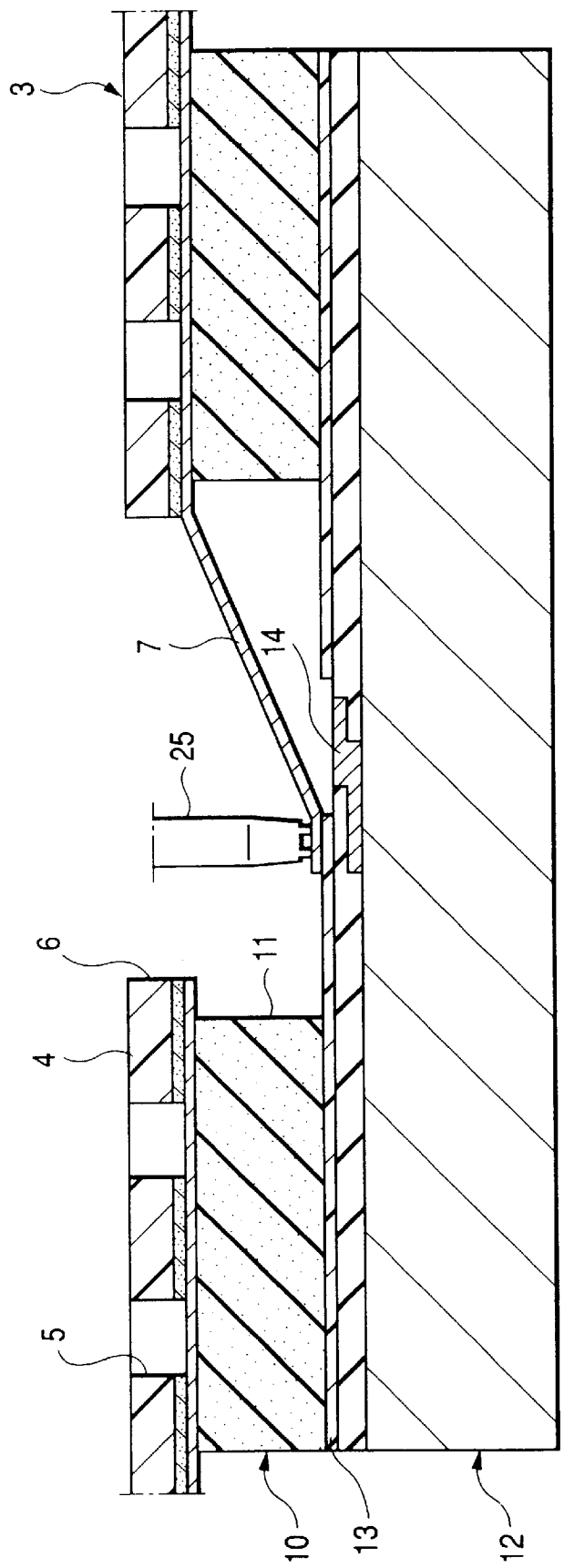

As shown in FIG. 30, when the bonding tool 25 is further lowered, the end of the inner lead 7 is pushed down and touched to the upper surface of the chip 12.

The main controller 28 judges by analyzing positional data from the position detecting sensor 26 whether the bonding tool 25 reaches the upper surface of the chip 12 via the inner lead 7 or not. If it is judged that the bonding tool 25 does not reach the upper surface of the chip 12, the main controller 28 gradually lowers the bonding tool 25 and touches it to the upper surface of the chip 12 via the inner lead 7.

If it is judged that the bonding tool 25 reaches the upper surface of the chip 12 via the inner lead 7, the main controller 28 reads positional data from the position detecting sensor 26 when the bonding tool reaches and measures the height of the bonding tool from the upper surface of the chip 12.

Figure 31:
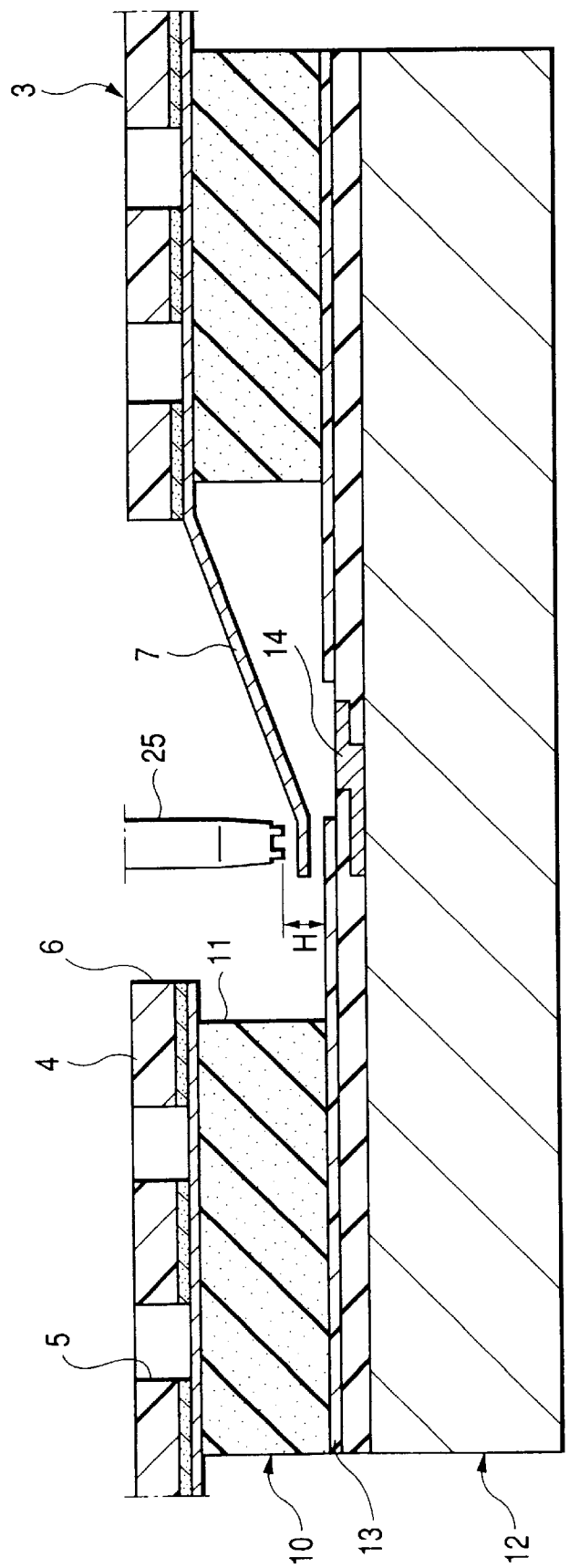
FIG. 31 is a front sectional view showing a lifting process.

The main controller 28 which finishes measuring the height of the bonding tool 25 lifts the bonding tool 25 by a predetermined height H as shown in FIG. 31. An optimum value of the predetermined height H corresponding to each bonding condition is acquired by an empirical method such as an experiment, simulation by a computer and past proven data and stored in the main controller 28 beforehand. The main controller 28 instructs the predetermined height H to the operating controller 27. The operating controller 27 lifts the bonding tool 25 by the predetermined height H by controlling the bonding head 23 and oscillating the bonding arm 24.

When the bonding tool 25 is lifted by the predetermined height H, the end of the inner lead 7 is a little lifted by the spring back of the inner lead 7 from the upper surface of the chip 12 as shown in FIG. 31. In a state in which the end of the inner lead 7 is lifted from the chip 12, the bonding tool 25 lifted by the predetermined height H is distant from the upper surface of the end of the inner lead 7.

Figure 32:
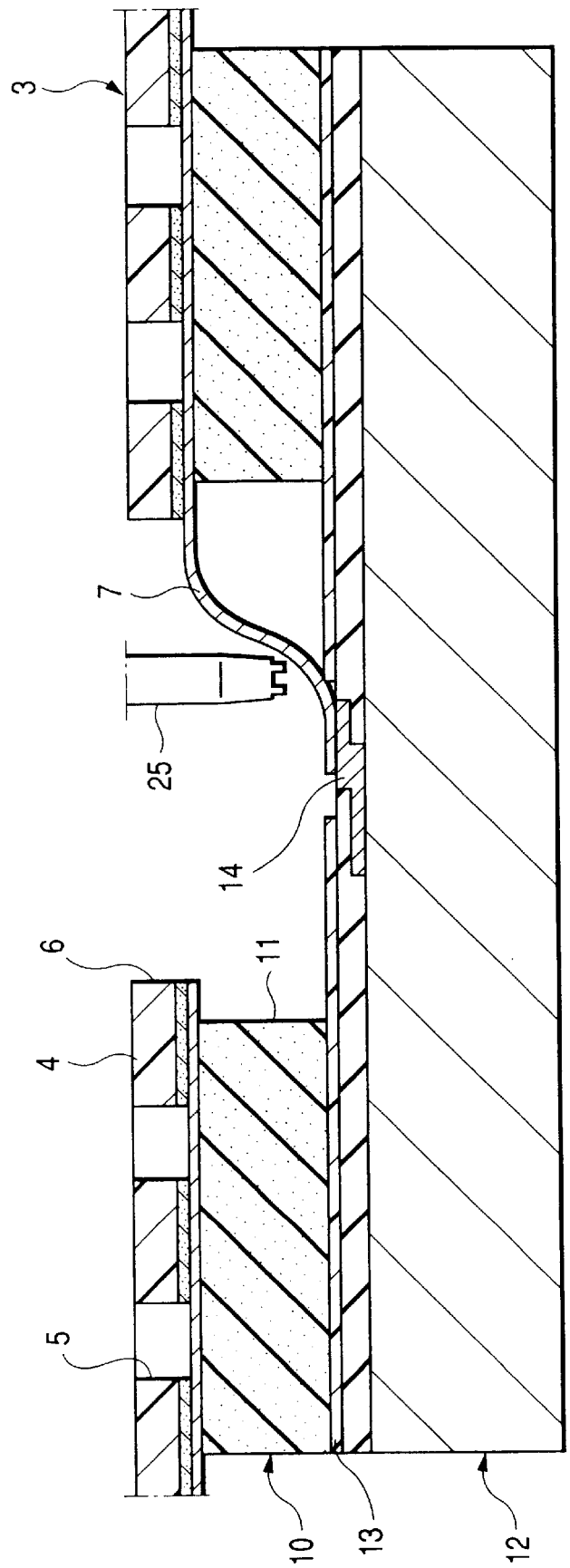
FIG. 32 is a front sectional view showing a parallel moving process.

Next, as shown in FIG. 32, the bonding tool 25 is moved in parallel to a predetermined position (In this case, it depends upon the length of a free part of a lead and difference between the base of the lead and the height of a pad how far the bonding tool is to be pushed through the pad. In case the bonding tool is pushed through the end of the pad if the length of the free part is normal, a relatively satisfactory form is acquired.) through over the center of the electrode pad 14 in the direction of the bump formation part 4 with the bonding tool 25 maintained at the height as it is. As the inner lead 7 is shifted in the direction of the bump formation part 4 by the bonding tool 25 and is pushed diagonally downward as the bonding tool is moved in parallel, the middle part is in a predetermined looped form (an S-type forming process) and the lower surface of the end is touched to the upper surface of the electrode pad 14.

Figure 33:
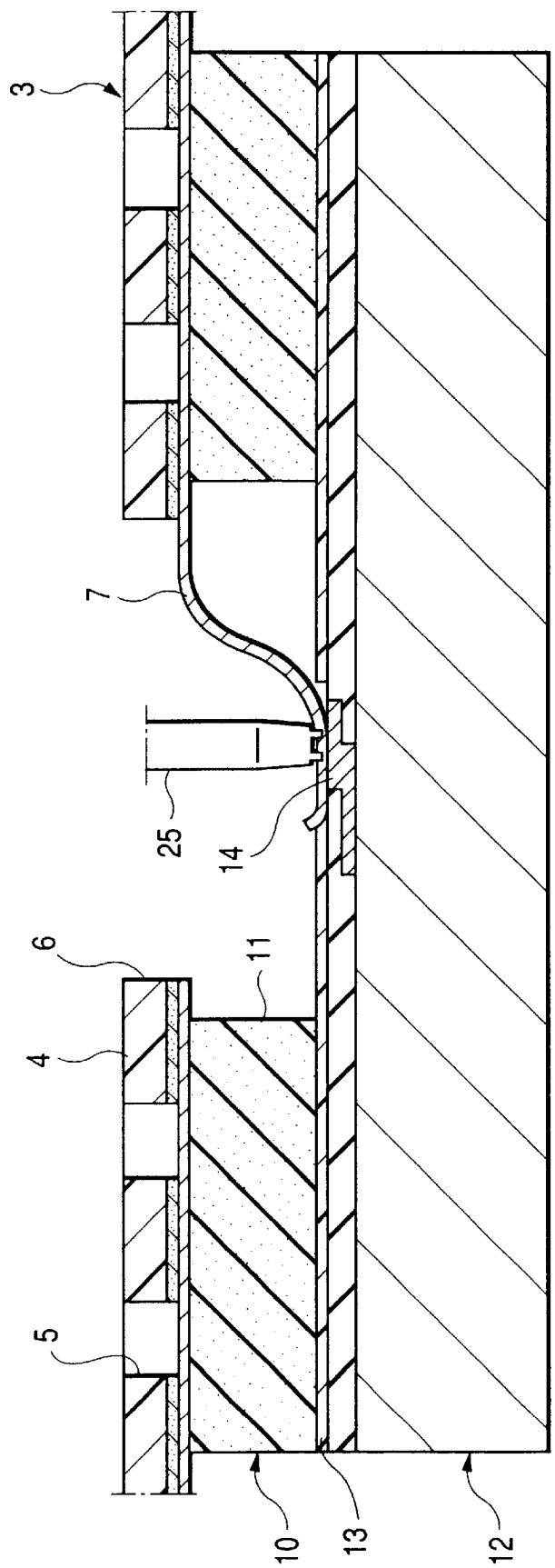
FIG. 33 is a front sectional view showing a thermocompression bonding process.

Next, as shown in FIG. 33, after the bonding tool 25 is moved to a position over the electrode pad 14, it is lowered vertically. By the above lowering, the end of the inner lead 7 is pressed on the electrode pad 14 by predetermined force by the bonding tool 25 with the end forming a predetermined looped form. The bonding tool 25 presses the end of the inner lead 7 on the electrode pad 14 and bonds the end of the inner lead to the electrode pad by thermocompression by applying heat and ultrasonic energy. That is, the inner lead 7 is bonded to the electrode pad 14 by the bonding tool 25.

As described above, as each inner lead 7 can be bonded to each electrode pad 14 in a suitable looped form in any case by successively measuring a height from the electrode pad 14 of the chip 12 to the bonding tool 25 and executing bonding by the bonding tool 25 under an optimum condition corresponding to each measured height before the inner lead 7 is bonded to the electrode pad 14 of the chip 12 by the bonding tool 25, the quality, the reliability, and the yield of μBGA·IC 17 can be enhanced.

For example, as bonding by the bonding tool 25 is executed under an optimum condition corresponding to the following error every inner lead 7 even if an error in an interval between the inner lead 7 successively bonded by the bonding tool 25 and the electrode pad 14 occurs because the chip 12 mechanically connected under the bump formation part 4 via the insulating film 10 is tilted, the looped form of each inner lead 7 after bonding can be suitably formed.

If an error in an interval between the inner lead 7 and the electrode pad 14 is small, it reduces operation time to prevent the inner lead 7 from being touched to the chip 12 by the bonding tool 25 and is advantageous.

As bonding operation can be completed on the same stage by continuously executing the measurement of a height and bonding after the measurement by a series of operation of the same bonding tool 25, time required for bonding operation can be reduced and the structure of the bonding machine can be simplified.

The bonding tool 25 not only controls in the locus described in the above embodiment but is may also control as in a locus shown in FIGS. 24(a) to (h) for example.

As shown in FIG. 34, 'S' shows a movement starting point and 'E' shows a movement end point. The movement starting point S is set in the end of an inner lead or a notch and the movement end point E is set in an electrode pad.

Figure 34A:
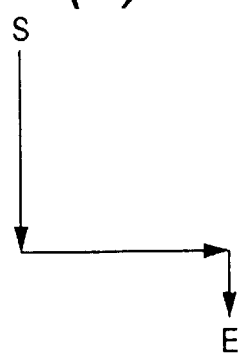
FIGS. 34(a) to (h) are locus views showing the variation of the locus of the bonding tool.

A locus shown in FIG. 34(a) can set an index earliest.

Figure 34E:
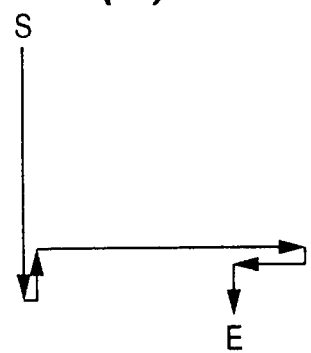
Figure 34B:
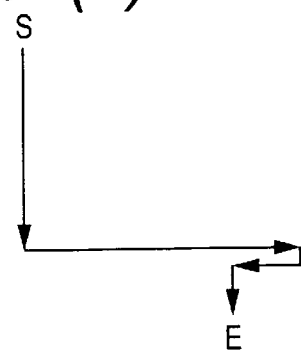

A locus shown in FIG. 34(b) can form an inner lead in the form of a letter S.

Figure 34F:
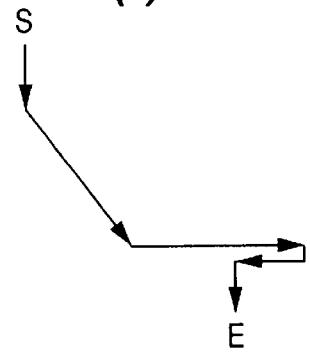
Figure 34C:
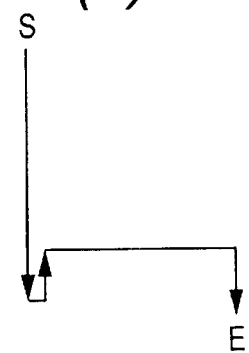

A locus shown in FIG. 34(c) can detect the surface of a chip and is effective when dust and others come between a stage and a chip and height changes if the chip is tilted.

Figure 34G:
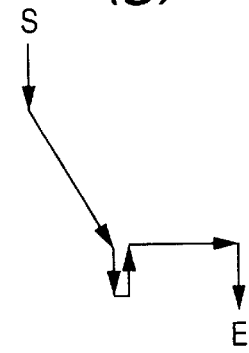
Figure 34D:
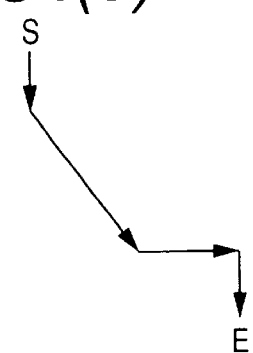

A locus shown in FIG. 34(d) is effective to cut an inner lead which crosses a window aperture and is also effective to form an inner lead.

A locus shown in FIG. 34(e) can form an inner lead in the form of a letter S and can also detect the surface of a chip.

A locus shown in FIG. 34(f) can also form an inner lead in the form of a letter S and is effective to cut an inner lead which crosses a window aperture.

A locus shown in FIG. 34(g) can detect the surface of a chip, is effective to cut an inner lead which crosses a window aperture, and is also effective to form an inner lead.

Figure 34H:
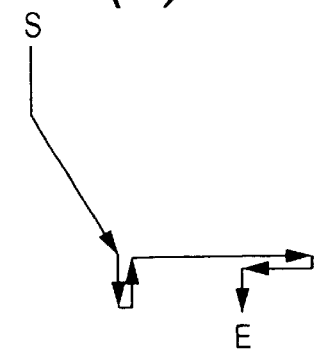

A locus shown in FIG. 34(h) can form an inner lead in the form of a letter S, can detect the surface of a chip, is effective to cut an inner lead which crosses a window aperture and is also effective to form an inner lead.

In each drawing of FIGS. 34, vertical and horizontal movement may also be set to diagonal movement.

Effect acquired by typical ones of the inventions disclosed in the present invention will be described briefly below.

As a bonding tool can be precisely aligned with an inner lead by successively recognizing the position of the center line of the inner lead before the inner lead is bonded to an electrode pad of a chip by the bonding tool when the inner lead is bonded to the electrode pad by the bonding tool, each inner lead can be suitably bonded to each electrode pad.

As an area equal to or larger than a threshold value in an added luminance distribution waveform can be formed so that the area is high by forming the added luminance distribution waveform by adding luminance in a central measuring line luminance waveform, an inner end measuring line luminance waveform and, an outer end measuring line luminance waveform at each of the same points and setting the threshold values for the added luminance distribution waveform, the position of an inner lead can be precisely recognized independent of the existence of an electrode pad as the background of the inner lead.

As each inner lead can be bonded to each electrode pad in a suitable looped form by measuring a height from a chip to a bonding tool and executing bonding by the bonding tool under an optimum condition corresponding to the measured height before the inner lead is bonded to the electrode pad of the chip by the bonding tool when the inner lead is bonded to the electrode pad by the bonding tool, the quality, the reliability, and the yield of a semiconductor device can be enhanced.

As an inner lead can be prevented from being distorted in bonding the inner lead when the inner lead is bonded to an electrode pad of a chip, stress due to distortion can be prevented beforehand from being left in the inner lead after bonding.

What is claimed is:

1. A method of bonding inner leads of a chip lead complex to bonding pads on a lead-by-lead basis, wherein said chip lead complex includes (i) a semiconductor integrated circuit chip having a plurality of bonding pads, and (ii) a plurality of inner leads disposed over a carrier tape and extending over respective bonding pads in an opening of the carrier tape over the bonding pads, said integrated circuit chip being secured to the carrier tape, said method comprising the steps of:

(a) advancing a carrier tape that is wound onto a loading reel;
   (b) feeding the chip lead complex over the advancing carrier tape to a bonding stage, the chip lead complex having both said semiconductor integrated circuit chip and said inner leads fixed over the carrier tape;
   (c) observing a position of the inner leads and the bonding pads to which bonding is to be performed;
   (d) correcting misalignment of the position of the inner leads with respect to the bonding pads by deforming one of said inner leads toward a corresponding one of said bonding pads by moving a bonding tool in a direction parallel to a surface of the semiconductor integrated circuit chip in accordance with the observed position of the inner leads;
   (e) bonding the inner leads to the respective bonding pads on the lead-by-lead basis; and
   (f) retracting the carrier tape after the bonding.

2. The method according to claim 1, wherein the step of bonding the inner leads is executed for every inner lead by said bonding tool.

3. The method according to claim 1, wherein the step of correcting misalignment is done for every inner lead by said bonding tool.

4. The method according to claim 2, wherein the step of correcting misalignment is done for every inner lead by said bonding tool.

* * * * *